United States Patent
Witter et al.

(10) Patent No.: US 9,709,636 B2
(45) Date of Patent: Jul. 18, 2017

(54) SYSTEM AND METHODS FOR MANAGING EMERGENCY POWER SUPPLY SYSTEM OPERATIONAL INFORMATION

(71) Applicant: Blue Pillar, Inc., Indianapolis, IN (US)

(72) Inventors: Bradley Jay Witter, Alpharetta, GA (US); Thomas Joseph Butler, Alpharetta, GA (US); Joseph J. Scoufis, Fort Collins, CO (US); Eric D. Reichel, Las Vegas, NV (US)

(73) Assignee: Blue Pillar, Inc., Indianapolis, IN (US)

(*) Notice: Subject to any disclaimer, the term of this patent is extended or adjusted under 35 U.S.C. 154(b) by 1037 days.

(21) Appl. No.: 13/691,366

(22) Filed: Nov. 30, 2012

(65) Prior Publication Data
US 2013/0158736 A1    Jun. 20, 2013

Related U.S. Application Data

(63) Continuation of application No. 12/143,326, filed on Jun. 20, 2008, now Pat. No. 8,359,248, and a
(Continued)

(51) Int. Cl.
*G06F 1/26* (2006.01)
*G01R 31/40* (2014.01)
(Continued)

(52) U.S. Cl.
CPC ........... *G01R 31/40* (2013.01); *G01F 13/006* (2013.01); *G06F 1/26* (2013.01); *G06F 17/00* (2013.01);
(Continued)

(58) Field of Classification Search
CPC .................................... G06Q 10/063118
(Continued)

(56) References Cited

U.S. PATENT DOCUMENTS 5,113,804 A    5/1992   Kraus et al.
5,572,438 A    11/1996  Ehlers et al.
(Continued)

FOREIGN PATENT DOCUMENTS

EP    1349075 A2     10/2003
JP    2004108698 A   4/2004
JP    2005073478 A   3/2006

OTHER PUBLICATIONS

Cummins Power Generations, Inc., "PowerCommand iWatch 100 Remote Network Monitoring" Cummins Power Generations, Inc. Nov. 2007, 8 Pages.*
(Continued)

*Primary Examiner* — Mohammad Ali
*Assistant Examiner* — Emilio J Saavedra
(74) *Attorney, Agent, or Firm* — Morris, Manning & Martin, LLP; Daniel E. Sineway, Esq.; John R. Harris, Esq.

(57) ABSTRACT

Aspects of the present disclosure generally relate to systems and methods for managing and monitoring a plurality of emergency power supply systems (EPSS's) at a facility via an emergency power management system (EPMS). The EPMS generally comprises EPSS equipment, a management computer system for managing, monitoring, and testing the operational characteristics of the EPSS equipment, and a plurality of interface modules for providing unified communication capabilities between the management computer system and the EPSS equipment. Additional aspects relate to methods for easily and efficiently creating and installing an EPMS at a facility. Further aspects are directed to providing predictive analyzes related to the EPSS equipment. Also, aspects of the present disclosure relate to normalizing EPSS equipment information across varying vendors, makes, and
(Continued)

models of equipment so as to provide a unified view of all equipment across a given facility.

63 Claims, 47 Drawing Sheets

Related U.S. Application Data continuation-in-part of application No. 11/556,496, filed on Nov. 3, 2006, now Pat. No. 7,548,826.

(60) Provisional application No. 60/823,474, filed on Aug. 24, 2006.

(51) Int. Cl.
```
G06Q 10/06      (2012.01)
G06Q 30/06      (2012.01)
H04Q 9/00       (2006.01)
G01F 13/00      (2006.01)
G06F 17/00      (2006.01)
G06F 17/10      (2006.01)
H02J 13/00      (2006.01)
```

(52) U.S. Cl.
CPC ....... *G06F 17/10* (2013.01); *G06Q 10/06313* (2013.01); *G06Q 10/06315* (2013.01); *G06Q 10/06395* (2013.01); *G06Q 10/063118* (2013.01); *G06Q 30/0601* (2013.01); *H04Q 9/00* (2013.01); *H02J 13/0079* (2013.01); *H04Q 2209/10* (2013.01); *H04Q 2209/86* (2013.01); *Y02E 60/74* (2013.01); *Y04S 10/30* (2013.01); *Y04S 50/10* (2013.01)

(58) Field of Classification Search
USPC ......................................................... 700/296
See application file for complete search history.

(56) References Cited

U.S. PATENT DOCUMENTS

| | | | |
|---|---|---|---|
| 5,862,391 A | 1/1999 | Salas et al. | |
| 5,903,457 A | 5/1999 | Chang | |
| 6,058,355 A | 5/2000 | Ahmed et al. | |
| 6,097,108 A | 8/2000 | Tweed | |
| 6,181,028 B1 | 1/2001 | Kern et al. | |
| 6,191,500 B1* | 2/2001 | Toy | H02J 3/46 307/64 |
| 6,216,109 B1 | 4/2001 | Zweben et al. | |
| 6,329,907 B1 | 12/2001 | Uischner et al. | |
| 6,519,003 B1 | 2/2003 | Swayze | |
| 6,542,856 B2 | 4/2003 | Frantz et al. | |
| 6,591,296 B1 | 7/2003 | Ghanime | |
| 6,721,672 B2 | 4/2004 | Spitaels et al. | |
| 6,735,704 B1 | 5/2004 | Butka et al. | |
| 6,853,959 B2 | 2/2005 | Ikeda et al. | |
| 6,965,309 B1 | 11/2005 | Bleznyk et al. | |
| 7,010,467 B2 | 3/2006 | James | |
| 7,020,585 B2 | 3/2006 | James | |
| 7,072,801 B2 | 7/2006 | James | |
| 7,231,280 B2 | 6/2007 | Costa | |
| 7,337,122 B2 | 2/2008 | Eydeland et al. | |
| 7,915,829 B2 | 3/2011 | Keller et al. | |
| 8,024,237 B1 | 9/2011 | Davidson et al. | |
| 2003/0028351 A1 | 2/2003 | Billet et al. | |
| 2003/0065415 A1 | 4/2003 | Hegde et al. | |
| 2003/0204342 A1 | 10/2003 | Law et al. | |
| 2004/0010349 A1* | 1/2004 | Perez | H02P 9/02 700/287 |
| 2004/0010429 A1 | 1/2004 | Vedula et al. | |
| 2004/0012678 A1 | 1/2004 | Li | |
| 2004/0038646 A1 | 2/2004 | Bourgart | |
| 2004/0117624 A1* | 6/2004 | Brandt | H04L 63/1408 713/166 |
| 2004/0156352 A1* | 8/2004 | Freeman | H04Q 9/00 370/351 |
| 2004/0162642 A1 | 8/2004 | Gasper et al. | |
| 2004/0181506 A1 | 9/2004 | Hsiang | |
| 2004/0225390 A1 | 11/2004 | Keller et al. | |
| 2005/0071093 A1 | 3/2005 | Stefan | |
| 2005/0096856 A1 | 5/2005 | Lubkeman et al. | |
| 2005/0116836 A1 | 6/2005 | Perry et al. | |
| 2005/0225441 A1* | 10/2005 | Kernan | H04L 12/66 340/506 |
| 2005/0273281 A1 | 12/2005 | Wall et al. | |
| 2005/0278075 A1 | 12/2005 | Rasmussen et al. | |
| 2006/0028336 A1 | 2/2006 | Glenn et al. | |
| 2006/0090552 A1 | 5/2006 | Ziegler et al. | |
| 2006/0208927 A1 | 9/2006 | Poor et al. | |
| 2007/0136120 A1 | 6/2007 | Watanabe et al. | |
| 2007/0293964 A1 | 12/2007 | Skorepa | |

OTHER PUBLICATIONS

Emerson Electric Co., "ASCO 4000 Series Digital Generator Paralleling Switchgear" by Emerson Electric Co. 16 Pages, Aug. 2007.*
McDonald, "Monitoring and Control of Power Systems" IEEE Power Engineering Society presentation, Feb. 2004, 35 Pgs.*
McAvinew et al., "Control System Documentation: Applying Symbols and Identification" ISA 2004, 244 Pages.*
Caterpillar "Application & Installation Guide: Generator Paralleling Switchgear" 2007, 81 Pages.*
Cummins Inc., "Paralleling Equipment PowerCommand Model 300 Digital Master Control" 2002, 7 pages.*
Deepak Divan, PhD, et al., I-Grid: Infrastructure for Nationwide Real-Time Power Monitoring, 2002 IEEE, pp. 1-6, SoftSwitching Technologies, Middleton, WI USA.
Power Measurement, Datasheet: ION Enterprise, Apr. 2005, pp. 1-4.
Cutler-Hammer, Your Hospital's Generator Power: Too Important too Costly to be Left to Chance, Jun. 1998, pp. 1-4, Publication No. SA 17.03.S.E., USA.
Rudi Carolsfeld, Power Measurement, Mitigating Risk for Energy Infrastructures using an Enterprise Energy Management System, 2003, pp. 1-11.
Spec Sheet Pointguard, Standard Service Package, System Monitoring and Management, Jan. 23, 2004, pp. 1-4.
Square D. Schneider Electric. Power Management from Start to Savings. Powerlogic Power Monitoring and Management System. Jul. 2001, pp. 1-4, Product No. 3000H00102R7/01.
Solution Overview Pointguard, The System Monitoring and Management Solution, Jan. 23, 2004, pp. 1-4.
Emerson Network Power, Protecting Healthcare Facilities With Emergency Power Solutions; Case Studies in Excellence: Six Hospitals Share Their Experiences, 2003, pp. 1-22, Publication 3118.
Power Measurement, Take Charge of Your Generators with an Enterprise Energy Management System, May 2002, pp. 1-4, Canada.
GE Electrical Distribution & Control, GE Power Management Control System, 1997, pp. 1-6, General Electric Company, Plainville, CT.
Peters, Catherine A., Statistics for Analysis of Experimental Data, Environmental Engineering Processes Laboratory Manual, 2001, pp. 1-25, AEESP, Champaign, IL.

* cited by examiner

| DATE/TIME | ALARM | GROUP | VALUE | CLEARED DATE/TIME | ACK'D DATE/TIME |
|---|---|---|---|---|---|
| 7/3/2006 01:26... | GENERATOR 1_EIM1_WATER TEMPER... | COUNTY GENER... | 60.20 | 07/09/2006 01:27... | |
| 7/3/2006 01:24... | GENERATOR 1_EIM1_WATER TEMPER... | COUNTY GENER... | 60.20 | 07/09/2006 01:25... | |
| 7/3/2006 01:22... | GENERATOR 1_EIM1_WATER TEMPER... | COUNTY GENER... | 60.20 | 07/09/2006 01:23... | 07/09/2006 01:23... |
| 7/3/2006 01:20... | GENERATOR 1_EIM1_WATER TEMPER... | COUNTY GENER... | 60.20 | 07/09/2006 01:21... | 07/09/2006 01:23... |
| 7/3/2006 01:18... | GENERATOR 1_EIM1_WATER TEMPER... | COUNTY GENER... | 60.20 | 07/09/2006 01:19... | |
| 7/3/2006 01:16... | GENERATOR 1_EIM1_WATER TEMPER... | COUNTY GENER... | 60.20 | 07/09/2006 01:17... | |
| 7/3/2006 01:14... | GENERATOR 1_EIM1_WATER TEMPER... | COUNTY GENER... | 60.20 | 07/09/2006 01:15... | |
| 7/3/2006 01:12... | GENERATOR 1_EIM1_WATER TEMPER... | COUNTY GENER... | 60.20 | 07/09/2006 01:13... | |
| 7/3/2006 01:10... | GENERATOR 1_EIM1_WATER TEMPER... | COUNTY GENER... | 60.20 | 07/09/2006 01:10... | |
| 7/3/2006 01:08... | GENERATOR 1_EIM1_WATER TEMPER... | COUNTY GENER... | 60.20 | 07/09/2006 01:09... | |
| 7/3/2006 01:06... | GENERATOR 1_EIM1_WATER TEMPER... | COUNTY GENER... | 60.20 | 07/09/2006 01:07... | |
| 7/3/2006 01:02... | GENERATOR 1_EIM1_WATER TEMPER... | COUNTY GENER... | 60.20 | 07/09/2006 01:03... | |
| 7/3/2006 01:12... | GENERATOR 1_EIM1_WATER TEMPER... | COUNTY GENER... | 60.20 | 07/09/2006 01:13... | |
| 7/3/2006 01:00... | GENERATOR 1_EIM1_WATER TEMPER... | COUNTY GENER... | 60.20 | 07/09/2006 01:01... | |
| 7/3/2006 12:58... | GENERATOR 1_EIM1_WATER TEMPER... | COUNTY GENER... | 60.20 | 07/09/2006 12:59... | |

GENERATOR INVENTORY REPORT

2105 TOTAL NUMBER OF GENERATORS: 5

↳ GENERATOR NAME/LOCATION

GENERATOR DETAILS — 2110

FUEL SYSTEM DETAILS — 2115

| # | Location | Generator Details | Fuel System Details |
|---|---|---|---|
| 1 | SITE: CLINIC<br>SYSTEM: 57 ADDITION<br>LOCATION: RM 0136 MR<br>GENERATOR: GEN_57 | MANUFACTURER: CATERPILLAR<br>MODEL: D334<br>SERIAL NUMBER: 92B1981<br>YEAR INSTALLED: N/A<br>RPM: 1800<br>HORSEPOWER: 0<br>RATED CURRENT: 711.00<br>RATED VOLTAGE: 208.00<br>RATED KW: 205.00<br>COMMENTS: NONE | FUEL TYPE: DIESEL<br>EST. CONSUMPTION RATE: 14.84 GAL/HR |
| 2 | SITE: CLINIC<br>SYSTEM: AESTHETICS AND DERMATOLOGY<br>LOCATION: BUILDING<br>GENERATOR: C FOR L AESTHETICS | MANUFACTURER: OLYMPIA<br>MODEL: 96A07028-S<br>SERIAL NUMBER: 2032464<br>YEAR INSTALLED: N/A<br>RPM: 1800<br>HORSEPOWER: 0<br>RATED CURRENT: 173.40<br>RATED VOLTAGE: 208.00<br>RATED KW: 50.00<br>COMMENTS: LOCATED OUTSIDE | FUEL TYPE: DIESEL<br>EST. CONSUMPTION RATE: 3.96 GAL/HR<br>TANK/CAPACITY: AESTHETICS BELLY TANK/1GAL |
| 3 | SITE: CLINIC<br>SYSTEM: BELL<br>LOCATION: NEXT TO DHIS EQUIPMENT<br>GENERATOR: BELL | MANUFACTURER: CATERPILLAR<br>MODEL: 5UA01019<br>SERIAL NUMBER: 23201670<br>YEAR INSTALLED: N/A<br>RPM: 1800<br>HORSEPOWER:<br>RATED CURRENT: 2255.00<br>RATED VOLTAGE: 208.00<br>RATED KW: 750.00<br>COMMENTS: NONE | FUEL TYPE: DIESEL<br>EST. CONSUMPTION RATE: 53.10 GAL/HR |
| 4 | SITE: CLINIC<br>SYSTEM: BEN FRANKLIN<br>LOCATION: BEN FRANKLIN GEN ROOM<br>GENERATOR: BEN FRANKLIN | MANUFACTURER: DETROIT DIESEL<br>MODEL: 1<br>SERIAL NUMBER: 1<br>YEAR INSTALLED: N/A<br>RPM: 1<br>HORSEPOWER:<br>RATED CURRENT: 600.00<br>RATED VOLTAGE: 208.00<br>RATED KW: 375.00<br>COMMENTS: NONE | FUEL TYPE: DIESEL<br>EST. CONSUMPTION RATE: 26.77 GAL/HR |
| 5 | SITE: CLINIC<br>SYSTEM: BRIER CREEK<br>LOCATION: GI AT BRIER CREEK<br>GENERATOR: BRIER CREEK | MANUFACTURER: GENERAC<br>MODEL: 6297760100<br>SERIAL NUMBER: 2087041<br>YEAR INSTALLED: N/A<br>RPM: 1800<br>HORSEPOWER:<br>RATED CURRENT: 138.70<br>RATED VOLTAGE: 208.00<br>RATED KW: 40.00<br>COMMENTS: NONE | FUEL TYPE: DIESEL<br>EST. CONSUMPTION RATE: 3.25 GAL/HR |

AUTOMATIC TRANSFER SWITCH INVENTORY REPORT

TOTAL NUMBER OF SWITCHES: 8

| | ATS NAME/LOCATION | ATS DETAILS | |
|---|---|---|---|
| 1 | SITE: CLINIC<br>SYSTEM: 57 ADDITION<br>LOCATION: RM 0136 MR<br>ATS: ATS_57 | MANUFACTURER: ASCO<br>MODEL: F7ATSA3800C5<br>SERIAL NUMBER: 156485<br>SERVICE: LIFE SAFETY | RATED AMPS: 800<br>RATED VOLTAGE: 208/120<br>TRANSITION: OPEN<br>STYLE: 3PH 4W | COMMENTS: NONE |
| 2 | SITE: CLINIC<br>SYSTEM: AESTHETICS AND DERMATOLOGY<br>LOCATION: BUILDING<br>ATS: AESTHETICS ATS | MANUFACTURER: ZENITH<br>MODEL: ZTGK22EC4<br>SERIAL NUMBER: 1246244<br>SERVICE: LIFE SAFETY-EQUIPMENT | RATED AMPS: 225<br>RATED VOLTAGE: 208/120<br>TRANSITION: OPEN<br>STYLE: 3PH 4W | COMMENTS: NONE |
| 3 | SITE: CLINIC<br>SYSTEM: BELL<br>LOCATION: 0033MR<br>ATS: LTS AND POWER 1000AMP1 | MANUFACTURER: RUSSELECTRIC<br>MODEL: RMT10003CE<br>SERIAL NUMBER: 14606-2<br>SERVICE: LIFE SAFETY-EQUIPMENT | RATED AMPS: 1000<br>RATED VOLTAGE: 208/120<br>TRANSITION: OPEN<br>STYLE: 3PH 4W | COMMENTS: NONE |
| 4 | SITE: CLINIC<br>SYSTEM: BELL<br>LOCATION: 0033MR<br>ATS: LTS AND POWER 1000AMP2 | MANUFACTURER: RUSSELECTRIC<br>MODEL: RMT12003CE<br>SERIAL NUMBER: 14606-1<br>SERVICE: LIFE SAFETY-EQUIPMENT | RATED AMPS: 1000<br>RATED VOLTAGE: 208/120<br>TRANSITION: OPEN<br>STYLE: 3PH 4W | COMMENTS: NONE |
| 5 | SITE: CLINIC<br>SYSTEM: BELL<br>LOCATION: DHIS EQUIP ROOM<br>ATS: LTS AND POWER 1000AMP3 | MANUFACTURER: RUSSELECTRIC<br>MODEL: RMT16003CE<br>SERIAL NUMBER: 1460631<br>SERVICE: LIFE SAFETY-EQUIPMENT | RATED AMPS: 1000<br>RATED VOLTAGE: 208/120<br>TRANSITION: OPEN<br>STYLE: 3PH 4W | COMMENTS: NONE |
| 6 | SITE: CLINIC<br>SYSTEM: BEN FRANKILN<br>LOCATION: BEN FRANKILN GEN ROOM<br>ATS: BEN FRANKILN | MANUFACTURER: DETROIT DIESEL<br>MODEL: 1<br>SERIAL NUMBER: 1<br>SERVICE: CRITICAL | RATED AMPS: 600<br>RATED VOLTAGE: 208/120<br>TRANSITION: OPEN<br>STYLE: 3PH 3W | COMMENTS: NONE |
| 7 | SITE: CLINIC<br>SYSTEM: BRIER CREEK<br>LOCATION: UTILITY 135<br>ATS: ATS 1 | MANUFACTURER: GENERAC<br>MODEL: HTSN200G1<br>SERIAL NUMBER: 4367697<br>SERVICE: ALL | RATED AMPS: 200<br>RATED VOLTAGE: 208/120<br>TRANSITION: OPEN<br>STYLE: 3PH 4W | COMMENTS: NONE |
| 8 | SITE: CLINIC<br>SYSTEM: CCIF<br>LOCATION: ME ROOM 100 MR<br>ATS: CCIF ADD 1 | MANUFACTURER: ASCO<br>MODEL: 940380099XC<br>SERIAL NUMBER: 960717<br>SERVICE: LIFE SAFETY-EQUIPMENT | RATED AMPS: 800<br>RATED VOLTAGE: 480/277<br>TRANSITION: OPEN<br>STYLE: 3PH 4W | COMMENTS: NONE |

FUEL TANK INVENTORY REPORT

TOTAL NUMBER OF TANKS: 2 — 2103

| | FUEL TANK | CAPACITY | COMMENTS | GENERATORS SERVICED — 2130 | | |
|---|---|---|---|---|---|---|
| | | | | SITE | SYSTEM | GENERATOR NAME |
| 1. | AESTHETICS BELL TANK | 1 GAL | PNUEMERCATOR TMS 2000 | CLINIC | AESTHETICS AND DERMATOLOGY | C FOR L AESTHETICS |
| 2. | C FOR L FITNESS BELLY TANK | 100 GAL | PNUEMERCATOR TMS 2000 | CLINIC | CFL FITNESS | C FOR L FITNESS |

FIG. 21C

MANUFACTURER REPORT 2201

ATS MANUFACTURER / MODEL TOTALS

ASCO — 2205

| | | |
|---|---|---|
| | 7000 SERIES | 8 |
| | E434326097CX | 8 |
| | 940 | 7 |
| | 962 | 5 |
| | 940380099XC | 4 |
| | E43430097XC | 4 |
| | 956 SETS | 2 |
| | 7000 | 2 |
| | E434326079XC | 1 |
| | E434360097XC | 1 |
| | E940340047X | 1 |
| | F7ATS3800C5 | 1 |
| | 94037097XC | 1 |
| | 940380046X | 1 |
| | 1 | 1 |
| | ASCO TOTAL: | 47 |

2210

DETROIT DIESEL

| | | |
|---|---|---|
| | 1 | 1 |
| | DETROIT DIESEL TOTAL: | 1 |

GENERAC

| | | |
|---|---|---|
| | HTSN 200G1 | 1 |
| | 91A03911-W | 1 |
| | GENERAC TOTAL: | 2 |

KOHLER

| | | |
|---|---|---|
| | K1683410800 | 1 |
| | KOHLER TOTAL: | 1 |

METRONASCO

| | | |
|---|---|---|
| | MT5150A 940 | 1 |
| | METRONASCO TOTAL: | 1 |

RUSS ELECTRIC

| | | |
|---|---|---|
| | RTBDCT-6004CEF | 2 |
| | RTBDCT-8004CEF | 2 |

GENERATOR MANUFACTURER / MODEL TOTALS

CATERPILLAR

| | | |
|---|---|---|
| | D399 | 4 |
| | 3512 | 3 |
| | 3516 | 3 |
| | SR-4 | 2 |
| | 3208NA | 1 |
| | 3406 | 1 |
| | 3412 | 1 |
| | 5UA01019 | 1 |
| | D334 | 1 |
| | D3406D1 | 1 |
| | D379 | 1 |
| | CATERPILLAR TOTAL: | 19 |

GENERAC

| | | |
|---|---|---|
| | 6297760100 | 1 |
| | 90A01537-S | 1 |
| | 91A03911S | 1 |
| | GENERAC TOTAL: | 3 |

DETROIT DIESEL

| | | |
|---|---|---|
| | 1 | 1 |
| | DETROIT DIESEL TOTAL: | 1 |

OLYMPIA

| | | |
|---|---|---|
| | 96A07028-S | 1 |
| | OLYMPIA TOTAL: | 1 |
| | TOTAL NUMBER OF GENERATORS: | 24 |

Figure 28:
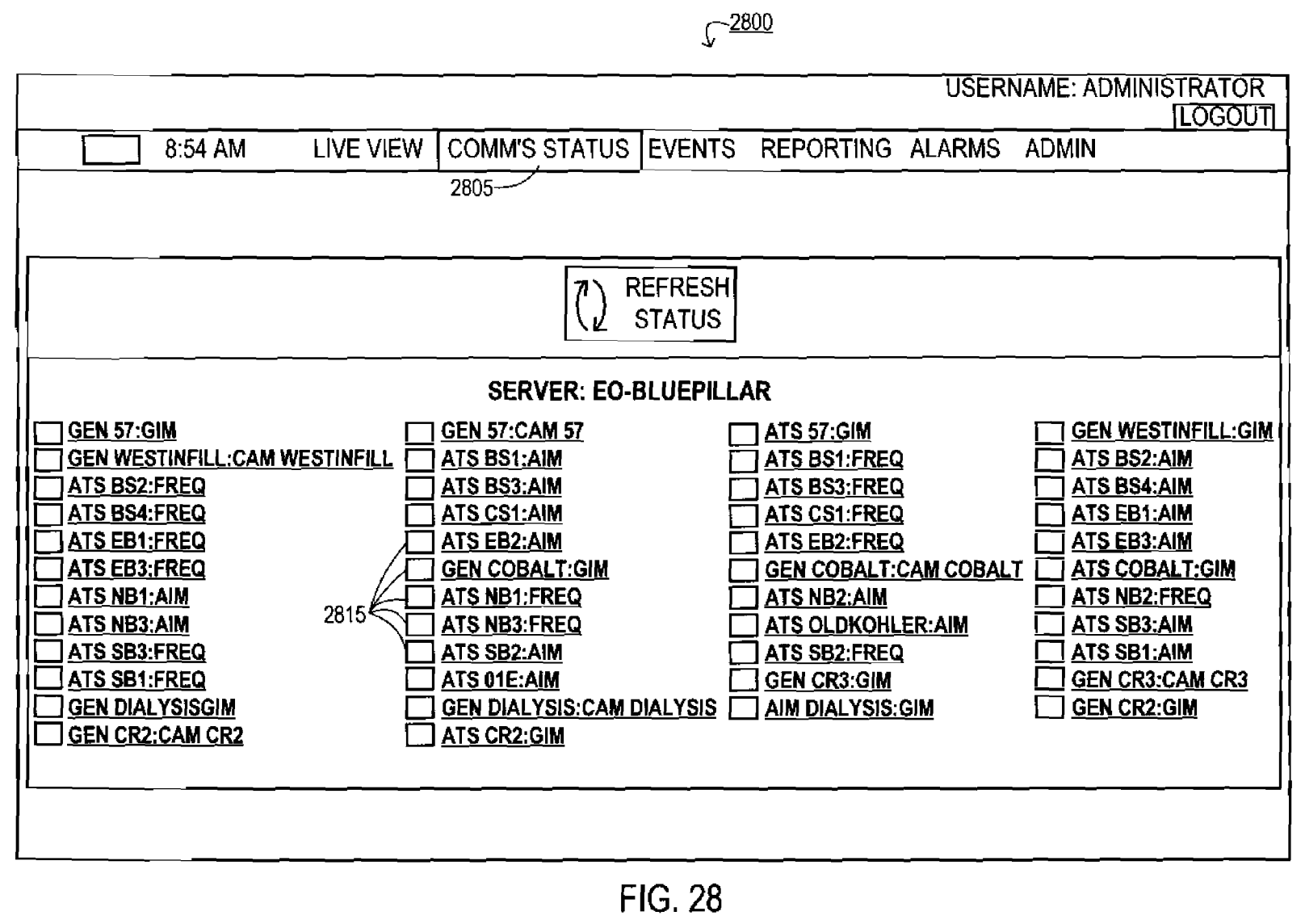

| 8:54 AM | LIVE VIEW | COMM'S STATUS | EVENTS | REPORTING | ALARMS | ADMIN | USERNAME: ADMINISTRATOR LOGOUT |

⟲ 2800

2805

[⟲ REFRESH STATUS]

SERVER: EO-BLUEPILLAR

| ☐ GEN 57:GIM | ☐ GEN 57:CAM 57 | ☐ ATS 57:GIM | ☐ GEN WESTINFILL:GIM |
| ☐ GEN WESTINFILL:CAM WESTINFILL | ☐ ATS BS1:AIM | ☐ ATS BS1:FREQ | ☐ ATS BS2:AIM |
| ☐ ATS BS2:FREQ | ☐ ATS BS3:AIM | ☐ ATS BS3:FREQ | ☐ ATS BS4:AIM |
| ☐ ATS BS4:FREQ | ☐ ATS CS1:AIM | ☐ ATS CS1:FREQ | ☐ ATS EB1:AIM |
| ☐ ATS EB1:FREQ | ☐ ATS EB2:AIM | ☐ ATS EB2:FREQ | ☐ ATS EB3:AIM |
| ☐ ATS EB3:FREQ | ☐ GEN COBALT:GIM | ☐ GEN COBALT:CAM COBALT | ☐ ATS COBALT:GIM |
| ☐ ATS NB1:AIM | ☐ ATS NB1:FREQ | ☐ ATS NB2:AIM | ☐ ATS NB2:FREQ |
| ☐ ATS NB3:AIM | ☐ ATS NB3:FREQ | ☐ ATS OLDKOHLER:AIM | ☐ ATS SB3:AIM |
| ☐ ATS SB3:FREQ | ☐ ATS SB2:AIM | ☐ ATS SB2:FREQ | ☐ ATS SB1:AIM |
| ☐ ATS SB1:FREQ | ☐ ATS 01E:AIM | ☐ GEN CR3:GIM | ☐ GEN CR3:CAM CR3 |
| ☐ GEN DIALYSIS:GIM | ☐ GEN DIALYSIS:CAM DIALYSIS | ☐ AIM DIALYSIS:GIM | ☐ GEN CR2:GIM |
| ☐ GEN CR2:CAM CR2 | ☐ ATS CR2:GIM | | |

TEST SETUP WIZARD
SELECT TEST TYPE PARAMETERS

CONFIGURE THE TYPE OF TEST TO BE PERFORMED. A "LOAD TEST" WILL TELL THE SELECTED ATS OR ATS GROUP TO ENTER THE MANUFACTURER DEFINED TEST MODE. A "NO LOAD TEST" WILL EXERCISE THE SELECTED GENERATOR. TESTS BEGIN WHEN THE "RUN TEST" BUTTON IS SELECTED.

TEST TYPE [MONTHLY LOAD TEST ▼] 3105

TEST GROUP [ALL ▼] 3110

SELECT THE TEST INITIATING ATS FROM THE SELECTED GROUP. ANY REMAINING ATSS IN THE GROUP WILL START AT THE TIME OFFSET CONFIGURED BELOW.

INITIATING ATS [ATS C51: NEVER INITIATED (RECOMMENDED) ▼] 3115

THE LOAD TEST TRANSFER TIME OFFSET IS THE TIME TO DELAY THE TRANSFER OF SUBSEQUENT ATS'S AFTER THE INITIATION ATS IS SWITCHED. THE TRANSFER BLOCK SIZE INDICATES THE NUMBER OF ATSS TO START SIMULTANEOUSLY AFTER WAITING FOR THE TRANSFER TIME OFFSET.
THESE VALUES WILL NOT APPLY FOR A SINGLE ATS TEST.

3120 [1] LOAD TEST TRANSFER TIME OFFSET (SEC)

3125 [2] TRANSFER BLOCK SIZE (NUMBER OF ATS'S)

THE 30% LOAD RULE WILL FORCE THE TESTING SYSTEM TO WAIT TO START THE TEST UNTIL THE ASSOCIATED GENERATOR LOAD IS AT 30% OF THE NAMEPLATE RATING. IF THE LOAD DOES NOT REACH 30% WITHIN 5 MINUTES, THE TEST WILL ABORT AND GENERATE NOTIFICATION ALARMS. IF THE TEST FALLS BELOW 30% AT ANY TIME DURING THE TEST, THE TEST WILL CONTINUE BUT GENERATE A NOTIFICATION ALARM.

3130 [ ] ENFORCE 30% LOAD RULE TO START TEST

3135 [NEXT] [CANCEL]

FIG. 31

EPSS1 MONTHLY LOAD TEST
GENERATOR OPERATIONAL REPORT

3401

OPERATOR: JIM NICHOLS  SITE: _CLINIC  START TIME: 4/2/2008 5:22:36 AM
TEST ID: 584  SYSTEM: EPSS1  END TIME: 4/2/2008 6:47:40 AM

PRE-TEST CHECKLIST
- [X] PERSONAL PROTECTIVE EQUIPMENT UTILIZED
- [X] BAS NOTIFIED PRIOR TO TEST
- [X] EPSS MAIN BREAKER CLOSED
- [X] ATS SWITCHES TESTED 3410  3412

GEN_EPSS1  NAMEPLATE KW: 750.00  30%KW 225.000

LOCATION: RM SB605  CRANK TIME: 00:00:04:720  START HOURS: 523.18
MANUFACTURER: CATERPILLAR  COOLDOWN TIME: 00:05:02:097  END HOURS: 524.59
MODEL: 3412  DATA SAMPLED TIME: 0DAYS 01:00:00:983
  TOTAL RUN TIME: 0DAYS 01:24:58:610

3414

GENERATOR DATA

| DATE TIME | VOLTAGE | | | CURRENT | | | 3 PHASE KW | % RATED CAPACITY | FREQUENCY HZ |
|---|---|---|---|---|---|---|---|---|---|
|  | A-B | B-C | A-C | A | B | C |  |  |  |
| 4/2/2008 5:24:33 AM | 485.03 | 482.06 | 482.03 | 597.11 | 518.63 | 565.14 | 287.44 | 38.33 | 60.00 |
| 4/2/2008 5:54:34 AM | 483.75 | 481.91 | 483.34 | 603.70 | 510.67 | 568.23 | 288.09 | 38.41 | 60.00 |
| 4/2/2008 6:24:34 AM | 483.95 | 481.78 | 483.75 | 605.24 | 510.84 | 578.83 | 295.09 | 39.35 | 60.00 |

3416

ENGINE DATA

| DATE TIME | BATTERY CHARGER | | OIL PRESS (PSI) | COOLANT TEMP (F) | EXHAUST TEMP (F) | |
|---|---|---|---|---|---|---|
|  | VOLTS | AMPS |  |  | 1 | 2 |
| 4/2/2008 5:24:33 AM | 25.00 | 5.43 | 60.80 | 141.20 | 734.90 | N/A |
| 4/2/2008 5:54:34 AM | 25.05 | 5.29 | 55.10 | 187.00 | 899.90 | N/A |
| 4/2/2008 6:24:34 AM | 25.05 | 5.33 | 55.10 | 186.90 | 906.00 | N/A |

EPSS1 MONTHLY LOAD TEST
GENERATOR COMPLIANCE REPORT

3402

OPERATOR: JIM NICHOLS  SITE: CLINIC  START TIME: 4/2/2008 5:22:36 AM
TEST ID: 584  SYSTEM: EPSS1  END TIME: 4/2/2008 6:47:40 AM

GEN_EPSS1  NAMEPLATE KW: 750.00  30%KW 225.000

LOCATION: RM SB605  START HOURS: 523.18
END HOURS: 524.59

GENERATOR DATA

| DATE TIME | VOLTAGE | | | CURRENT | | | FREQUENCY HZ | EXHAUST TEMP (F) | |
|---|---|---|---|---|---|---|---|---|---|
| | A-B | B-C | A-C | A | B | C | | 1 | 2 |
| 4/2/2008 5:24:33 AM | 485.03 | 482.06 | 482.03 | 597.11 | 518.63 | 565.14 | 60.00 | 734.90 | N/A |
| 4/2/2008 5:54:34 AM | 483.75 | 481.91 | 483.34 | 603.70 | 510.67 | 568.23 | 60.00 | 899.90 | N/A |
| 4/2/2008 6:24:34 AM | 483.95 | 481.78 | 483.75 | 605.24 | 510.84 | 578.83 | 60.00 | 906.00 | N/A |

EPSS1 MONTHLY LOAD TEST
ATS OPERATIONAL REPORT

OPERATOR: JIM NICHOLS  
TEST ID: 584  
SITE: _CLINIC  
SYSTEM: EPSS1

INITIATING ATS: ATS_BS4

DETECTED: 4/2/2008 5:22:36 AM  
ENGINES RUNNING  
EMERGENCY AT VOLTAGE  
EMERGENCY POSITION CLOSED  
ENDED: 4/2/2008 6:47:40 AM

00:00:08:233  
00:00:17:563  
00:00:22:343

3430 PRE-TEST CHECKLIST
- [X] PERSONAL PROTECTIVE EQUIPMENT UTILIZED
- [X] BAS NOTIFIED PRIOR TO TEST
- [X] EPSS MAIN BREAKER CLOSED
- [X] ATS SWITCHES TESTED

3435

ATS_BS1 — LIFE SAFETY — RATED AMPS: 400.00

DETECT TIME: 4/2/2008 5:22:38 AM  
LOCATION: RM 0606 MR  
MANUFACTURER: ASCO  
MODEL: E434340097XC  
TRANSITION: CLOSED

TRANSFER TO EMERGENCY  
TRANSFER DELAY: 00:00:16:780  
TRANSFER TIME: 4/2/2008 5:22:58 AM

RETRANSFER TO NORMAL  
TRANSFER DELAY: 00:08:31:733  
TRANSFER TIME: 4/2/2008 6:33:05 AM

TIME ON EMERGENCY: 0 DAYS 01:10:07:500

| DATE TIME | VOLTAGE A-B | B-C | A-C | CURRENT A | B | C | % OF RATED ATS AMPS |
|---|---|---|---|---|---|---|---|
| 4/2/2008 5:24:33 AM | 485.91 | 482.66 | 484.38 | 35.83 | 41.13 | 45.64 | 10.20 |
| 4/2/2008 5:54:34 AM | 485.70 | 480.31 | 483.97 | 35.77 | 41.09 | 45.64 | 10.19 |
| 4/2/2008 6:24:34 AM | 485.52 | 482.19 | 482.19 | 35.87 | 41.16 | 45.67 | 10.20 |

ATS_BS2 — CRITICAL — RATED AMPS: 400.00

DETECT TIME: 4/2/2008 5:22:38 AM  
LOCATION: RM 0606 MR  
MANUFACTURER: ASCO  
MODEL: E434340097XC  
TRANSITION: CLOSED

TRANSFER TO EMERGENCY  
TRANSFER DELAY: 00:00:17:530  
TRANSFER TIME: 4/2/2008 5:22:59 AM

RETRANSFER TO NORMAL  
TRANSFER DELAY: 00:01:24:937  
TRANSFER TIME: 4/2/2008 6:25:59 AM

TIME ON EMERGENCY: 0 DAYS 01:02:59:953

| DATE TIME | VOLTAGE A-B | B-C | A-C | CURRENT A | B | C | % OF RATED ATS AMPS |
|---|---|---|---|---|---|---|---|
| 4/2/2008 5:24:33 AM | 485.31 | 483.03 | 485.56 | 35.79 | 29.20 | 40.66 | 8.84 |
| 4/2/2008 5:54:34 AM | 484.47 | 482.72 | 485.19 | 32.77 | 26.45 | 38.22 | 7.07 |
| 4/2/2008 6:24:34 AM | 485.48 | 483.03 | 485.38 | 33.78 | 28.82 | 41.06 | 8.65 |

ATS_BS3 — EQUIPMENT — RATED AMPS: 260.00

DETECT TIME: 4/2/2008 5:22:41 AM  
LOCATION: RM 0607 MR  
MANUFACTURER: ASCO  
MODEL: E434340097XC  
TRANSITION: CLOSED

TRANSFER TO EMERGENCY  
TRANSFER DELAY: 00:00:17:523  
TRANSFER TIME: 4/2/2008 5:22:59 AM

RETRANSFER TO NORMAL  
TRANSFER DELAY: 00:10:24:170  
TRANSFER TIME: 4/2/2008 6:34:58 AM

TIME ON EMERGENCY: 0 DAYS 01:11:59:153

| DATE TIME | VOLTAGE A-B | B-C | A-C | CURRENT A | B | C | % OF RATED ATS AMPS |
|---|---|---|---|---|---|---|---|
| 4/2/2008 5:24:33 AM | 487.98 | 488.16 | 488.97 | 4.35 | 3.82 | 3.81 | 1.53 |
| 4/2/2008 5:54:34 AM | 485.98 | 489.94 | 489.03 | 4.29 | 3.80 | 3.81 | 1.52 |
| 4/2/2008 6:24:34 AM | 487.98 | 488.00 | 488.97 | 4.29 | 3.81 | 3.81 | 1.53 |

FIG. 34C

EPSS1 MONTHLY LOAD TEST
ATS COMPLIANCE REPORT

OPERATOR: JIM NICHOLS
TEST ID: 584

SITE: CLINIC
SYSTEM: EPSS1

ATS DATA

| ATS DESCRIPTION | LOCATION | SERVICE | SWICHED TO EMERGENCY | SWITCHED TO NORMAL |
|---|---|---|---|---|
| ATS_C51 | RM 5350 MR | EQUIPMENT | 4/2/2008 5:22:57 AM | 4/2/2008 6:40:05 AM |
| ATS_EB3 | RM 3139 MR | EQUIPMENT | 4/2/2008 5:22:57 AM | 4/2/2008 6:34:58 AM |
| ATS_BS1 | RM 0606 MR | LIFE SAFETY | 4/2/2008 5:22:58 AM | 4/2/2008 6:33:05 AM |
| ATS_BS2 | RM 0606 MR | CRITICAL | 4/2/2008 5:22:59 AM | 4/2/2008 6:25:59 AM |
| ATS_BS4 | RM 0606 MR | LIFE SAFETY-EQUIPMENT | 4/2/2008 5:22:59 AM | 4/2/2008 6:36:45 AM |
| ATS_EB1 | RM 3139 MR | LIFE SAFETY | 4/2/2008 5:22:59 AM | 4/2/2008 6:29:46 AM |
| ATS_EB2 | RM 3139 MR | CRITICAL | 4/2/2008 5:22:59 AM | 4/2/2008 6:27:50 AM |
| ATS_OLDKOHLER | RM 0403 MR | LIFE SAFETY | 4/2/2008 5:24:22 AM | 4/2/2008 6:31:58 AM |
| ATS_NB1 | RM 04285 MR | LIFE SAFETY | 4/2/2008 5:24:32 AM | 4/2/2008 6:29:20 AM |
| ATS_NB2 | RM 04285 MR | CRITICAL | 4/2/2008 5:24:33 AM | 4/2/2008 6:26:46 AM |
| ATS_NB3 | RM 04285 MR | EQUIPMENT | 4/2/2008 5:24:33 AM | 4/2/2008 6:42:38 AM |

FIG. 34D

EMERGENCY EVENTS REPORT

PERIOD: 1/1/2008 - 4/4/2008

| GENERATOR DETAILS | START DATE | END DATE | ENGINE START HOURS | ENGINE END HOURS | COMMENTS |
|---|---|---|---|---|---|
| NAME: GEN_57<br>MAKE: CATERPILLAR D334<br>SYSTEM: 57ADDITION<br>LOCATION: RM 0136 MR | NO EMERGENCY EVENTS FOR THIS PERIOD | | | | |
| NAME: GEN_COBALT<br>MAKE: CATERPILLAR 3208NA<br>SYSTEM: COBALT<br>LOCATION: RM 0015 MR | NO EMERGENCY EVENTS FOR THIS PERIOD | | | | |
| NAME: GEN_CR2<br>MAKE: CATERPILLAR D3406D1<br>SYSTEM: CR2<br>LOCATION: 0591C | 2/21/2008 7:55:21 AM | 2/21/2008 8:16:44 AM | 1187.69 | 1188.13 | NONE |
| NAME: GEN_CR3<br>MAKE: CATERPILLAR D379<br>SYSTEM: CR3<br>LOCATION: 5160 MR | 2/21/2008 7:55:11 AM | 2/21/2008 8:16:53 AM | 334.81 | 335.27 | NONE |
| NAME: GEN_DIALYSIS<br>MAKE: GRENERAC 91A039911S<br>SYSTEM: COBALT<br>LOCATION: RM 0015 MR | NO EMERGENCY EVENTS FOR THIS PERIOD | | | | |
| NAME: GEN_WESTINFILL<br>MAKE: CATERPILLAR 3412<br>SYSTEM: WESTINFILL<br>LOCATION: RM SB605 | 2/21/2008 7:55:11 AM<br>3/6/2008 5:03:47 AM<br>3/6/2008 6:42:50 AM<br>3/18/2008 5:35:18 AM | 2/21/2008 8:16:53 AM<br>3/6/2008 6:41:55 AM<br>3/6/2008 6:42:52 AM<br>3/18/2008 6:00:44 AM | 334.81<br>517.46<br>518.44<br>521.57 | 335.27<br>518.44<br>518.44<br>522.00 | NONE<br>NONE<br>NONE<br>THIS WAS SCHEDULED OUTAGE. |

FIG. 35A

GENERATOR LOADED RUNS (20-40 DAY WINDOW)
PERIOD: 1/1/2008 - 4/4/2008
LOADED RUN TYPES:
A (AUTO) - LOADED TEST RUN INITIATED VIA THE INTERFACE
M (MANUAL) - A LOADED RUN INITIATED WITHOUT THE INTERFACE
E (EMERGENCY) - A LOADED RUN CAUSED BY A LOSS OF NORMAL POWER FROM ONE OR MORE ATS

| GENERATOR DETAILS | RUN TYPE DURATION (HRS) | RUN DATE | PRIOR RUN DATE | DAYS BETWEEN RUNS | OUTSIDE 20-40 DAY WINDOW | MIN. AMPS (ALL LEGS) THIS RUN |
|---|---|---|---|---|---|---|
| NAME: GEN_57 | A-1.18 | 1/3/2008 | 12/5/2007 | 28 | | 113.53 <30% |
| NAMEPLATE AMPS: 711 AMPS | A-1.17 | 2/6/2008 | 1/3/2008 | 34 | | 117.7 <30% |
| 30%NAMEPLATE: 213.3 AMPS | A-1.18 | 3/5/2008 | 2/6/2008 | 27 | | 111.8 <30% |
| MAKE/MODEL: CATERPILLAR D334 | A-0.24 | 3/17/2008 | 3/17/2008 | 12 | * | 114.78 <30% |
| SYSTEM: 57ADDITION | | TOTAL RUNS: 4 | | | TOTAL OUTSIDE: 1 | |
| LOCATION: RM 0136 MR | | | | | | |
| NAME: GEN_COBALT | A-1.16 | 1/3/2008 | 12/5/2007 | 28 | | 116.35 |
| NAMEPLATE AMPS: 347 AMPS | A-1.16 | 2/6/2008 | 1/3/2008 | 34 | | 121.77 |
| 30%NAMEPLATE: 104.1 AMPS | A-1.16 | 3/5/2008 | 2/6/2008 | 27 | | 134.88 |
| MAKE/MODEL: CATERPILLAR 3208NA | A-0.22 | 3/17/2008 | 3/5/2008 | 12 | * | 122.82 |
| SYSTEM: COBALT | | TOTAL RUNS: 4 | | | TOTAL OUTSIDE: 1 | |
| LOCATION: RM 0015G | | | | | | |
| NAME: GEN_CR2 | A-1.17 | 1/3/2008 | 12/5/2007 | 28 | | 95.44 <30% |
| NAMEPLATE AMPS: 1034 AMPS | A-1.17 | 2/6/2008 | 1/3/2008 | 34 | | 64.69 <30% |
| 30%NAMEPLATE: 310.2 AMPS | E-0.44 | 2/21/2008 | 2/6/2008 | 15 | * | 0 <30% |
| MAKE/MODEL: CATERPILLAR D3406D1 | A-1.17 | 3/5/2008 | 2/21/2008 | 12 | * | 88.88 <30% |
| SYSTEM: CR2 | A-0.19 | 3/17/2008 | 3/5/2008 | 12 | * | 93.94 <30% |
| LOCATION: 0591C | | TOTAL RUNS: 5 | | | TOTAL OUTSIDE: 3 | |
| NAME: GEN_CR3 | A-1.20 | 1/3/2008 | 12/5/2007 | 28 | | 164.92 <30% |
| NAMEPLATE AMPS: 602 AMPS | A-1.19 | 2/6/2008 | 1/3/2008 | 34 | | 151.88 <30% |
| 30%NAMEPLATE: 180.0 AMPS | A-1.19 | 2/7/2008 | 2/6/2008 | 1 | * | 147.03 <30% |
| MAKE/MODEL: CATERPILLAR D379 | E-0.46 | 2/21/2008 | 2/7/2008 | 14 | * | 0 <30% |
| SYSTEM: CR3 | A-1.19 | 3/5/2008 | 2/21/2008 | 12 | * | 152.57 <30% |
| LOCATION: 5160MR | A-0.29 | 3/17/2008 | 3/5/2008 | 12 | * | 181.43 |
| | | TOTAL RUNS: 6 | | | TOTAL OUTSIDE: 4 | |
| NAME: GEN_DIALYSIS | A-1.11 | 1/16/2008 | 12/19/2007 | 27 | | 23.19 <30% |
| NAMEPLATE AMPS: 173.40 AMPS | A-1.11 | 2/20/2008 | 1/16/2008 | 35 | | 21.21 <30% |
| 30%NAMEPLATE: 52.02 AMPS | M-1.11 | 3/19/2008 | 2/20/2008 | 28 | | 25.27 <30% |
| MAKE/MODEL: GENERAC 91A03911S | | | | | | |
| SYSTEM: DIALYSIS | | TOTAL RUNS: 3 | | | TOTAL OUTSIDE: 0 | |
| LOCATION: OUTSIDE CAGE | | | | | | |
| NAME: GEN_WESTINFILL | A-1.35 | 1/3/2008 | 12/5/2007 | 28 | | 440.55 |
| NAMEPLATE AMPS: 1128.00 AMPS | A-1.40 | 2/6/2008 | 1/3/2008 | 34 | | 453.81 |
| 30%NAMEPLATE: 338.4 AMPS | E-0.66 | 2/21/2008 | 2/6/2008 | 15 | * | 0 <30% |
| MAKE/MODEL: CATERPILLAR 3412 | A-1.95 | 3/5/2008 | 2/21/2008 | 12 | * | 434.97 <30% |
| SYSTEM: WESTINFILL | A-0.98 | 3/6/2008 | 3/5/2008 | 0 | * | 201.75 <30% |
| LOCATION: RM SB605 | E-0.98 | 3/6/2008 | 3/6/2008 | 0 | * | 0 <30% |
| | E-0.00 | 3/6/2008 | 3/6/2008 | 0 | * | 0 <30% |
| | A-0.44 | 3/17/2008 | 3/6/2008 | 11 | * | 240.77 <30% |
| | E-0.43 | 3/18/2008 | 3/17/2008 | 0 | * | 24.3 <30% |
| | | TOTAL RUNS: 9 | | | TOTAL OUTSIDE: 7 | |

FIG. 35B

GENERATOR RUN TIMES REPORT
PERIOD: 1/1/2008 - 4/4/2008

— 3503

| SITE-SYSTEM-GENERATOR | NO LOAD TEST RUN HOURS | LOADED TEST RUN HOURS | OTHER LOADED RUN HOURS | EMERGENCY RUN HOURS | TOTAL TIME |
|---|---|---|---|---|---|
| _CLINIC-57ADDITION-GEN_57 | 4.60 | 3.77 | 0.00 | 0.00 | 8.37 |
| _CLINIC-COBALT-GEN_COBALT | 5.27 | 3.70 | 0.00 | 0.44 | 9.87 |
| _CLINIC-CR2-GEN_CR2 | 5.33 | 3.70 | 0.00 | 0.46 | 9.47 |
| _CLINIC-CR3-GEN_CR3 | 0.55 | 5.06 | 0.00 | 0.00 | 6.07 |
| _CLINIC-DIALYSIS-GEN_DIALYSIS | 3.53 | 3.33 | 0.00 | 0.00 | 6.86 |
| _CLINIC-WESTINFILL-GEN_WESTINFILL | 5.46 | 6.12 | 0.00 | 2.07 | 13.65 |

SWITCH OPERATION REPORT
PERIOD: 1/1/2008 - 4/4/2008

| ATS DETAILS | INITIATING ATS | TRANSFER TO EMERGENCY | TRANSFER TO NORMAL | EVENT TYPE/ID - COMMENTS |
|---|---|---|---|---|
| NAME: ATS_57<br>MAKE: ASCO F7ATSA3800C5<br>SITE: _CLINIC<br>SYSTEM: 57ADDITION<br>LOCATION: RM0136 MR | *<br>*<br>*<br>*<br>4 | 1/3/2008 5:06:59 AM<br>2/6/2008 5:14:16 AM<br>3/5/2008 5:12:40 AM<br>3/17/2008 5:27:11 PM | 1/3/2008 6:12:18 AM<br>2/6/2008 6:19:34 AM<br>3/5/2008 6:17:59 AM<br>3/17/2008 5:36:30 PM | AUTO_LOAD_TEST - NONE<br>AUTO_LOAD_TEST - NONE<br>AUTO_LOAD_TEST - NONE<br>AUTO_LOAD_TEST - NONE |
| NAME: ATS_COBALT<br>MAKE:<br>SITE: _CLINIC<br>SYSTEM: COBALT<br>LOCATION: | *<br>*<br>*<br>*<br>4 | 1/3/2008 5:07:33 AM<br>2/6/2008 5:14:54 AM<br>3/5/2008 5:13:18 AM<br>3/17/2008 5:45:18 PM | 1/3/2008 6:12:52 AM<br>2/6/2008 6:20:13 AM<br>3/5/2008 6:18:37 AM<br>3/17/2008 5:54:26 PM | AUTO_LOAD_TEST - NONE<br>AUTO_LOAD_TEST - NONE<br>AUTO_LOAD_TEST - NONE<br>AUTO_LOAD_TEST - NONE |
| NAME: ATS_CR2<br>MAKE: ZENITH ZTSL120EX4<br>SITE: _CLINIC<br>SYSTEM: CR2<br>LOCATION: 0591C | *<br>*<br>*<br>*<br>*<br>5 | 1/3/2008 5:09:15 AM<br>2/6/2008 5:16:26 AM<br>2/21/2008 7:55:21 AM<br>3/5/2008 5:15:10 AM<br>3/17/2008 6:36:15 PM | 1/3/2008 6:14:37 AM<br>2/6/2008 6:21:46 AM<br>2/21/2008 8:16:44 AM<br>3/5/2008 6:20:33 AM<br>3/17/2008 6:42:34 PM | AUTO_LOAD_TEST - NONE<br>AUTO_LOAD_TEST - NONE<br>EMERGENCY - NONE<br>AUTO_LOAD_TEST - NONE<br>AUTO_LOAD_TEST - NONE |
| NAME: ATS_SB1<br>MAKE: ASCO E434326097XC<br>SITE: _CLINIC<br>SYSTEM: CR3<br>LOCATION: RM 0926 | *<br>*<br>*<br>*<br><br>*<br>5 | 1/3/2008 5:08:55 AM<br>2/6/2008 5:15:52 AM<br>2/7/2008 5:34:19 AM<br>2/21/2008 7:55:21 AM<br>3/5/2008 5:14:28 AM<br>3/17/2008 5:47:18 PM | 1/3/2008 6:15:07 AM<br>2/6/2008 6:21:15 AM<br>2/7/2008 6:40:22 AM<br>2/21/2008 8:16:53 AM<br>3/5/2008 6:20:29 AM<br>3/17/2008 5:58:47 PM | AUTO_LOAD_TEST - NONE<br>AUTO_LOAD_TEST - NONE<br>AUTO_LOAD_TEST - NONE<br>EMERGENCY - NONE<br>AUTO_LOAD_TEST - NONE<br>AUTO_LOAD_TEST - NONE |
| NAME: ATS_SB2<br>MAKE: ASCO E434326097XC<br>SITE: _CLINIC<br>SYSTEM: CR3<br>LOCATION: RM 0926 | *<br>*<br>*<br>*<br>*<br>5 | 1/3/2008 5:08:26 AM<br>2/7/2008 5:34:49 AM<br>2/21/2008 7:55:28 AM<br>3/5/2008 5:14:38 AM<br>3/17/2008 5:47:39 PM | 1/3/2008 6:15:23 AM<br>2/7/2008 6:40:44 AM<br>2/21/2008 8:17:29 AM<br>3/5/2008 6:20:06 AM<br>3/17/2008 5:57:08 PM | AUTO_LOAD_TEST - NONE<br>AUTO_LOAD_TEST - NONE<br>EMERGENCY - NONE<br>AUTO_LOAD_TEST - NONE<br>AUTO_LOAD_TEST - NONE |
| NAME: ATS_SB3<br>MAKE: ASCO E434326097XC<br>SITE: _CLINIC<br>SYSTEM: CR3<br>LOCATION: RM 0926 | <br><br><br>*<br><br>1 | 1/3/2008 5:09:41 AM<br>2/7/2008 5:34:49 AM<br>2/21/2008 7:55:32 AM<br>3/5/2008 5:14:38 AM<br>3/17/2008 5:47:42 PM | 1/3/2008 6:15:23 AM<br>2/7/2008 6:40:44 AM<br>2/21/2008 8:17:29 AM<br>3/5/2008 6:20:06 AM<br>3/17/2008 5:58:48 PM | AUTO_LOAD_TEST - NONE<br>AUTO_LOAD_TEST - NONE<br>EMERGENCY - NONE<br>AUTO_LOAD_TEST - NONE<br>AUTO_LOAD_TEST - NONE |
| NAME: ATS_01E<br>MAKE: ASCO G7ACTB031600N5XC<br>SITE: _CLINIC<br>SYSTEM: CR3<br>LOCATION: | <br><br><br><br><br>0 | 1/3/2008 5:08:19 AM<br>2/6/2008 5:15:36 AM<br>2/7/2008 5:34:17 AM<br>3/5/2008 5:14:18 AM<br>3/17/2008 5:47:05 PM | 1/3/2008 6:14:59 AM<br>2/6/2008 6:21:16 AM<br>2/7/2008 6:40:10 AM<br>3/5/2008 6:20:13 AM<br>3/17/2008 5:57:08 PM | AUTO_LOAD_TEST - NONE<br>AUTO_LOAD_TEST - NONE<br>AUTO_LOAD_TEST - NONE<br>AUTO_LOAD_TEST - NONE<br>AUTO_LOAD_TEST - NONE |
| NAME: AIM_DIALYSIS<br>MAKE: GENERAC 91A03911-W<br>SITE: _CLINIC<br>SYSTEM: DIALYSIS<br>LOCATION: BASEMENT ELECTRICAL | *<br>*<br>*<br>3 | 1/16/2008 1:45:23 PM<br>2/20/2008 2:01:25 PM<br>3/19/2008 2:01:59 PM | 1/16/2008 2:48:58 PM<br>2/20/2008 3:05:00 PM<br>3/19/2008 3:05:17 PM | AUTO_LOAD_TEST - NONE<br>AUTO_LOAD_TEST - NONE<br>MONTHLY LOAD TEST - NONE |

SYSTEM AND METHODS FOR MANAGING EMERGENCY POWER SUPPLY SYSTEM OPERATIONAL INFORMATION

CROSS REFERENCE TO RELATED APPLICATIONS

This application is a continuation application and claims the benefit of and priority under 35 U.S.C. §120 to U.S. patent application Ser. No. 12/143,326, filed Jun. 20, 2008, entitled "Systems, Methods, and Devices for Managing Emergency Power Supply Systems", by Bradley Witter et al., now U.S. Pat. No. 8,359,248, which is a continuation-in-part and claims benefit under 35 U.S.C. §120 of U.S. patent application Ser. No. 11/556,496, filed Nov. 3, 2006, and entitled "Power Monitoring and Testing", now U.S. Pat. No. 7,548,826, which claims benefit under 35 U.S.C. §119(e) of U.S. Provisional Patent Application No. 60/823,474, filed Aug. 24, 2006, and entitled "Test and Monitoring System", all of which are incorporated herein by reference in their entireties.

TECHNICAL FIELD

The present systems, methods, and devices relate generally to industrial automation systems, and more particularly to managing, monitoring, and testing emergency power supply systems.

BACKGROUND

Many facilities require backup power systems to generate power in case of emergencies or when conventional power systems fail. These backup power systems, commonly referred to as emergency power supply systems (EPSS's), provide power to a facility when utility power is unavailable. Loss of utility power may be due to any number of causes, such as downed power lines, planned blackouts, malfunctions at a sub-station, inclement weather, and the like. When these or other similar events occur, EPSS's are activated to supply much needed power to a facility.

For some facilities, loss of power is merely an inconvenience. For other facilities, however, it is absolutely crucial to have a reliable source of backup power in case of a power failure. For example, hospitals must operate life-sustaining equipment around the clock, so if power if lost, a backup power source must begin generating power immediately. Also, a loss of power during a medical operation would likely have severe results, including potential death of the patient. Airports and other ports require uninterrupted power as well so that there are no disturbances during dangerous procedures such as takeoffs, landings, and the like. Further, it may be important for a military base to sustain continuous power to avoid any security breaches, weapons malfunctions, etc. Many other facilities may require emergency power supply systems as well, such as universities, government structures, communications service installations, data processing centers, and office buildings, to name only a few.

In its basic form, an EPSS includes a power generator (also referred to as an engine-generator or genset), an automatic transfer switch (ATS), and a fuel supply. Essentially, when a utility power disruption event occurs, the ATS detects the disruption and sends a signal to the generator to begin running. The generator (or genset) typically includes a mechanical energy source, such as an internal combustion engine, coupled with an electrical generator. The mechanical energy source operates on fuel from the fuel supply, and the electrical generator converts the mechanical energy from the mechanical energy source into electrical power. Once the generator reaches a sufficient power level, the ATS transfers the power to the facility (or a certain portion of the facility) from utility power to generator-supplied power. Preferably, and in many EPSS's, this transfer occurs quickly, such that no real power disturbance is felt at the facility.

While some EPSS's include only one generator, ATS, and fuel supply, other EPSS's incorporate multiple generators, ATS's and other switchgear, and fuel supplies. Additionally, most facilities require many EPSS's to operate different rooms and buildings across the facility in case of a power disruption. Thus, any given facility may include tens or even hundreds of items of EPSS equipment at the facility. Obviously, managing such a vast amount of equipment spread across acres or even miles of a facility is a tremendous challenge. For example, the EPSS equipment must be maintained, fuel levels must be continuously monitored, connections and wiring should be examined, the equipment should be regularly checked and tested to ensure it is functioning properly, etc. Traditionally, this equipment is monitored and supervised by hand by employees who periodically physically check the equipment to ensure it is operating appropriately. However, humans can often make mistakes, and fail to notice vital problems with the EPSS equipment. Or, the equipment may break or experience a malfunction between checks, during which time a power loss may occur. Further, given the vast size of many facilities, sheer limitations on experienced personnel may prevent a facility from adequately managing its vital EPSS equipment.

Additionally, some facilities, especially hospitals, are required by various regulatory bodies to test their EPSS equipment regularly. These tests are completed for compliance purposes to ensure the equipment is operating correctly in case of an emergency. Generally, these tests are done manually by a facility employee who physically goes to each EPSS and manually tests the ATS which in turn starts and tests the supporting generator(s). The employee then tracks certain parameters of the equipment, such as voltage and current output, frequency, exhaust temperature of the mechanical energy source, and various other measures. Because this testing is done by hand, it is inefficient, inaccurate, and cumbersome, and often some tests are overlooked or simply ignored.

Further, during a power outage or crisis event, there is traditionally no way to actively monitor the status of running or standby EPSS equipment without physically going to the equipment and checking on it. For instance, during a mass power outage, and entire facility may lose power. Hopefully, the EPSS's will startup and begin supplying power to the facility, but some of the EPSS's may fail to operate due to an equipment malfunction, such as starting battery failure, empty fuel supply, or some other reason. Thus, the portion of the facility that was intended to be powered by the inoperative EPSS's would remain without power. It may be important to immediately identify which EPSS's failed to operate so that the problem can be quickly diagnosed and corrected. However, without a system to monitor the status of all of the facility's EPSS's in real time, certain portions of the facility may go without power for hours or longer.

Moreover, if a power outage or crisis event persists for an extended period of time, then it becomes increasingly important to be able to monitor the current status of all EPSS's during the crisis to ensure they are operating correctly, that no equipment problems are surfacing (such as excess temperatures or pressures within the equipment), that there is enough fuel available to continue operating most or all of them, etc. However, many EPSS's today provide no way to monitor, view, collect data from, or check on equipment in real time during an emergency power disruption event.

To complicate matters, most facilities have acquired different types, brands, and models of EPSS equipment over time as the facility has expanded. Thus, any given facility may employ a variety of different models of generators, ATS's, and other equipment, all of which were made by different vendors or manufacturers, and which were made at different points in time. For instance, one building on a university campus may incorporate backup power supplied by one brand of generators that was manufactured decades ago, while the building right next door might use another brand of generator that was manufactured last year. This variance in equipment further hinders the facility's ability to manage, maintain, and test the equipment because each piece of equipment functions differently, has different acceptable running parameters, requires different testing procedures, looks different, sounds different, etc. Thus, adequately maintaining and monitoring all of a facility's EPSS equipment with a manual labor force becomes virtually impossible.

Therefore, there is a long-felt but unresolved need for a system or method that enables a system operator to actively, in real time, monitor, test, and control a plurality of EPSS's across varying locations within a facility. There is a further need for a system that allows monitoring, normalizing of data, and easy and efficient testing of different makes and models of EPSS equipment in a real-time manner. Also, the system should have capability for quick and easy installation at a facility, be equipment vendor neutral, and provide any required testing or compliance reports in virtually real time.

BRIEF SUMMARY OF THE DISCLOSURE

Briefly described, and according to on embodiment, a method is described herein for configuring one or more pre-existing emergency power supply systems (EPSS's) distributed amongst many locations at a facility to provide an emergency power management system (EPMS). Generally, the EPMS includes a management computer system for managing operational characteristics of the EPMS. In one aspect, the management computer system receives EPSS inventory information input by an operator corresponding to properties of EPSS equipment that is physically present in the locations within the site. That EPSS inventory information is stored in a database and a plurality of inventoried EPSS's are defined. Then, the EPSS inventory information is processed via business rules engine software according to one or more predefined business rules to generate: (a) a bill of materials for EPMS hardware and data acquisition equipment required to collect EPSS operational data from the inventoried EPSS equipment, and (b) one or more order documents for installing the EPMS hardware and data acquisition equipment from the bill of materials at the site. Next, the EPMS hardware and data acquisition equipment are installed on or around the inventoried EPSS equipment according to the one or more order documents. Finally, one or more interface modules are installed at the site to operatively connect the installed data acquisition equipment to the management computer system and to provide a communication link between the management computer system and the inventoried EPSS's, whereby an operative and configured EPMS is provided.

According to one aspect, the order documents include work orders detailing work required to install the EPMS hardware and data acquisition equipment from the bill of materials at the site. The order documents also include engineering schematics for use by installation personnel to connect the inventoried EPSS equipment to the EPMS hardware and data acquisition equipment and to the management computer system. In one aspect, the order documents further include a configuration file for configuring management software to enable the management computer system to operate with the data acquisition equipment. The order documents additionally include one or more vendor orders for purchase of the EPMS hardware and data acquisition equipment from the bill of materials from one or more vendors. In a further aspect, the order documents include a project plan describing timelines and tasks associated with installing and configuring the EPMS at the site.

According to another aspect, the order documents are automatically communicated by the management computer system to installation personnel to install the EPMS hardware and data acquisition equipment at the site.

In some aspects, a price quote is generated by the business rules engine software for configuring the EPMS at the site.

According to yet another aspect, the EPSS inventory information is gathered by the operator via a portable data collection device.

According to still another aspect, the properties of the EPSS equipment include an equipment manufacturer, equipment model, and one or more rated values for each item of EPSS equipment. The properties of the EPSS equipment may also include specific physical attributes of the EPSS equipment that dictate which specific EPMS hardware and data acquisition equipment is required for configuring the EPMS. In one aspect, the properties of the EPSS equipment further include a physical position indicative of suitability for installation of EPMS hardware and data acquisition equipment on or around the one or more items of EPSS equipment.

According to an additional aspect, the management computer system further includes one or more servers for carrying out processing operations of the management computer system.

In a further aspect, the EPSS equipment includes generators, automatic transfer switches (ATS's), switchgear, fuel supplies, and fuel management systems. In some aspects, the EPSS equipment is manufactured to include some or all of the required EPMS hardware and data acquisition equipment, such that no installation (or only minimal installation) of such equipment is needed.

According to one embodiment, a user of the EPMS may view stored EPSS inventory information associated with the site via an online portal.

According to yet another aspect, the data acquisition equipment includes monitoring sensors (such as thermocouples, resistive temperature detectors (RTDs), pressure senders, current transformers (CTs), and limit switches), connectors required by particular types of monitoring sensors, power supplies, fuel gauges, power meters, gauges, status indicators, viewing cameras, microphones, vibration sensors, inertial sensors, motion sensors, actuation components, solenoids, and relays, and any other equipment necessary to collect operational data from the EPSS equipment.

According to still another aspect, the EPMS hardware includes mounting racks, mounting hardware, and communication links (such as cables, fiber optics, wiring, and wireless equipment), and any other hardware necessary to install and configure an EPMS at the site.

In another embodiment, an emergency power management system (EPMS) is disclosed for managing one or more pre-existing emergency power supply systems (EPSS's) at a site. The EPMS generally includes data acquisition equipment for collecting EPSS operational information from the EPSS equipment at the site. In one aspect, the data acquisition equipment is capable of collecting EPSS operational information from EPSS equipment manufactured by a plurality of manufacturers. The EPMS also includes one or more interface modules operatively connected to the data acquisition equipment for receiving the EPSS operational information from data acquisition equipment and normalizing the EPSS operational information to allow for efficient subsequent processing. The EPMS additionally includes a management computer system operatively connected to the one or more interface modules for receiving the normalized EPSS operational information from the interface modules and storing the normalized EPSS operational information in one or more databases. The management computer system includes management software for processing the normalized EPSS operational information into an interactive display and presenting the interactive display to a user via a user interface. In one aspect, the interactive display enables the user to manage the EPSS equipment at the site.

According to one aspect, the EPSS equipment includes generators, automatic transfer switches (ATS's), switchgear, fuel supplies, and fuel management systems. For a generator, the EPSS operational information includes the jacket water temperature, exhaust temperature, oil pressure, oil temperature, coolant temperature, battery charging voltage, battery charging current, engine running status, engine "not in auto" status, engine runtime, engine speed, generator power, rated load, generator power factor, percent generator capacity, three-phase voltage, three-phase current, generator frequency, and applied torque.

According to another aspect, the EPSS operational information for an ATS includes the emergency power, emergency power factor, emergency frequency, emergency three-phase voltage, emergency three-phase current, emergency average current, emergency power hours, normal power, normal power factor, normal frequency, normal three-phase voltage, normal three-phase current, normal average current, normal power hours, emergency power status, normal power status, emergency breaker status, and normal breaker status.

According to a further aspect, the EPSS operational information for a fuel supply includes the fuel level, fuel supply status, and exit fuel flow rate.

In one aspect, each of the one or more interface modules includes a microprocessor, memory, communication bus, one or more data inputs, one or more data outputs, and interface module software for carrying out the functions of receiving, normalizing, and transmitting EPSS operational information from the data acquisition equipment to the management computer system. In one aspect, an interface module is a remote terminal unit. In another aspect, an interface module is a programmable logic controller (PLC). Generally, each of the interface modules includes a firewall for preventing unauthorized access to the EPSS equipment, the management computer system, or the EPSS operational information.

In yet another aspect, the management computer system includes servers for carrying out the operational processes of the EPMS. In on aspect, the management computer system logs historical EPSS operational information in the one or more databases for providing operational trends of the one or more items of EPSS equipment over time.

In still another aspect, the interactive display that is displayed to the user via the user interface is a chart or graph of one or more items of EPSS operational information plotted over a predefined time period. In another aspect, the interactive display is one or more visual pictures of the EPSS equipment to enable visual monitoring of the EPSS equipment at the site. In one aspect, the interactive display is an interactive map view of the EPSS equipment for enabling a site-wide view of the pre-existing EPSS's at the site. In a further aspect, the interactive display is a report detailing specific normalized EPSS operational information for one or more selected items of EPSS equipment for a predetermined time period. In still further aspects, the interactive display is an electrical one-line view of power connections of the EPSS equipment at the site to utility power or emergency power.

According to an additional aspect, the user interface displays an alarm to the user when one or more predefined conditions related to the EPSS operational information are satisfied. The predefined conditions generally include when one or more values of EPSS operational information exceeds one or more predetermined values, when one or more values of EPSS operational information falls below one or more predetermined values, and when EPSS equipment malfunctions.

According to one aspect, the user interface displays normalized EPSS operational information related to a power disruption event as the event is occurring. The power disruption event may be a planned or unplanned loss of utility power, including an emergency or test.

Typically, according to a further aspect, the management computer system provides user security to prevent unauthorized access to the EPMS.

According to another embodiment, a method is described herein for testing emergency power supply system (EPSS) equipment at a facility. Generally, the EPSS equipment includes at least one automatic transfer switch (ATS), and the EPSS equipment is operatively connected to an EPSS management computer system for managing the EPSS equipment. In one aspect, the EPSS management computer system receives a test initiation command for initiation of a test of one or more items of EPSS equipment. In one aspect, the test initiation command is generated by a user via a graphical user interface (GUI), and the test initiation command includes one or more testing parameters. Upon receipt of the test initiation command, the EPSS management computer system creates a data record for each of the items of EPSS equipment that are subject to the test. Each data record includes EPSS testing data related to the automatic load test, and each data record is stored in a database. Then, a test start command is sent from the EPSS management computer system to an initiating ATS to start the automatic load test as a function of the one or more testing parameters in the test initiation command. Generally, the initiating ATS facilitates a transfer of electrical power to a portion of the facility from utility power to emergency power. During the test, the EPSS testing data is received from the EPSS equipment and stored in a data record for use in generating one or more test reports. Once the test has ended, the power to the portion of the facility is transferred back to utility power and the one or more test reports are generated based on the stored data records.

According to one aspect, the EPSS equipment further includes at least one fuel supply and at least one fuel management system. In another aspect, the EPSS equipment includes switchgear.

In yet another aspect, the EPSS equipment further includes at least one generator. For a generator, the EPSS testing data that is received from the generator and stored in a corresponding generator data record includes a test start date and time, test end date and time, time and date generator begins running, time and date generator stops running, total engine runtime, time duration of generator cooldown, oil pressure, coolant temperature, exhaust temperature, charging voltage, charging current, power, facility load powered, rated power, percent of rated power, three-phase voltage, three-phase current, and frequency. In one aspect, the data record for the generator includes a generator identifier, test identifier, facility identifier, user information, identifier of one or more EPSS's being tested, group of EPSS equipment to be tested, test type, and a creation date and time of the data record.

According to a further aspect, the testing parameters in the test initiation command include the duration of the test, group of EPSS equipment to be tested, test type (such as a one-time test, periodic test, and compliance test), the initiating ATS, load test transfer time offset, and a designation that the at least one generator must provide emergency power equal to at least 30% of its rated load before test recording begins.

In still another aspect, for an ATS, the EPSS testing data that is received from the at least one ATS and stored in a corresponding ATS data record is selected from the group comprising: date and time initiation command is received, test start date and time, date and time facility power is transferred from utility power to emergency power, time duration of transfer from utility power to emergency power, date and time facility power is transferred back from emergency power to utility power, time duration of transfer from emergency power to utility power, test end date and time, three-phase voltage, three-phase current, total current, rated current, percent of rated current, power factor, total power, facility load powered, frequency, and a percent of rated power for generators connected to the at least one ATS. In one aspect, the data record for the ATS includes an ATS identifier, a test identifier, facility identifier, user information, identifier of one or more EPSS's being tested, the initiating ATS, group of EPSS equipment to be tested, test type, and a creation date and time of the data record.

According to one aspect, the test start command is sent from the EPSS management computer system to the initiating ATS through an interface module. Generally, the interface module is operatively connected to the EPSS equipment for transmitting signals from the EPSS management computer system to the EPSS equipment to operate the EPSS equipment. In one aspect, the interface module receives EPSS testing data from the EPSS equipment during the test and normalizes and transmits the EPSS testing data to the EPSS management computer system for use in generating the one or more test reports.

In another aspect, a record of the specific ATS's that have been used as initiating ATS's for initiating tests during a predefined time period is logged in a database. Then, the system user is provided with a suggested initiating ATS via the GUI corresponding to an ATS that has not been used as an initiating ATS during the predefined time period so as to ensure all ATS's at the facility are adequately tested.

According to one aspect, once an emergency event is detected at the facility, the test is aborted.

According to a further aspect, live EPSS testing data is displayed to the user via the GUI as the test is occurring.

According to an additional aspect, the EPSS management computer system maintains a schedule of tests for running tests of the EPSS equipment according to a calendar of tests. In one aspect, the EPSS management computer system maintains a calendar of historical tests for viewing EPSS testing data related to past tests.

In yet another aspect, the one or more test reports comprise one or more compliance reports for complying with regulatory testing requirements of the EPSS equipment. In one aspect, the regulatory testing requirements are mandated by the Joint Commission and set by the National Fire Protection Agency. In still another aspect, the EPSS management computer system retrieves a beginning test data point, middle test data point, and ending test data point for the automatic load test from the EPSS testing data stored in the data records for each of the items of EPSS equipment for inclusion in the one or more compliance reports.

In a further aspect, the one or more test reports comprise one or more operational reports listing one or more items from the EPSS testing data received during the automatic load test for a plurality of test data points for each of items of EPSS equipment.

According to another aspect, the EPSS management computer system provides an alarm to the user via the GUI when one or more predefined occurrences related to the EPSS equipment occurs during a test. In one aspect, the one or more predefined occurrences include when one or more EPSS testing data values exceeds one or more predetermined values, when one or more EPSS testing data values falls below one or more predetermined values, when one or more items of EPSS equipment malfunctions, and when one or more items of EPSS equipment fails to operate.

BRIEF DESCRIPTION OF THE DRAWINGS

The accompanying drawings illustrate one or more embodiments of the disclosure and, together with the written description, serve to explain the principles of the disclosure. Wherever possible, the same reference numbers are used throughout the drawings to refer to the same or like elements of an embodiment, and wherein:

FIG. 8 shows a sample terminal display of EPSS equipment status according to an embodiment of the present system.

FIG. 11 shows a terminal display of a calendar view of a test scheduling interface according to one embodiment of the present system.

FIG. 15 shows a sample terminal display of alarm histories for various items of EPSS equipment at a facility according to one embodiment of the present system.

FIG. 20 shows a sample display for a facility portal according to one embodiment of the present system.

FIG. 21A is a sample generator inventory report created by the inventory report generation field contained in an embodiment of the facility portal.

FIG. 21B shows a sample ATS inventory report created by the inventory report generation field contained in an embodiment of the facility portal.

FIG. 21C is a sample fuel tank inventory report created by the inventory report generation field contained in an embodiment of the facility portal.

FIG. 22A illustrates a sample ATS manufacturer report created by the inventory report generation field contained in an embodiment of the facility portal.

FIG. 22B shows a sample generator manufacturer report created by the inventory report generation field contained in an embodiment of the facility portal.

FIG. 24A illustrates a terminal display of a tabular site summary view for a sample site according to an embodiment of the present system.

FIG. 26 shows a terminal display of an entity detail view for a particular ATS and particular generator in a given EPSS according to an embodiment of the present system.

FIG. 28 is a terminal display of an EPSS equipment roll-up view listing all items of EPSS equipment at a given site according to an embodiment of the present system.

FIG. 31 shows a terminal display of an embodiment of a test setup screen for testing items of EPSS equipment.

FIG. 34A is a sample generator operational report for a test of a given generator within an EPSS according to an embodiment of the present system.

FIG. 34B shows a sample generator compliance report for a test of a given generator within an EPSS according to an embodiment of the present system.

FIG. 34C illustrates a sample ATS operational report for a test of several ATS's within an EPSS according to an embodiment of the present system.

FIG. 34D is a sample ATS compliance report for a test of several ATS's within an EPSS according to an embodiment of the present system.

FIG. 35A is a sample emergency events report listing emergency events that have occurred for each generator at a facility over a given time period according to an embodiment of the present system.

FIG. 35B shows a sample generator loaded runs report listing all loaded uses of each generator at a facility over a given time period according to an embodiment of the present system.

FIG. 35C illustrates a sample generator run times report showing all run times of each generator at a facility over a given time period according to an embodiment of the present system.

FIG. 35D is a sample switch operation report listing all transfers between normal and emergency power for one or more ATS's at a facility over a given time period according to an embodiment of the present system.

FIG. 36 shows an embodiment of an interactive calendar display for displaying future scheduled tests and past power disruption events for a given facility.

Figure 1:
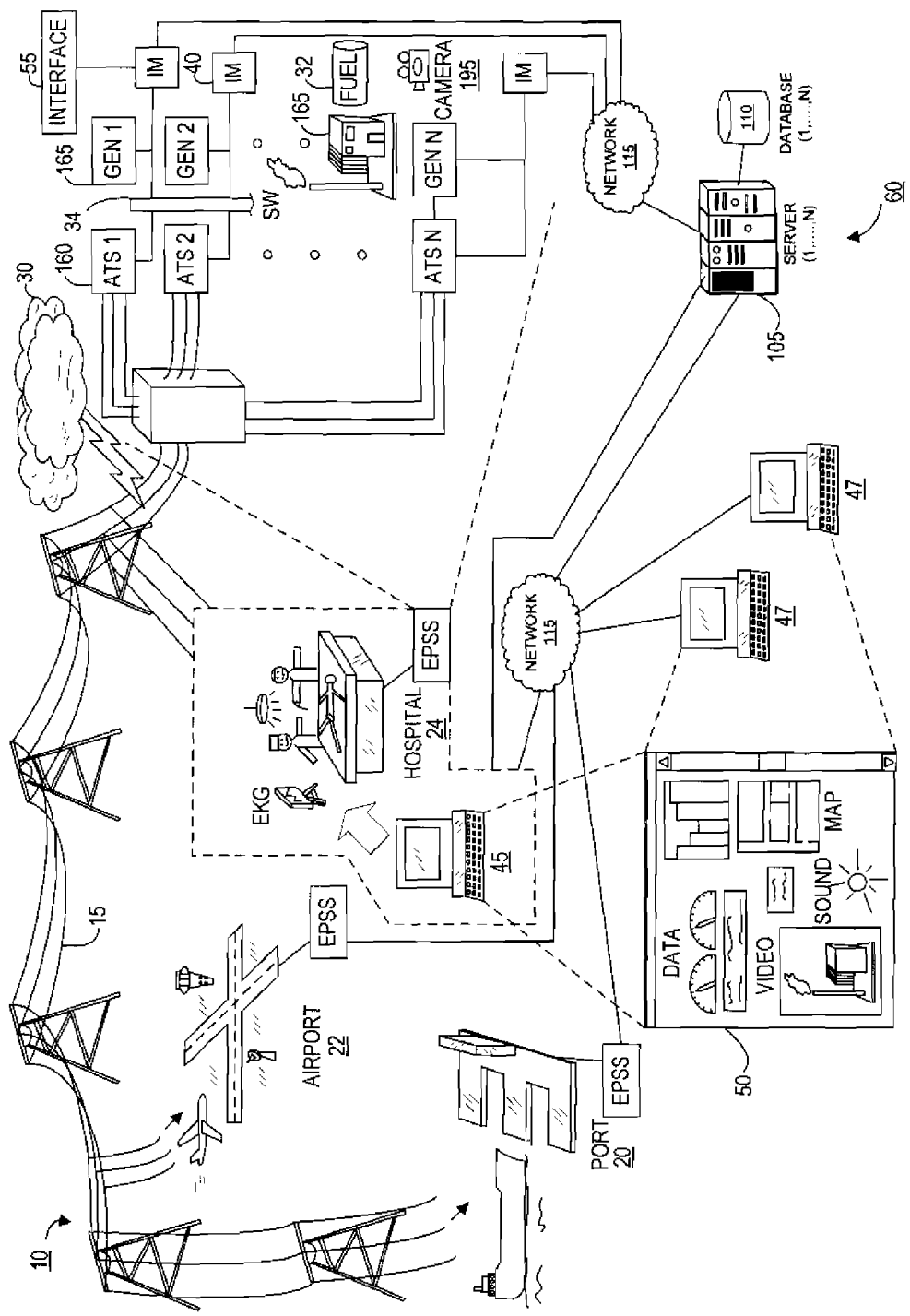
FIG. 1 is an overview of an embodiment of an emergency power management system.

Appendix I shows a sample bill of materials listing all necessary items required for installation and integration of an embodiment of an emergency power management system at a site.

Appendix II illustrates sample work instructions for installing data acquisition equipment and EPMS hardware at a site.

Appendix III illustrates a sample engineering schematic for installing data acquisition equipment and EPMS hardware at a site.

Appendix IV shows a sample vendor order for ordering data acquisition equipment and EPMS hardware for installation at a site.

DETAILED DESCRIPTION

Prior to a detailed description of the disclosure, the following definitions are provided as an aid to understanding the subject matter and terminology of aspects of the present systems and methods, are exemplary, and not necessarily limiting of the aspects of the systems and methods, which are expressed in the claims. Whether or not a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. A capitalized term within the glossary usually indicates that the capitalized term has a separate definition within the glossary. However, the capitalization or lack thereof within the remainder of this document is not intended to be necessarily limiting unless the context clearly indicates that such limitation is intended.

Definitions/Glossary

ATS operational information (or data): information or data related to an ATS or collected from an ATS. Generally includes emergency power available status, emergency breaker closed status, normal power available status, normal breaker closed status, normal power measurement, emergency power measurement, load power measurement, voltage for each ATS phase, current for each ATS phase, total current, rated current, percent rated current, power factor, frequency, percent total generator capacity, and any other similar measurements as will occur to one of ordinary skill in the art.

Automatic Transfer Switch (ATS): item of industrial equipment that enables automatic transfer back and forth from utility power to emergency power (i.e. generator-supplied power) as needed.

Automatic load test (ALT): a test of one or more items of EPSS equipment that is initiated remotely via a terminal display or user interface in which the selected EPSS equipment to be tested is used to actually power a portion of a facility during the test.

Automatic no load test (ANLT): a test of one or more items of EPSS equipment that is initiated remotely via a terminal display or user interface in which the selected EPSS equipment to be tested does not actually power any portion of a facility during the test. Generally, only generators are tested during an automatic no load test.

Data acquisition equipment: equipment used to collect operational data from EPSS equipment. Generally includes monitoring sensors (such as thermocouples, resistive temperature detectors (RTDs), pressure senders, current transformers (CTs), and limit switches), connectors required by particular types of monitoring sensors, power supplies, fuel gauges and other gauges, power meters, status indicators, video cameras, microphones, vibration sensors, inertial sensors, motion sensors, actuation components, solenoids, and relays, but may also include any other equipment as will occur to one of ordinary skill in the art. Some items of EPSS equipment require installation of data acquisition equipment, whereas other items of EPSS equipment are manufactured to include some or all of the required data acquisition equipment components.

Emergency event: a sudden or unexpected loss in utility power causing a need for generation of emergency power.

Emergency power: power supplied by an EPSS, and more specifically, a generator. Generally synonymous with backup power or generator power.

Emergency Power Management System (EPMS): a system constructed as described in this document, that enables managing, controlling, and testing of a plurality of items of EPSS equipment at one or more facilities.

Emergency Power Supply System (EPSS): system capable of supplying emergency power to a facility when normal or utility power fails or is unavailable. An EPSS generally includes at least one generator, at least one ATS, and at least one fuel supply, but may also include switchgear, a fuel management system, and other related equipment. Some EPSS's may comprise only ATS's. Generally synonymous with power system.

Enterprise server: a computer server as commonly understood in the art. Enterprise server includes all of the functionality of the site server, but with added functionality of hosting a web-based graphical user interface (GUI) or display for user interaction. Also provides rollup of multiple sites.

EPMS hardware: components used to install data acquisition equipment on or around items of EPSS equipment and connect the data acquisition equipment to one or more interface modules and the management computer system. Generally includes mounting racks, mounting hardware, and communication links (such as cables, fiber optics, wiring, and wireless equipment), but may also include any other hardware necessary to integrate and operate a functioning EPMS.

EPSS operational information (or data): includes both ATS operational information and generator operational information.

Facility: a place at which an EPMS is installed and made operative. For example, a facility may include a hospital, university, airport, or some other similar site, or may be a subset of such a site, such as a cafeteria, main building, small plane hangar, etc. Generally synonymous with site.

Fuel supply: an individual fuel tank, or fuel line to a larger tank, or some other source of fuel used to power a generator in an EPSS. Generally synonymous with fuel tank.

Generator: generally includes an engine (mechanical power source) and an electrical generator that are capable of generating power when used together. Generally synonymous with genset.

Generator operational information (or data): information or data related to a generator or collected from a generator. Generally includes jacket water temperature, exhaust temperature, oil pressure, coolant temperature, battery charging voltage, battery charging current, engine running status, engine "not in auto" status, high water temperature alarm(s), low oil pressure alarm(s), engine speed, engine overspeed alarm(s), engine overcrank alarm(s), engine running time, percent generator capacity, power, rated load, voltage for each phase, current for each phase, frequency, and any other similar measurements as will occur to one having ordinary skill in the art.

Intelligent EPSS equipment: items of EPSS equipment that are manufactured or preconfigured to include some or all of the necessary data acquisition equipment to provide operational data to the management computer system. Intelligent EPSS equipment generally requires little or no retrofitting and installation of data acquisition equipment, and also may include a control panel or controller for delivering EPSS operational information directly to an interface module.

Interface module (IM): intelligent device capable of receiving EPSS operational data from data acquisition equipment or control panels at items of EPSS equipment, normalizing and organizing that data, and transmitting the data to the management computer system for further processing and display. An interface module may comprise a remote terminal unit (RTU), programmable logic controller (PLC), or other similar intelligent device embedded with software capable of performing normalization and transmission functions of EPSS operational information.

Load: generally refers to the power consumed by a circuit. As used herein, a load includes the power consumed by equipment at a facility, as well as the power required to operate the facility itself.

Location: the physical place where one or more items of EPSS equipment are located. A location may include a room in a building, or the building itself, or an area in or around a building, or some other similar place as will occur to one of ordinary skill. Generally, an EPSS may be in one location or spread amongst several locations, but, alternatively, a location will generally not include more than one EPSS.

Management computer system: the combination of servers, networks, terminals, databases, proprietary management software, and other related items used to generate and operate an EPMS for a given facility.

Manual load test (MLT): a test of one or more items of EPSS equipment that is initiated physically at the specific items of EPSS equipment to be tested in which the selected EPSS equipment is used to actually power a portion of a facility during the test.

Manual no load test (MNLT): a test of one or more items of EPSS equipment that is initiated physically at the specific items of EPSS equipment to be tested in which the selected EPSS equipment does not actually power any portion of a facility during the test. Generally, only generators are tested during a manual no load test.

Power disruption event: an event that causes a loss of utility power and, generally, an activation of emergency power. Generally includes emergencies and other unplanned utility power losses, as well as EPSS equipment tests.

Region: a particular section of the country, such as a state, country, or other similar area.

Site: Generally synonymous with facility.

Site server: server that is generally located at a site or facility, and is responsible for interfacing with all interface modules at the site as well as any other auxiliary equipment. Site server also manages inter-process communications at the EPSS level between individual items of EPSS equipment for test and emergency coordination and management. Generally, site servers collect and log data from EPSS equipment and transmit that data to an enterprise server for further processing.

Site survey tool: a tablet computer, laptop computer, personal digital assistant (PDA), or other similar device used to collect information related to items of EPSS equipment at a given site and upload that information to a management computer system.

Switchgear: generally refers to the combination of electrical disconnects, fuses, and/or circuit breakers used to isolate and manage electrical distribution equipment.

Terminal display: computer interface used to view and control EPSS equipment and data related to same via a management computer system. Generally synonymous with interface, user interface, or graphical user interface (GUI).

Utility power: power supplied by a traditional utility power grid. Generally synonymous with normal power.

Overview

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates.

Aspects of the present disclosure generally relate to systems and methods for managing and monitoring a plurality of emergency power supply systems (EPSS's) in virtually real time via an emergency power management system (EPMS). Additional aspects relate to easily and efficiently creating and installing an EPMS at a facility to carry out the managing, monitoring, and testing functions of the EPSS equipment at the facility. Further aspects of the disclosure are directed to providing predictive analyses and operational information related to the EPSS equipment. Also, aspects of the present disclosure relate to normalizing EPSS equipment information across varying vendors, makes, and models of equipment so as to provide a unified view of all equipment across a given facility.

Referring now to the figures, FIG. 1 illustrates an overview of an embodiment of an emergency power management system (EPMS) 10. As shown, utility power is delivered by power lines 15, or some other similar mechanism, to various facilities. The facilities may be ports 20, airports 22, or hospitals 24, as shown, but may also be any facility that requires or uses emergency power supply systems (EPSS's), such as universities, military bases, government structures, communications service installations, data processing centers, office buildings, scientific laboratories, sewage pumping stations, retail outlets, residential complexes, and other similar facilities. Most of the time, a facility is powered by utility power. Some of the time, however, utility power is lost due to inclement weather 30, planned blackouts, malfunctions at a sub-station, or many other reasons. In these situations, the facility's EPSS's take over and generate the power needed to effectively operate the facility.

FIG. 1 shows a sample of a plurality of EPSS's for the hospital 24. While only the hospital's 24 EPSS's are demonstrated, it will be understood that the other facilities' EPSS's will be similar to the hospital's, and that each facility may include one or more EPSS's. Typically, each EPSS will include at least one automatic transfer switch (ATS) 160, at least one generator 165, and at least one fuel supply 32. Some EPSS's, however, will include multiple ATS's 160, generators 165, and fuel supplies 32, and will additionally include switchgear 34, fuel management systems, and other equipment. Other EPSS's may include only ATS's 160, and no generators 165. As will be understood by one having ordinary skill in the art, switchgear 34 is generally used in an EPSS setting when two or more generators 165 are involved to aid in the effective transfer of power. Additionally, as will also be understood, the fuel supply 32 within any EPSS may be an individual fuel tank, or a connection to a larger, facility-wide fuel tank, or a combination thereof.

In the embodiment of the EPMS 10 shown in FIG. 1, interface modules 40 are installed at the EPSS's to collect, process, normalize, and transmit EPSS operational data to the server(s) 105 for further processing. The interface modules 40 receive EPSS operational information from data acquisition equipment that is either retrofitted onto the EPSS equipment or is pre-installed on the equipment by the manufacturer. The data acquisition equipment generally includes monitoring sensors, power meters, vibration sensors, temperature readers, alarm/status contact sensors, and other similar equipment capable of collecting EPSS operational information from the items of EPSS equipment and transmitting that information to the interface modules 40. For the generators 165, the generator operational information may include the oil pressure of the engine, the battery voltage, the engine running status, the exhaust water temperature, and many other measurements as will occur to those skilled in the art. The ATS operational information may include a reading as to whether emergency power is available (i.e. whether the generator 165 is ready and capable of supplying needed power), a reading as to whether normal or utility power is available, whether the normal power breaker is closed, and many other measurements as will occur to those skilled in the art.

Further, each EPSS may include only one interface module 40, or multiple interface modules depending on the desires of the system user or on the number of items of EPSS equipment in a given EPSS. In some embodiments, each interface module 40 is capable of interfacing with a plurality of items of EPSS equipment, but more than one interface module may be included in a given EPSS based on the quantity and physical location of the EPSS equipment. Generally, the interface modules 40 include microprocessors capable of receiving and processing the EPSS operational information. Additionally, in some embodiments, the microprocessors within the interface modules 40 normalize the incoming EPSS operational data into unified data outputs for subsequent processing. This normalization is accomplished by passing the incoming EPSS operational information through predefined algorithms based on the specific manufacturer and model of the item of EPSS equipment from which the information is being received (discussed in greater detail below).

After the EPSS operational information is processed by the interface modules 40, the information is delivered via the network 115 to server(s) 105, where it is stored on database(s) 110, and further processed and made available for viewing at local terminal 45 or remote terminal(s) 47. The combination of server(s) 105, database(s) 110, network(s) 115, and terminal(s) 45, 47, as well as proprietary management software and other related items, serve to comprise one embodiment of the management computer system 60. The management computer system 60 is used, according to one embodiment, to initiate and subsequently operate an EPMS 10. As will be understood, while only one local terminal 45 and two remote terminals 47 are shown in FIG. 1, many more terminals may be used within embodiments of the present systems and methods. Further, the EPSS information is processed into tables, graphs, charts, and other presentation forms to enable a user to view the processed EPSS information at a terminal 45, 47 through an interactive display 50. In one embodiment, the interactive display 50 may also include videos and audio associated with the EPSS equipment, which are captured by cameras 195 installed around the EPSS equipment. Further embodiments of the interactive display 50 include interactive maps detailing locations and status of EPSS equipment throughout a facility, one-line diagrams illustrating connections between EPSS equipment and utility or emergency power, reports based on EPSS operational information generated over time, and various other displays and features.

Through the interactive display 50, a system user may not only view and analyze EPSS operational information being generated by the EPSS equipment, but may also initiate and monitor tests of the equipment remotely. In this way, testing parameters and specifics may be entered by a user at a terminal 45, 47, transmitted either through a network 115 or directly to a server 105, and then further transmitted to the interface modules 40, which then command the generators, ATS's, and other items of EPSS equipment to startup and operate accordingly. While a test is occurring, the interface modules 40 receive EPSS operational information from the equipment that is subject to the test, and transmit this information back to the server(s) 105 for processing. The EPSS information that is recorded and processed during a test can then be used to generate reports, either for purposes of compliance or simply for the facility's own benefit.

As shown in FIG. 1, the network(s) 115 may be data networks, intranets, the internet, or any other similar networks capable of transmitting information. Additionally, as shown, all facilities may be connected to a centralized server 105 or servers via a network 115. In this way, a localized user of the EPMS 10 for a given facility may be able to manage and control the EPSS equipment associated with his or her facility, but may not be able to view or interact with EPSS equipment at a separate facility. An overall system operator, however, may be able to monitor all EPSS equipment from all facilities through a secured network 115. Also, rather than operating through a network, a local facility user can view EPSS operational information through an interface 55 connected directly to one or more interface modules 40 at the facility. This interface 55 may be a terminal 45, or it may comprise some alternate viewing mechanism, such as a wireless device (for example, and embedded Windows® machine). Accordingly, a system user may view, manage, and monitor all of the EPSS equipment at a given facility through an interface 55, a local terminal 45, or a remote terminal 47.

The materials discussed above in association with FIG. 1 merely provide an overview of an embodiment of the present system for managing emergency power supply system equipment, and are not intended to limit in any way the scope of the present disclosure. Accordingly, further embodiments of the systems and methods and more detailed discussions thereof will be described below.

First Embodiments

Figure 2:
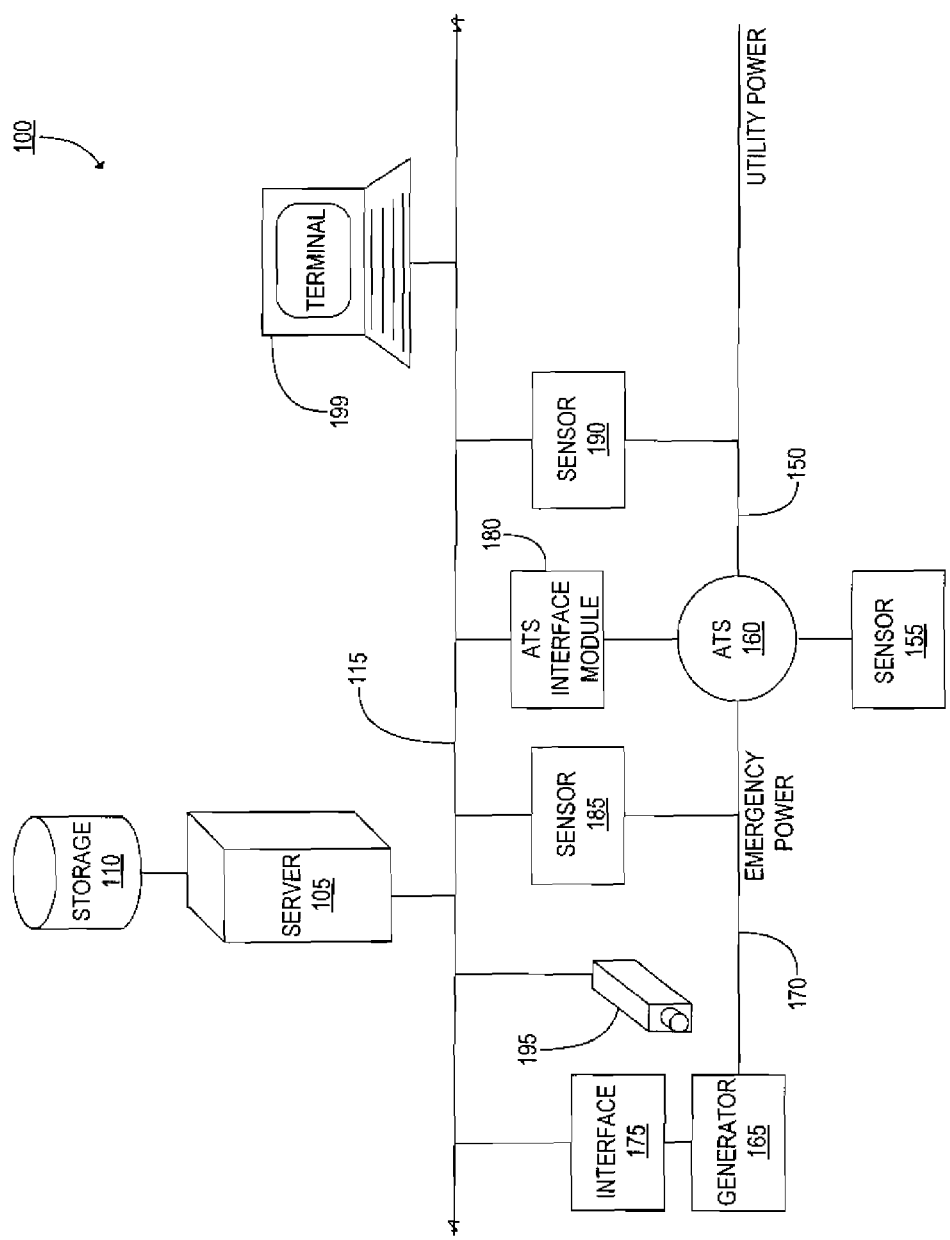
FIG. 2 shows a block diagram of another embodiment of an emergency power management system.
Figure 3:
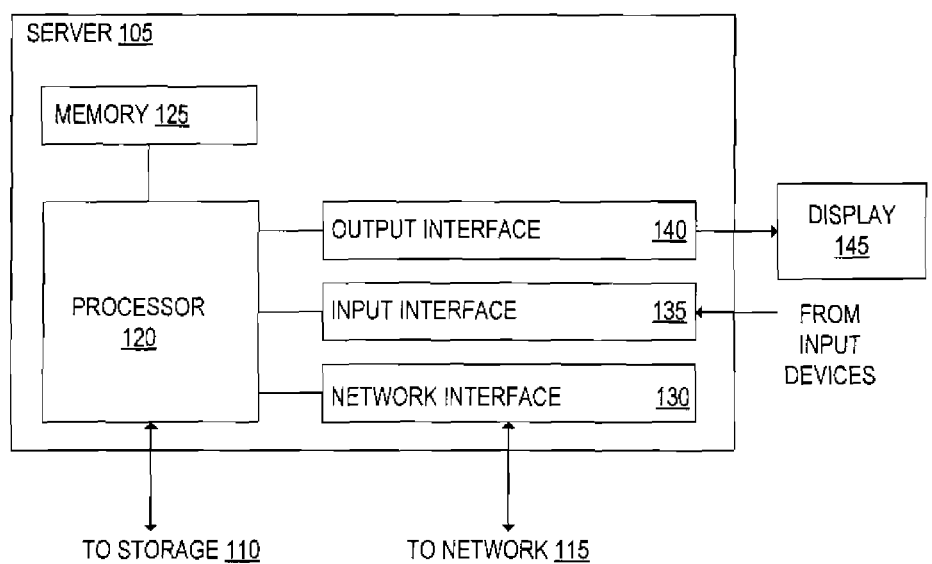
FIG. 3 is a block diagram illustrating an embodiment of a server.

Generally, one form of the present disclosure is a system for monitoring, managing, and testing a power system having local generators and connections to the utility power grid. Turning to FIG. 2, a system 100 is shown with a server 105 and storage 110 connected to data network 115. Server 105 in this embodiment includes processor 120, memory 125, network interface 130, input interface 135, and output interface 140, as shown in FIG. 3 and as will be understood by those skilled in the art. Power, ground, clock, and other signals and circuitry are omitted for clarity, but will be understood and easily implemented by those skilled in the art.

With continuing reference to FIG. 3, network interface 130 in this embodiment connects server 105 to network 115 for communication of data between server 105 and other devices attached to network 115. Input interface 135 manages communication between processor 120 and one or more push-buttons, UARTs, IR and/or RF receivers or transceivers, decoders, or other devices, as well as traditional keyboard and mouse devices. Output interface 140 provides a video signal to display 145, and may provide signals to one or more additional output devices such as LEDs, LCDs, or audio output devices, or a combination of these and other output devices and techniques as will occur to those skilled in the art.

Processor 120 in some embodiments is a microcontroller or general purpose microprocessor that reads its program from memory 125. Processor 120 may be comprised of one or more components configured as a single unit. Alternatively, when of a multi-component form, processor 120 may have one or more components located remotely relative to the others. One or more components of processor 120 may be of the electronic variety including digital circuitry, analog circuitry, or both. In one embodiment, processor 120 is of a conventional, integrated circuit microprocessor arrangement, such as one or more PENTIUM 4 or XEON processors from INTEL Corporation of 2200 Mission College Boulevard, Santa Clara, Calif. 95052, USA, or ATHLON XP or OPTERON processors from Advanced Micro Devices, One AMD Place, Sunnyvale, Calif. 94088, USA. In alternative embodiments, one or more application-specific integrated circuits (ASICs), general-purpose microprocessors, programmable logic arrays, or other devices may be used alone or in combination as will occur to those skilled in the art.

Likewise, memory 125 in various embodiments includes one or more types such as solid-state electronic memory, magnetic memory, or optical memory, just to name a few. By way of non-limiting example, memory 125 can include solid-state electronic Random Access Memory (RAM), Sequentially Accessible Memory (SAM) (such as the First-In, First-Out (FIFO) variety or the Last-In, First-Out (LIFO) variety), Programmable Read-Only Memory (PROM), Electrically Programmable Read-Only Memory (EPROM), or Electrically Erasable Programmable Read-Only Memory (EEPROM); an optical disc memory (such as a recordable, rewritable, or read-only DVD or CD-ROM); a magnetically encoded hard drive, floppy disk, tape, or cartridge media; or a combination of these memory types. Also, memory 125 is volatile, nonvolatile, or a hybrid combination of volatile and nonvolatile varieties.

Returning to FIG. 2, utility power line 150 provides power to load 155 via Automatic Transfer Switch (ATS) 160. When utility power delivered through line 150 is unstable or insufficient, ATS 160 manages a partial or total switchover to power generated by generator 165 and delivered through line 170. In various embodiments, ATS 160 is an automatic transfer switch manufactured by ASCO, Russelectric, APC (such as its Rack ATS product), Cummins (such as its POWER COMMAND transfer switches), BayTech (such as its ATS Series Transfer Switch), GE Zenith, or Caterpillar, just to name a few options. Similarly, generator 165 is selected, in various embodiments, from the Caterpillar 3500 family, Cummins generator sets, and other models which will occur to those skilled in the art. In some instances, generator 165 and ATS 160 are integrated in a single unit, while in others the units are distinct.

In various embodiments, generator 165 includes a built-in interface 175, which may be used in its factory configuration or supplemented with additional interface hardware and/or software to provide the interface used by system 100. In other embodiments, generator 165 includes only a limited number of built-in sensors (or none at all), and interface 175 must provide all or substantially all of the instrumentation for that generator 165. In some embodiments, generator 165 is connected to genset interface module 175, which collects operational parameters from generator 165 and makes them available to other devices via network 115. In various embodiments, the parameters provided by genset interface module 175 includes the genset's fuel level, oil pressure, "running" status, water temperature, exhaust temperature, output frequency, engine speed, applied torque, DC output voltage, and running time meter, just to name a few.

ATS interface module 180 detects the state of ATS 160 and makes that information available via network 115 to other devices connected to the network. The data made available by ATS interface module 180 includes, in various embodiments, its running status, input level, override status, voltage, current, power output, power factor, and the like. In some embodiments, some or all of these variables are captured and made available via network 115 by one or more power meters (not shown) connected to or near the ATS.

Sensors 185 and 190 detect the state of supply lines 170 and 150, respectively, on the generator and utility inputs, respectively, to ATS 160. This data is also provided via network 115 to other devices that are connected to network 115. Camera 195 captures images of generator 165 over time so that devices connected to network 115 can capture and/or display still pictures or motion video of the physical site of generator 165 at desired times. In various embodiments, multiple cameras provide images in a variety of views and/or spectra as necessary or desired. Terminal 199 is also in communication with network 115 and is configured to monitor and/or control other devices on network 115.

Further, in various embodiments, multiple transfer switches 160, generators 165, sensors 185, 190, cameras 195, and interface modules 175, 180 are in communication with network 115 to implement and instrument a system that meets the power needs of a building, organization, institution, or group. Multiple terminals 199 communicate with server 105 to access data compiled or calculated there, or communicate with other devices and interfaces to read operational parameters or control those devices.

Server 105 collects data produced by interface modules 175 and 180, sensors 185 and 190, and camera 195, storing some or all of that data in storage unit 110. The data may be stored using any technique that would occur to one skilled in the art, including but not limited to, storing all such data, sampling the data at various intervals for longer-term storage, implementing circular buffers and snapshots, and other strategies. Server 105 also calculates aggregate information, such as uptime and running time for a device, maxima and minima of operational parameters over time, and the like, and constructs graphical depictions of captured data either on a scheduled, "snapshot" basis or on demand. Terminal 199 accesses the data on server 105 and (through server 105) in storage 110 so that an individual at terminal 199 can monitor and/or control ATS 160, generator 165, and/or other controllable devices using that information. In various embodiments, server 105 makes this data available in various forms, such as via FTP, HTTP, automatically generated email, or the like. In some embodiments, the data provided to terminal 199 is substantially real-time information, while in others served data is drawn from a snapshot of the relevant device(s), while in still others some data of each type is available.

Figure 4:
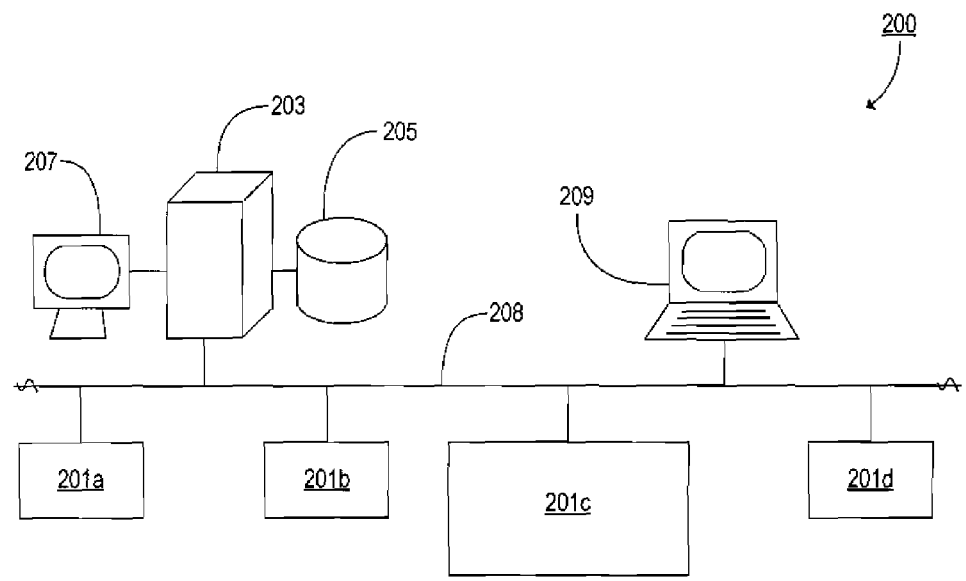
FIG. 4 is a block diagram of yet another embodiment of an emergency power management system.

FIG. 4 shows a system 200 that includes multiple subsystems 201*a*, 201*b*, 201*c*, and 201*d*. Each subsystem roughly resembles system 100 as shown in FIG. 2 and discussed in relation thereto, though the various subsystems may be in a single geographical location or multiple locations, could include the same or different numbers of generators 165, ATS units 160, sensors 185, 190, cameras 195, and other components, and may include elements that are the same or different in make, model, and/or configuration from those in other subsystems. Server 203 collects operational parameter information from a server 105 from each subsystem 201a, 201b, 201c, and 201d, compiles that information, and saves it in storage 205. Enterprise server 203 also calculates aggregate data and generates graphical displays for showing on monitor 207 and/or terminal 209.

Communication between subsystems 201, server 203, and terminal 209 occurs via one or more networks 208. In various embodiments, network 208 (and network 115 in FIG. 2) comprises one or more local area networks (LANs), wide area networks (WANs), virtual private networks (VPNs), dedicated communication circuits, device-level (e.g., Modbus) networks, and the like. One or more routers, switches, subnetworks, bridges, and the Internet may appear in networks 115 or 208, or between two or more portions of systems 100 and 200, as will occur to those skilled in the art.

Figure 5:
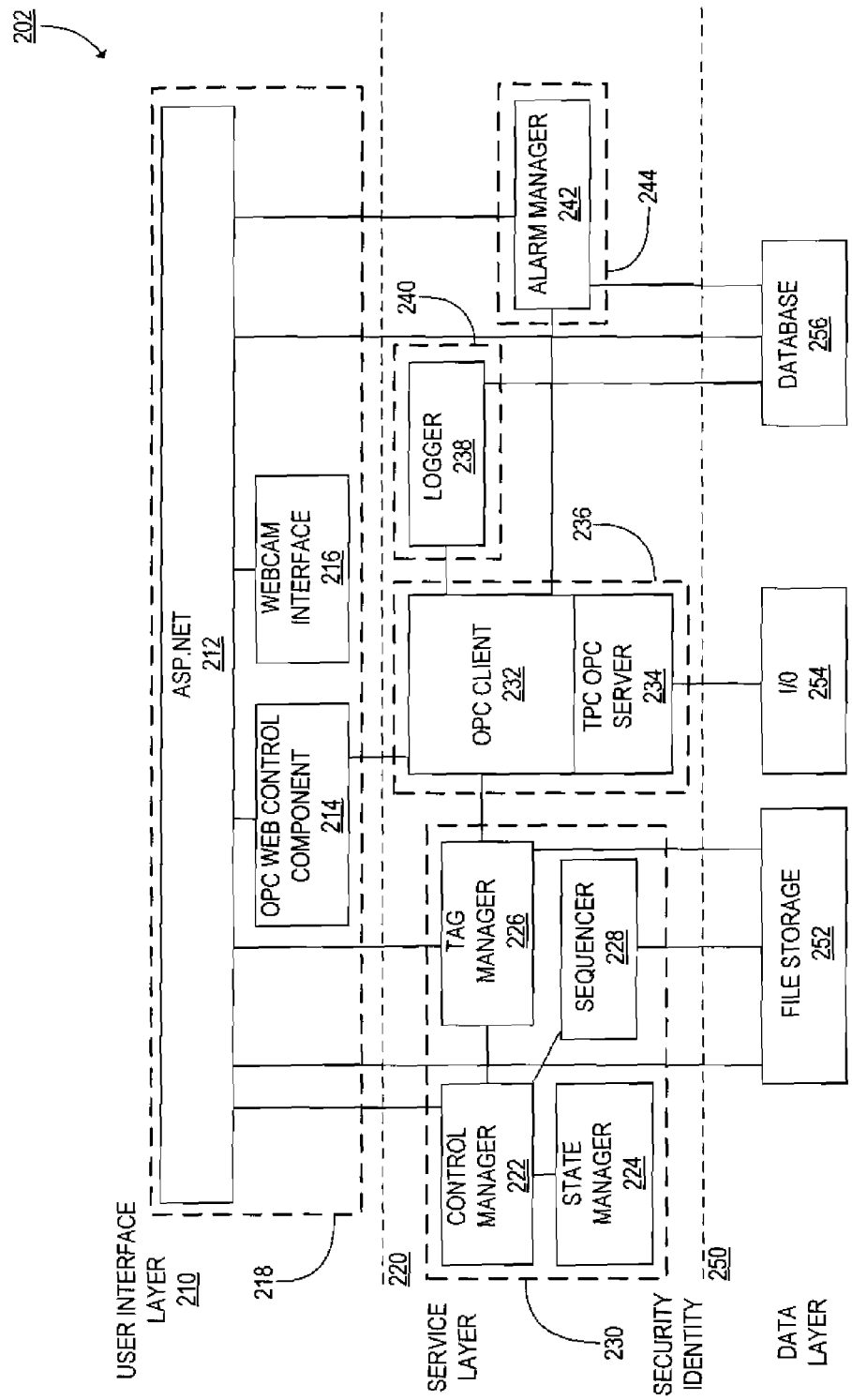
FIG. 5 illustrates a block diagram of various software entities, modules, and other similar elements, including call flows and security identities according to one embodiment of the present system.

Software implementing functionality at server 105 (see FIG. 2) in one embodiment is shown in a block diagram in FIG. 5. In this embodiment, a memory 125 (see FIG. 3) is encoded with programming instructions executable by a processor 120 (again, see FIG. 3) to implement software system 202, which includes user interface layer 210, service layer 220, and data layer 250. User interface layer 210 manages user interactions with other parts of the software system 202, including communication of information captured by the system to one or more users. Service layer 220 manages the business logic and data flow in the system, while data layer 250 manages storage of captured data and configuration information for various system elements and in various repositories.

In this embodiment, user interface layer 210 includes ASP.NET client component 212, which provides a variety of user-interface resources as will be understood in the art. OPC web control component 214 provides human-machine interface (HMI) components to ASP.NET client 212 for AJAX-style presentation of data and capture of user control events. Webcam interface 216 accepts a stream of images from a camera 195 (see FIG. 2) and provides data to ASP.NET client 212 for display as needed. Each of the components in user interface layer 210 is associated with a common security identity 218 in its interaction with components in service layer 220 and data layer 250.

Service layer 220 comprises several elements that manage data flow and implement business logic in the system. Control manager 222 detects and executes logging events, starts and stops locally connected controllable entities, starts and manages the system configuration state, management of software licensing, and detection of alarm events for notifications (by e-mail, for example). Control manager 222 communicates with ASP.NET client 212, which interacts with the state manager 224, tag manager 226, and sequencer 228 to implement a state machine that controls operation of the server, maintains session states, and provides new states based on input and programmed transitions. Tag manager 226 maintains a repository of information about the tags that are available to manage devices through the underlying OPC client 232, and loads the relevant tag configuration information at system startup, including configuration and device data, data logging configuration, and alarm logging configuration. Meanwhile sequencer 228 manages automated testing of devices according to schedules and commands executed by the system.

These four components 222, 224, 226, and 228 share security identity 230 in their interaction with ASP.NET client 212, OPC client 232 and file storage 252. OPC client 232 accesses data via Modbus TCP OPC server 234 (or any other similar industry standard device protocol converted to OPC compliant format), which in this embodiment captures data from network 115 via I/O block 254. In this embodiment, OPC server 234 is published by Kepware (www.kepware.com), though any industry standards-compliant or other suitable OPC server may be used. OPC ("OLE for Process Control," a Distributed Common Object Model (DOOM) technology) client 232 and OPC server 234 share security identity 236 in their interaction with OPC web controls component 214, tag manager component 226, logger 238, and I/O subsystem 254.

Logger component 238 maintains data captured via OPC client 232 in database 256 using techniques that will occur to those skilled in the art. In some embodiments, logger component 238 also stores software events, queries issued, data pulley and capture events, and the like. Logger 238 has its own security identity 240 to authenticate and in some embodiments encrypt some or all of these interactions with OPC client 232 and database 256.

Similarly, alarm manager 242 monitors the stream(s) of data that flow through OPC client 232, checking them against limits defined by the system and/or users as discussed elsewhere herein. When such limits are exceeded, predetermined acts are taken, such as recording the event in database 256, raising alerts in the user interface via ASP.NET client 212, sending email or pages, or raising visible and/or audible alarms, to name just a few possibilities. Alarm manager 242 also has its own security identity 244 to authenticate and secure its interactions, as appropriate, with OPC client 232, ASP.NET client 212, and database 256.

Data layer 250 in this embodiment comprises file storage element(s) 252, I/O controllers and devices 254, and database 256. File storage 252 comprises one or more elements as described above in relation to storage element 110 of FIG. 2, and provides read/write storage for various elements of the system, including ASP.NET client 212, tag manager 226 and sequencer 228. As will be understood by those skilled in the art, file storage 252 can be monolithic or distributed, homogeneous or heterogeneous, or have parts of each type as needed or desired for a particular system.

Input/output block 254 provides the interface between server 105 and network 115, so that data streams can be captured and devices on network 115 can be controlled, and data can be shared with web-based terminals and enterprise-level servers. In various embodiments, I/O interface 254 comprises one or more network interface cards (NICs); Modbus interface hardware; other standard, custom, or proprietary data interfaces, or some combination thereof.

Database block 256 conceptually represents one or more databases, which could take on any of many forms that will occur to those skilled in the art. As some examples, database 256 may comprise one or more logical databases, may be monolithic or distributed, may be housed in volatile memory, nonvolatile hard drives, or optical media, and may be of the relational, object-relational, flat, hierarchical, network, object-oriented, semistructured, associative, entity-attribute-value, or context models, to name several examples. In fact, database 256 in some embodiments is hosted on server 105 and stored in storage 110 (see FIG. 2), though in other embodiments the host and/or storage is located elsewhere, or in a combination of local and remote locations.

In various embodiments, the "security identities" described herein provide distinct entities for control and monitoring of data access. For example, these identities in some embodiments are used to limit data available to software entities bearing particular identities, authenticate transfers of data between software entities, and/or provide public-key encryption keys for encrypted transfer of data between entities. Other applications of security identities in the context of this description will occur to those skilled in the art.

Figure 6:
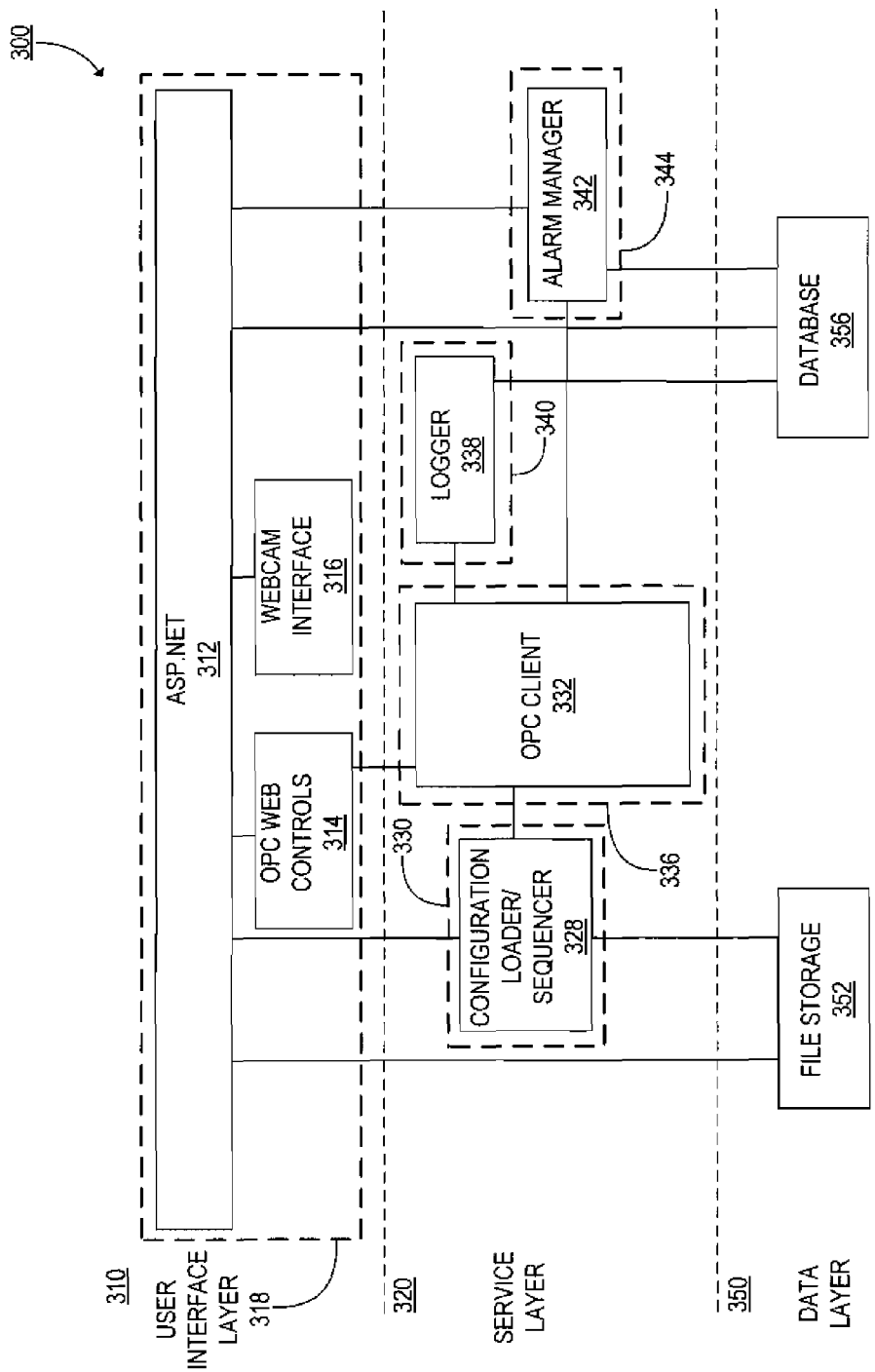
FIG. 6 shows a block diagram of enterprise-wide server software system entities modules, and other similar elements, including call flows and security identities according to one embodiment of the present system.

Turning to FIG. 6, system 300 comprises user interface layer 310, service layer 320, and data layer 350. In many respects, implementations described in relation to software system 202 may also be applied to software system 300, though in some embodiments it is particularly adapted to operate as a meta-server in the system configuration shown in FIG. 4. In this embodiment, user interface layer 310 includes ASP.NET client 312 for presentation of information to users and capture of user input, and OPC web controls 314 for providing an interface between the data provided through OPC client 332 and the presentation layer of ASP.NET client 312. Webcam interface 316 collects and processes data from one or more cameras 195 (see FIG. 2) for presentation through ASP.NET client 312. The three components of user interface layer 310 share security identity 318 in their interaction with other components of software system 300.

Service layer 320 comprises configuration loader/sequencer 328, OPC client 332, logger 338, and alarm manager 342. Logger 338 and alarm manager 342 operate similarly to the corresponding elements 238 and 242, respectively, of FIG. 5, though they have access to and process data from multiple sites and systems 201. Because they have access to more complete sets of data, they can provide a more complete picture of the activities in system 200 including, for example, the effects of a regional power outage on a multi-site institution or the status and results of multi-site testing (organized through this system or otherwise). Alarm manager 342 can be configured to take one or more alarm actions based on data from any site 201 in system 200, or even based on data from multiple sites that is captured substantially simultaneously or over time.

OPC client 332 connects to servers 105 in systems 100 at each site system 201 to collect data from those systems. Configuration loader/sequencer 328 manages electronic files in file storage 352. Configuration loader/sequencer 328, in one example, loads from storage 352 a file that describes the hierarchy of devices in network 200, including generators, interfaces, cameras, sensors, ATSs, terminals, servers, and the like as organized into locations, areas, and regions. The file preferably has a human-readable, structured format (such as XML or a variant thereof) for ease in creating, reading, and processing such files. Configuration loader/sequencer 328 also reads from file storage 352 a file that outlines one or more tests that are to be run on the system, as is discussed in more detail herein.

In the embodiment of system 300 illustrated in FIG. 6, each of the components of service layer 320 (configuration loader/sequencer 328, OPC client 332, logger 338, and alarm manager 342) has its own security identity 330, 336, 340, and 344, respectively, for secure interactions with user interface layer 310 through its security identity 318. This approach has the advantage of fairly granular control over (and logging of) access to data by the components of service layer 320. In alternative embodiments, a common security identity for those components makes authentication and local inter-process communication more simple, while making granular access control more challenging.

Data layer 350 includes file storage 352 and database 356 for storing and providing access to configuration and data in system 300. Each of these components may have one or more subcomponents as discussed above in relation to file storage 252 and database 256. In various embodiments file storage 252 and 352 use the same hardware and storage strategy, while in other embodiments the storage approaches are different. Likewise, database 256 and database 356 may have the same or different characteristics, hardware, software, and topology.

Figure 7:
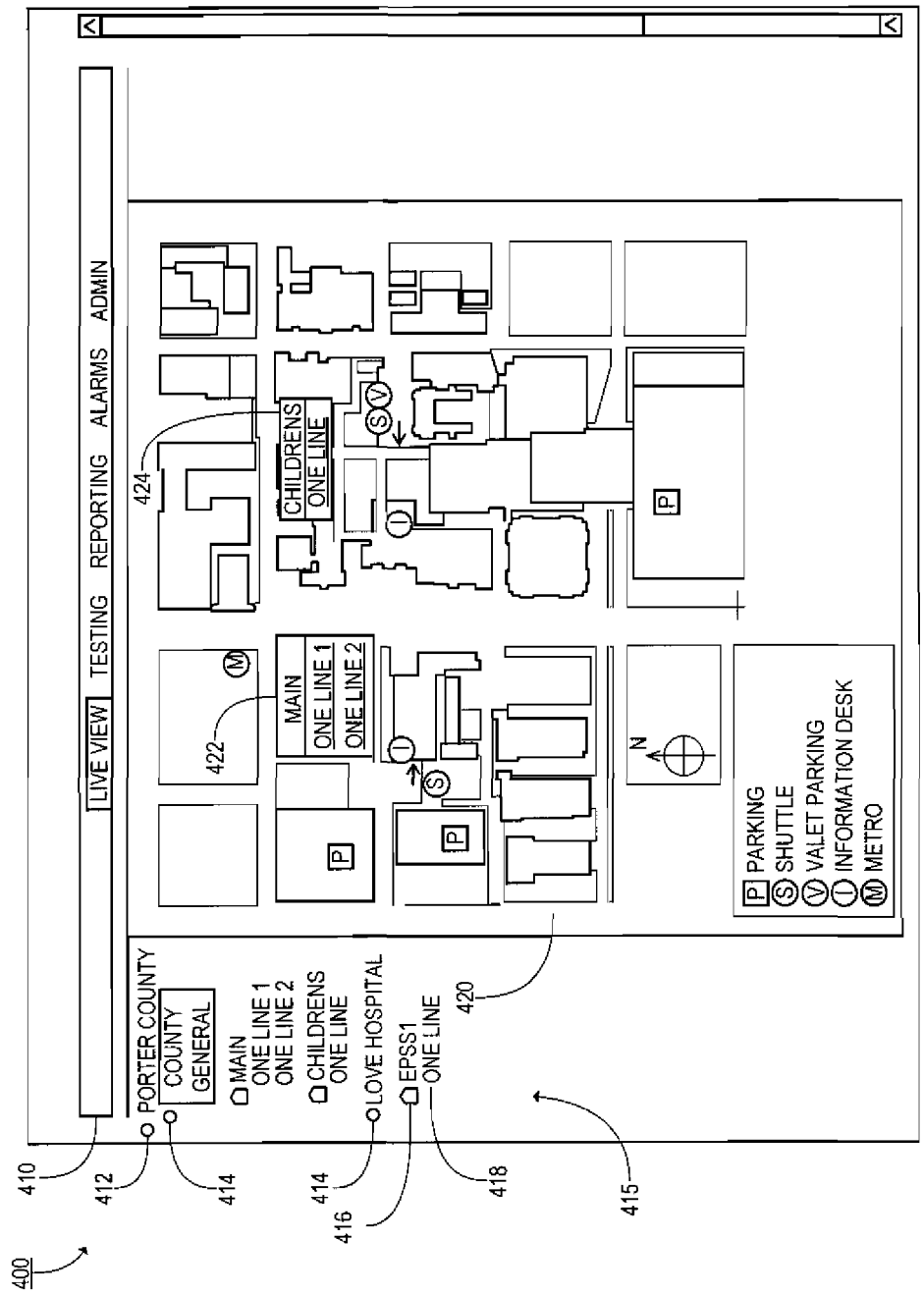
FIG. 7 is a terminal display showing one embodiment of an interactive map view for viewing multiple EPSS's at a given facility.

In normal operation, servers 105 and 210 (see FIGS. 2 and 4, respectively) provide access via data networks 115 and 215, respectively, to a browser-based interface. As described herein, server 105 provides access to data from a particular physical site, while server 210 provides access to data from multiple sites. In either case, the present embodiment uses a tab-like bar 410 (as shown in FIG. 7) to provide access to users to sections of the interface such as a "Live View" of the system; "Testing" configuration, status, and resources; "Reporting" of stored data "Alarms" configuration and history; and "Administration" ("Admin") of the system.

Referring to FIG. 7, in a "Live View," all or part of a hierarchy 415 organizes generator resources. In this embodiment, a region 412 has one or more areas 414, and each area 414 has one or more locations 416, which in turn are each associated with one or more entities 418. At each level in hierarchy 415, the interface provides a background image with customizable indicators that show the positions of elements in the next level.

In various embodiments, the background image is a map (political, topographical, or other kind), a schematic, a one-line drawing, or another image uploaded by an administrator or user. Using configuration file(s) or an administrative interface, one is able to select a background image for each level and/or item in hierarchy 415, and to place on each image selected overlay text, icons, or other images that indicate the relative position of resources on the next lower level in the hierarchy within the displayed branch or element. In some levels of the display in some embodiments, the graphic and/or text that is displayed to indicate the position of the lower-level branch or element is adapted in color, shape, or content to show the status of that item. For example, text, dots, or borders around text or icons might be green when the unit is operating normally, yellow if alarms have been triggered, red if utility power is not available, and blue if a test is running at a given site or on a given device. Of course, other color schemes, icons, or indicators for use in this system will occur to those skilled in the art.

In various embodiments, background image 420 is established by a system designer, uploaded by an administrator, selected by a user, or otherwise exists on server 105/210. A user or system designer places indicators 422 and 424 on background image 420 to illustrate the approximate position of those items on the image (such as location on a map, or circuit-wise position in a schematic diagram). In some embodiments, users can move indicators 422 and 424 by dragging and dropping them into different positions on background image 420. In some embodiments, items below indicators 422 and 424 appear as part of the indicator itself (here, "One-Line 1" and "One-Line 2" appear as part of indicator 422 because they are entity-level items in the hierarchy at the "Main" location). In some embodiments users are presented with the option of changing the font, size, and color of indicator text, and in others users are provided the facility to choose what aspects of status or criteria are indicated by one or more available indication techniques as described above.

In some embodiments, some view levels show live operational data, such as frequency, voltage, uptime, and the like, as part of indicators 422 and 424. The system in this illustrated embodiment maintains a database of common makes and models of equipment and sensors so that when a system is being set up or new equipment is added to the existing system, a system architect can easily add all relevant information for each device by selecting a device model, assigning a text label to the new device, placing it in the hierarchy, and selecting operational parameters and the display mode for real-time data. The database of devices automatically provides the device-specific tags that can be used in a query to retrieve particular parameters (when a pull-type model is used) or to parse messages when a push-model is implemented. The database in this embodiment also provides standard limits for at least some of the device's operational parameters so that users can simply switch alarms "on" and have rational limits instantly in place. Of course, when a device in a system is not in the database, a system architect, administrator, or operator can add the relevant information concerning its available tags and standard operating conditions (or even just those tags and/or data points to be used) to integrate the new device type into the system.

Figure 8:
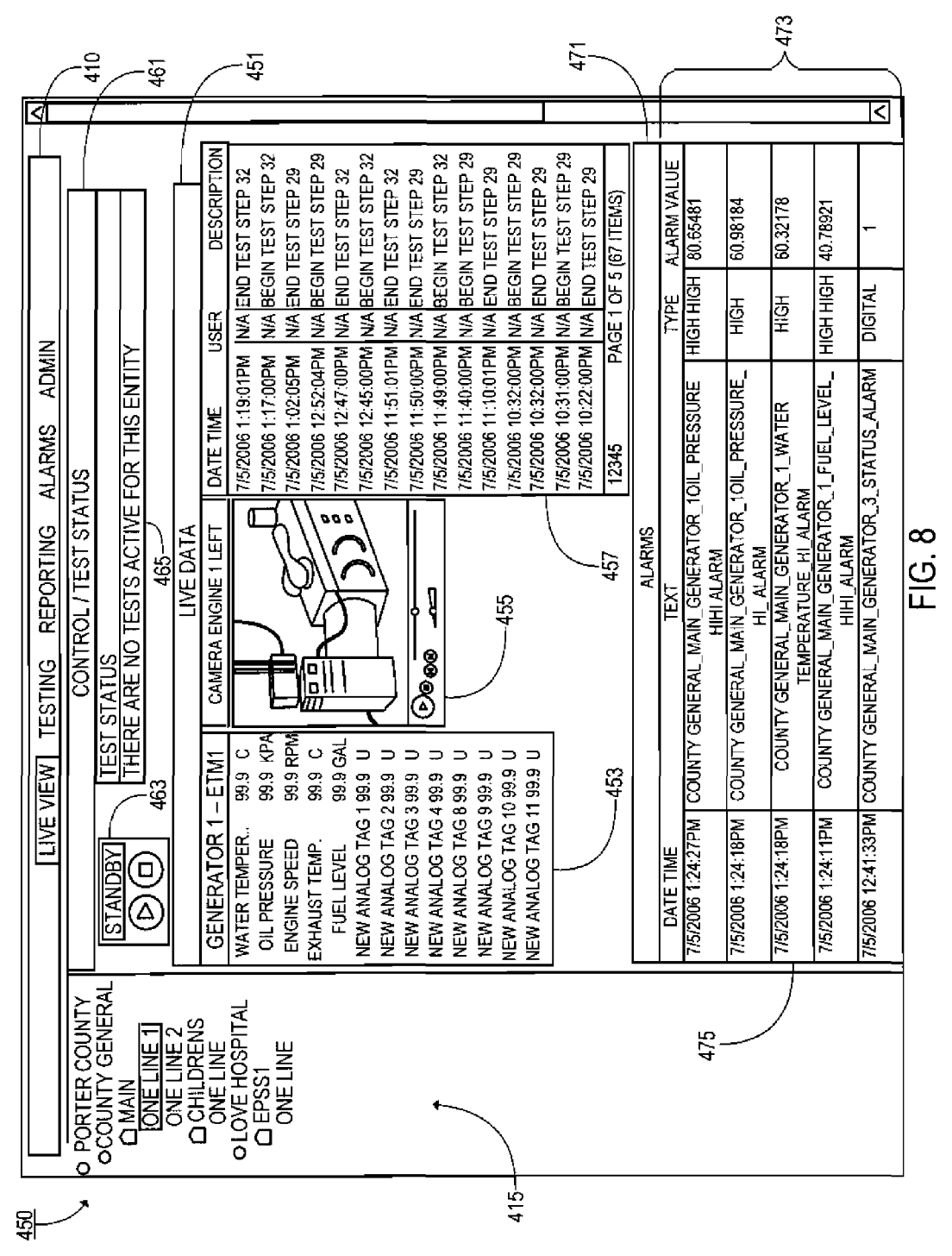

FIG. 8 illustrates an entity-level display according to one embodiment. Display 450 includes tab-bar 410 and hierarchy display 415, but the bulk of display 450 is taken up with information specific to a particular entity. Live data section 451 shows the current status and recent event history for the items selected in hierarchical display 415. Current data for the selected device is shown in current data display region 453, images of the selected device (individual captured images or a live video feed) are shown in image display region 455, and an event history for the selected device is shown in event display region 457.

The parameters shown in current data display region 453 may be selected from available data tags for the selected device based on the device tag database described herein by an administrator or user, depending on the needs and preferences of the system designer. Likewise, in some embodiments, the events shown in event display region 457 may include all events generated for the selected device, may include only a particular type of event (such as testing events, startup and shutdown events, and the like), and/or may be filtered by severity or recency of the event, as will be understood by those skilled in the art. In other embodiments, no filtering is available.

In the center of display 450 is image display region 455, which is adapted to display for users one or more images of the generator 165 and/or ATS 160 at that site as captured by one or more cameras 195. In various embodiments this image display region 455 shows still images, time-lapse photography, and/or video (real-time or for selected periods). Any or all of these regions 453, 455, 457, in various embodiments, include navigation and interface manipulation features for paging, moving, resisting, filtering, layering, and the like as will also occur to those skilled in the art.

Control/test status display region 461 of the present embodiment displays whether the device is operating or not in display widget 463, as well as whether any tests are active for the entity in the test status display region 465. Alarms relating to the displayed entity are shown in alarm display region 471. This region 471 includes a table 473 of alarm events that shows, for each alarm event, zero or more rows 475, each with the date and time of an alarm event, a text description of the alarm, a type or level of the alarm, and the tag value that triggered the alarm. Other columns in the table may show other information in addition to or instead of this collection of information as will occur to those skilled in the art. Further, alarm display region 471 and/or alarm data table 473 in various embodiments also includes facilities to sort and filter alarm information based on user preference or administrator selection.

A feature of some embodiments of the present system is a facility that enables users to script tests for one or more entities in the system, to schedule or manually initiate those tests, to monitor the tests in progress, and to review the results of the tests. In some embodiments, each test is a sequence of digital assertions to be made to a control device that controls an entity in the power system, paired with an applicable status query that is made to the same control device for verification that the assertion was properly received and is being processed. The system collects parameters identified in the test script for reporting as well as real-time display while the test is in progress. The system provides user interface components that enable users to monitor a test in progress, pause the test, resume the test, or abort the test as necessary or desired based on the data being collected or other factors.

Figure 9:
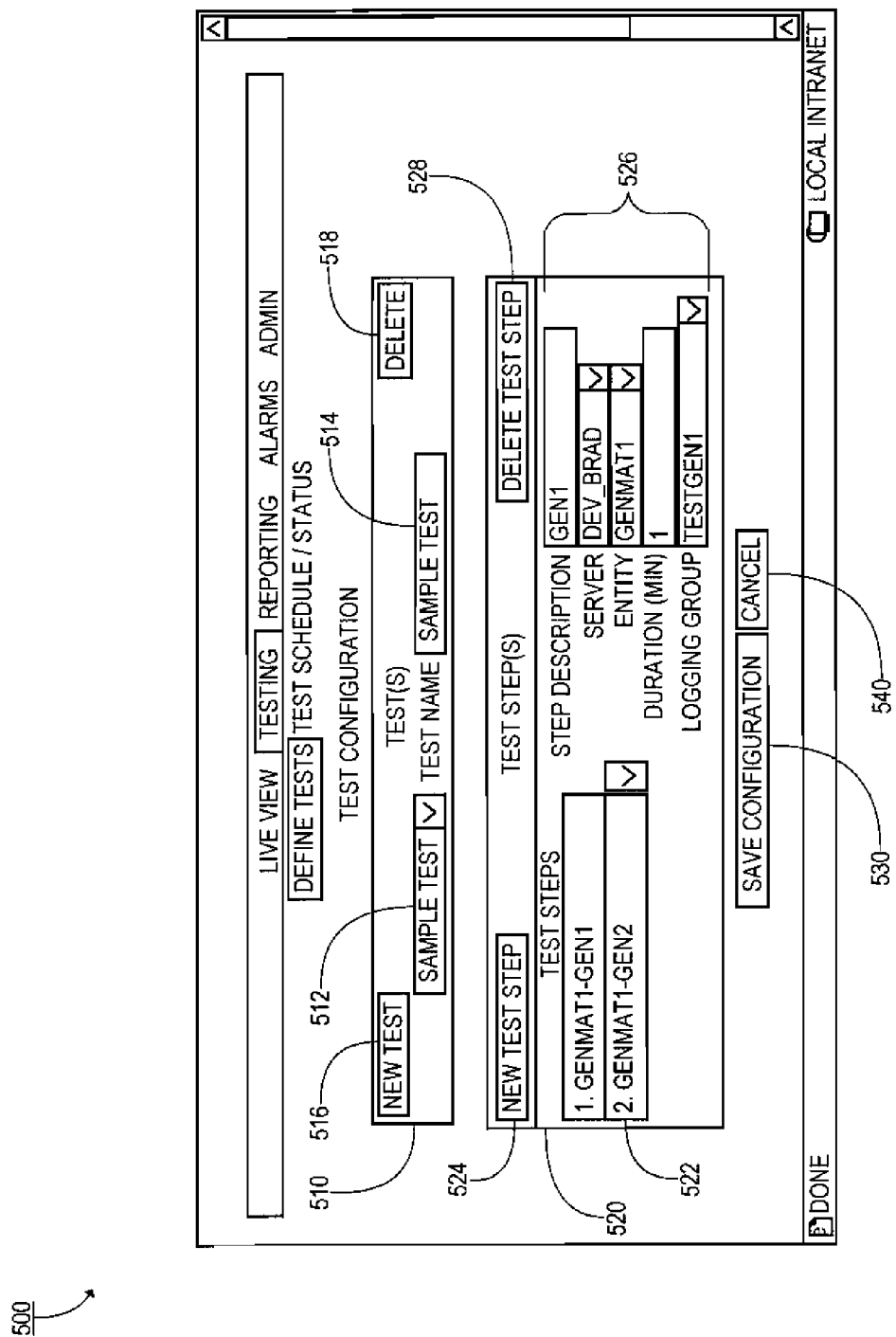
FIG. 9 is a terminal display depicting one embodiment of a test scripting interface for testing EPSS equipment at a given facility.

FIG. 9 illustrates test setup/scripting interface 500, which includes test naming and selection region 510, test sequencing region 520, and Save and Cancel buttons 530 and 540, respectively. Test naming and selection block 510 includes a drop-down list 512 which is populated with named tests that have been created in the system. Users select existing tests with drop-down list 512, change the name of an existing test using test box 514, create a new test with button 516, an delete an existing test using delete button 518.

Tests are scripted using test scripting interface 520. When a new test is created using New Test button 516, the Test Steps list box 522 is emptied to make a place for display of the scripting steps. The user activates New Test Step button 524 to create a new step in the script, which the user then configures using interface elements 526. Interface elements 526 in this embodiment allow a user to specify a description for the test step, the site server that will execute the step, the entity on which the step is executed, the duration of the step, and the logging group (see further discussion below) that should apply to data captured during the test step. Either when the test is scripted or when it is executed, tag manager 226 (see FIG. 5) is consulted to determine which tag should be asserted to initiate the test. If a user wishes to delete a step, the user selects the step in list box 522, then clicks Delete Test Step button 528. The step is then removed from the internal representation of the test, and the step's entry in Test Steps list box 522 is removed.

When the test is scripted as the user desires, he or she activates Save Configuration button 530, and the test configuration is committed to non-volatile memory. Typically tests will be stored at enterprise server 210 so that test steps for devices at multiple sites can be coordinated. In alternative embodiments, tests or test steps are stored at one or more site servers 105. In either event, operational data about electrical generators 165 and other equipment in subsystems 100 are collected and reported by site servers 105 to enterprise servers 210 for presentation to users, storage in the historical record, and as a factual resource for reporting.

Figure 10:
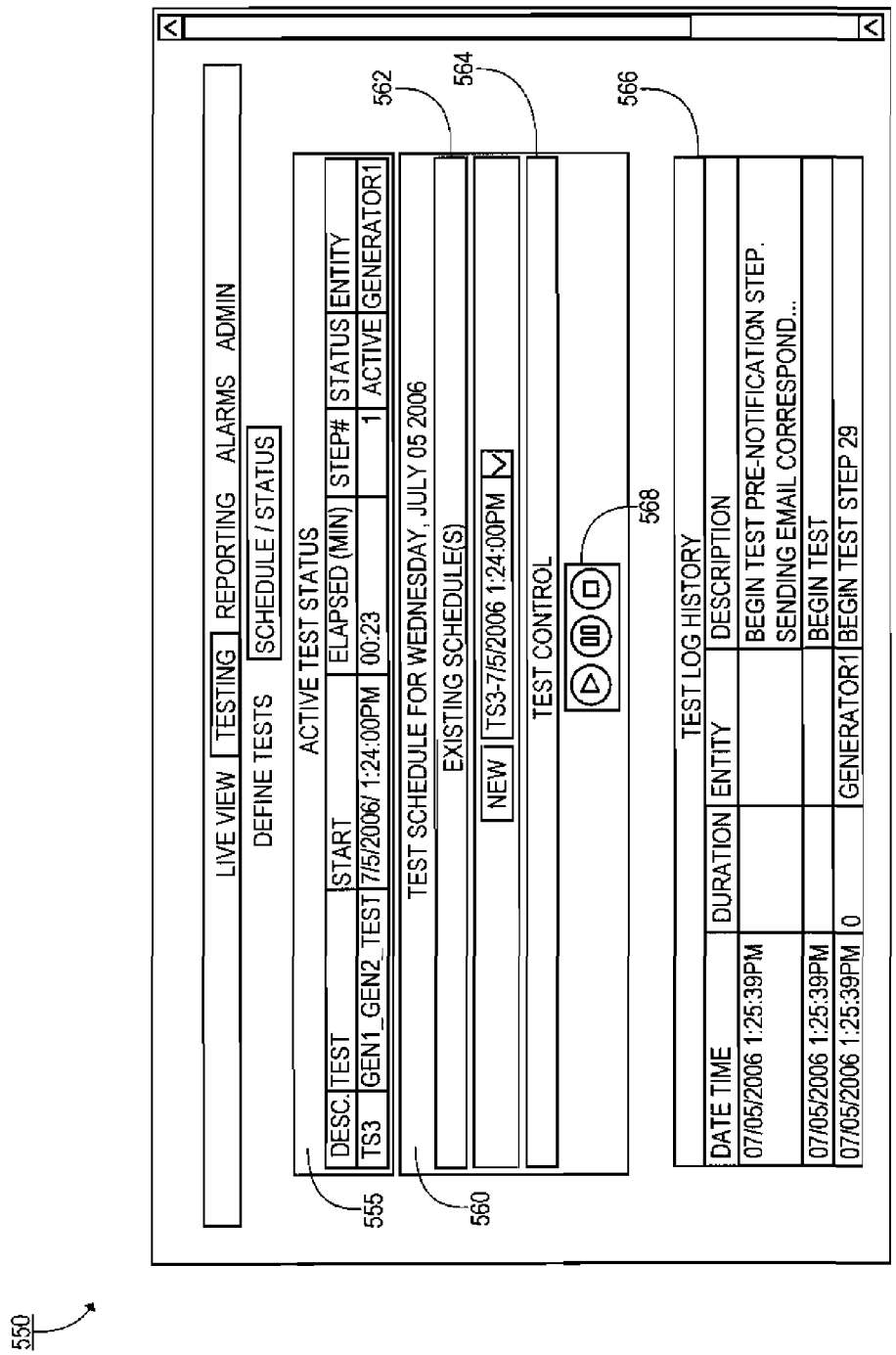
FIG. 10 illustrates a sample terminal display of one embodiment of a test scheduling and status interface for testing EPSS equipment at a given facility.

FIG. 10 illustrates test schedule/status interface 550, which includes active test status display region 555 and test schedule display region 560. Active test status display region 555 shows a list of test scripts currently active, including an identifier for the test, a brief description of the test, the date and time at which the test was started, the elapsed time since the test started, the step number within the script that is currently being processed, the execution status of the test (active, paused, aborted, completed, and the like), the entity being tested, and other information additional to or instead of this information as will occur to those skilled in the art. Test schedule display region 560 in this embodiment includes a selector for existing test schedules in existing schedule display element 562, test control widgets 568 in test control display region 564, and a history of tests conducted under the selected schedule in test history region 566. In other embodiments, the display of existing schedules, control facilities for starting, pausing, resuming, and stopping tests, test status displays and histories are separated and/or combined on multiple interface screens, or have alternative display configurations as will occur to those skilled in the art.

Figure 11:
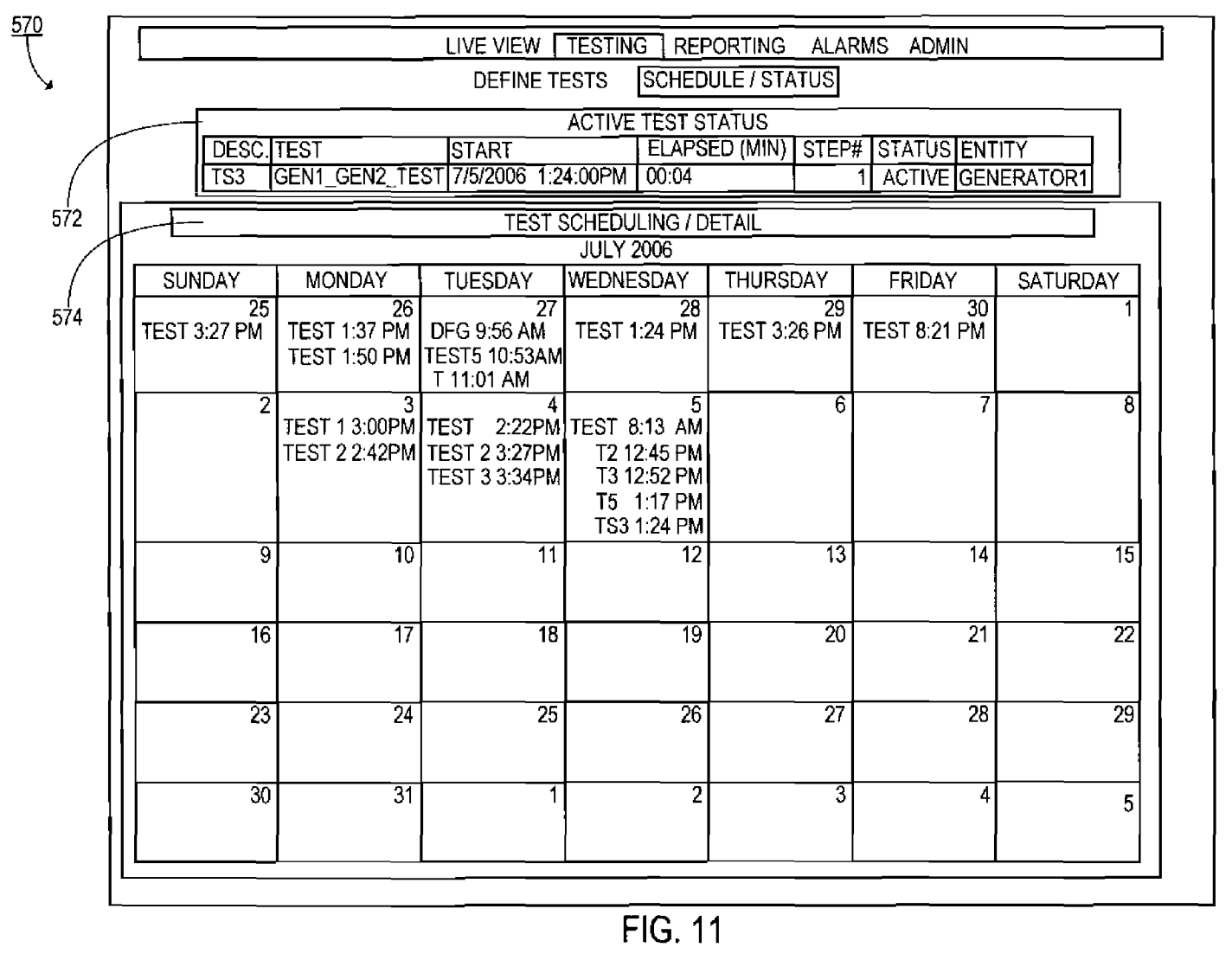

One such possible alternative display is shown in FIG. 11. Test schedule calendar display 570 includes active test status list 572, which is analogous to active test status display region 555 in FIG. 10. In addition, calendar display 570 includes test scheduling calendar 574 that shows test names and times in a calendar view for easy evaluation and navigation by users. Weekly and annual calendars may also be displayed as will occur to those skilled in the art. When a test script has been defined (see, for example, the discussion relating to FIG. 9), it can be added to test scheduling calendar 574 using a context menu, pop-up dialog, or the like.

Figure 12:
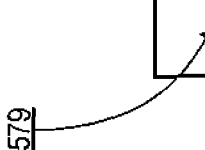
FIG. 12 illustrates one embodiment of a test report for a test of EPSS equipment at a given facility.

FIG. 12 shows an example test report for an exemplary test in this embodiment. Test report 579 includes a title, an identification of the entity or entities tested, the date and time at which the test was initiated, and data captured during the test. The parameters being captured, as discussed above, may be selected by the test designer or administrator from measurable parameters for that entity (which the system knows based on the entity database described herein). Sample frequencies for captured data in this embodiment are determined when the test is designed, though in some embodiments the sampling frequency and timing are also adjustable on-the-fly, and may vary over time as will occur to those skilled in the art.

Because the data captured (both during normal operation and during testing) is stored in a standard database in this embodiment, report design software may be used to create reports for the system without much difficulty. For example, CRYSTAL REPORTS, published by Business Objects, 3330 Orchard Parkway, San Jose, Calif. 95134, USA, may be used to generate desired human-readable or machine-readable reports as will be understood by those skilled in the art. Alternatively, Microsoft Report Builder may be used to construct reports using these data resources as desired or needed. Report configurations and/or outputs may be stored on a site server 105 or enterprise server 210, or both, or elsewhere as will occur to those skilled in the art.

Figure 13:
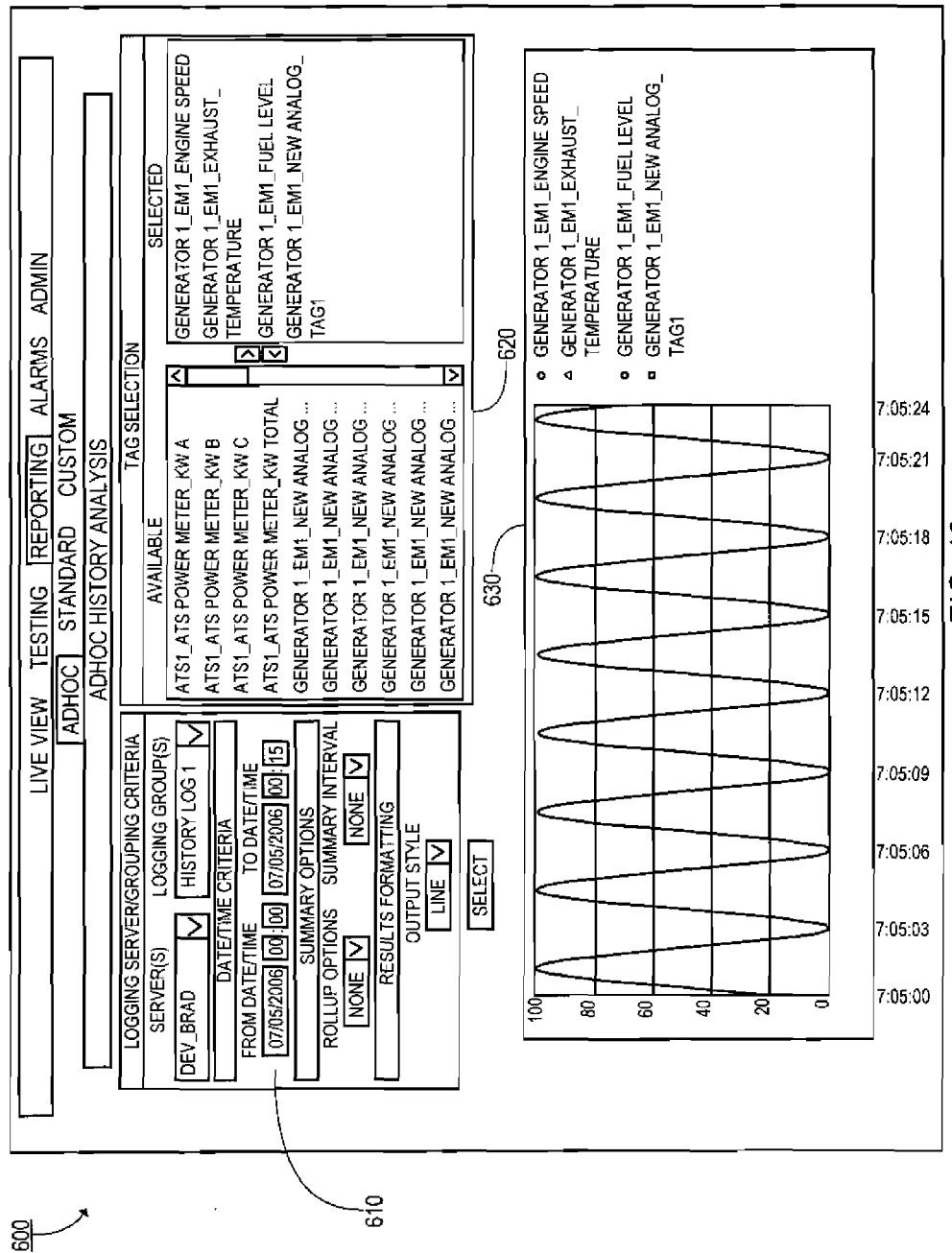
FIG. 13 is a sample terminal display showing a statistical analysis of EPSS operational data at a given facility according to one embodiment of the present system.

An example reporting/history interface is shown in display 600 in FIG. 13. Display 600 includes display criteria selectors in parameter selection display region 610. In this embodiment, users select the server(s) and logging group(s) to be accessed for data that will be displayed, dates and times defining the range of interest, roll-up and summary options, and output styles and forms for the report or graph. Available tags are listed in and may be selected using tag selection display region 620, and the system provides output with the selected parameters in output display region 630. Many alternative parameter selection techniques and output techniques are used in various embodiments as will occur to those skilled in the art.

Figure 14:
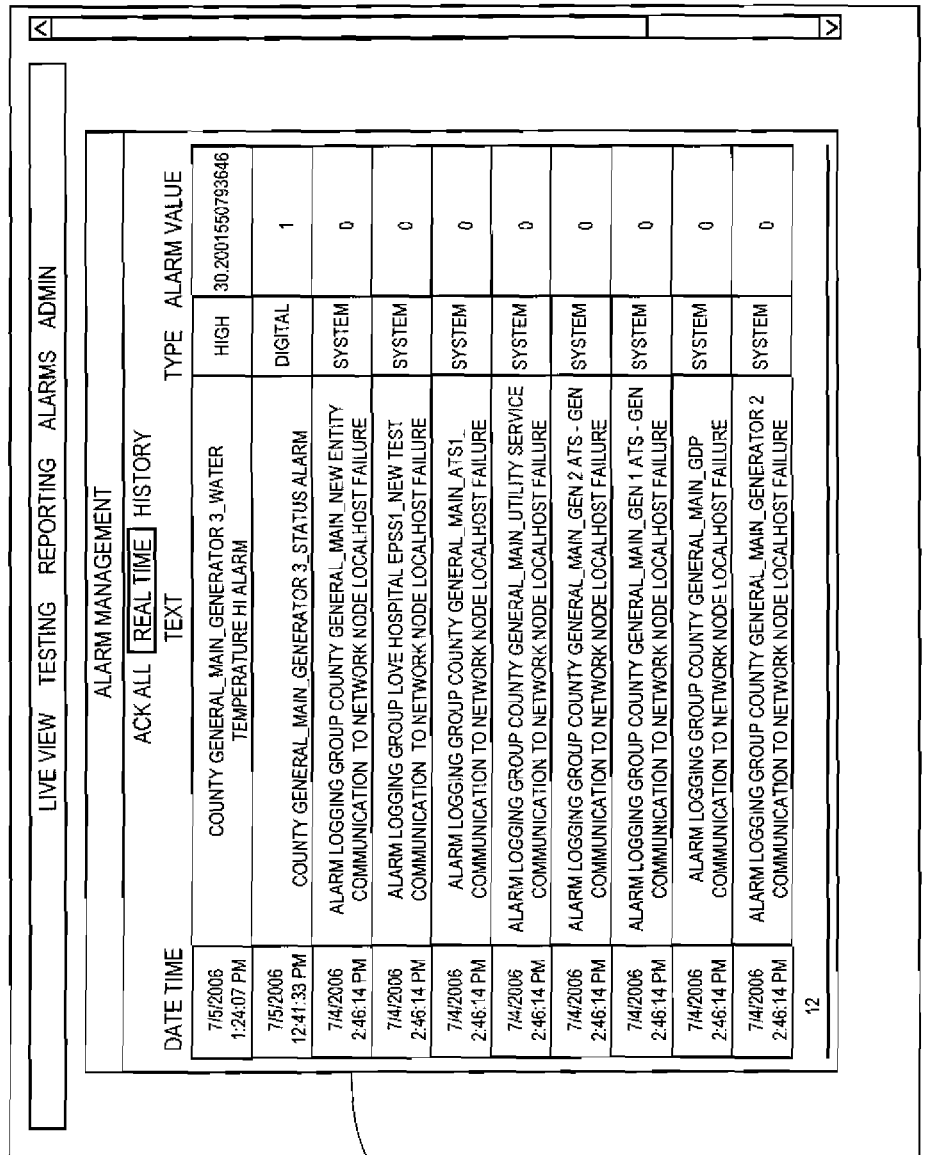
FIG. 14 is a sample terminal display showing alarm management functionalities according to one embodiment of the present system.

Alarm management interface 650 is shown in FIG. 14. This interface 650 is updated in real time using AJAX or other display/interface techniques that will occur to those skilled in the art. The alarm interface 650 in this embodiment shows the dates and times of recent alarms, text associated with the alarms, the tags and limits that triggered the alarms, as well as the alarm types and the tag values when the alarms were triggered. This data is displayed in table 655, which in some embodiments the user can manipulate to sort and filter as desired. FIG. 15 shows a display 660 of historical alarms. Display 660 includes selection display region 662 and data/navigation display region 665, though other arrangements and interface techniques will occur to those skilled in the art.

Figure 16:
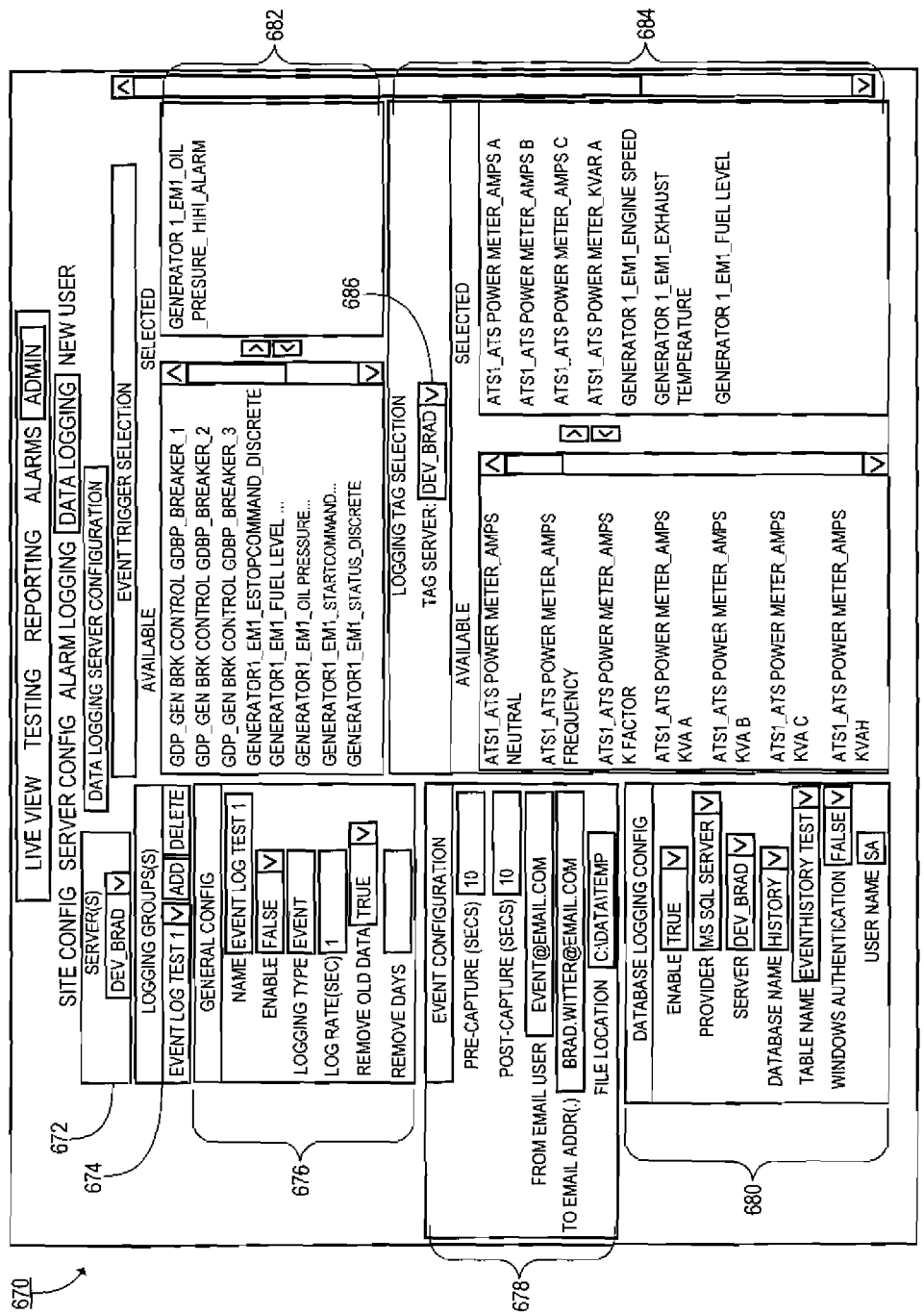
FIG. 16 illustrates a sample terminal display of a logging group configuration interface according to an embodiment of the present system.

FIG. 16 illustrates a data logging configuration interface 670 in this fifth embodiment. A server in the system is selected in server selection region 672, and a "logging group" is selected or created in logging group selection region 674. The logging group is named and enabled in general configuration region 676, which also can be used to determine the logging type, set the sample rate, and select whether to automatically remove data beyond a certain age.

For event-type logging groups, the window of time in which data is captured and saved before and after the event, as well as the parameters for reporting the event are selected in event configuration display region 678. The example display 670 shows parameters for reporting in an email and/or saving in a data file when the event is triggered, though other reporting techniques may easily be used without undue experimentation by those skilled in the art.

Database logging for the logging group is configured in database logging display region 680. In this interface section the user can enable or disable database logging, provide the connector provider, server, database and table names, and other configuration information for establishment of database connections, and enter other parameters as will occur to those skilled in the art.

Event triggers for the logging group are selected using event trigger display region 682, which provides a list of available event triggers and a facility for the user to select one or more of them to trigger events for the logging group. Likewise, tags to be included in the log (event, database, or otherwise) for the logging group are selected in logging tag selection region 684. The user can select a different server from which tags to be selected with selection widget 686, though other selection techniques may be used as will occur to those skilled in the art. When the parameters for the logging group have been set or modified as desired, a "Submit" or "Commit" button (not shown) may be activated, and the updated configuration is stored in the system.

In alternative embodiments, different software architectures may be used, such as different layering delineations, object encapsulations, and security identity groupings. In some alternatives, processes shown in this disclosure as a single software system (such as FIG. 5 or FIG. 6) are distributed among multiple processors in a homogeneous or heterogeneous distributed system.

Configuration of Embodiments of EPMS

Figure 17:
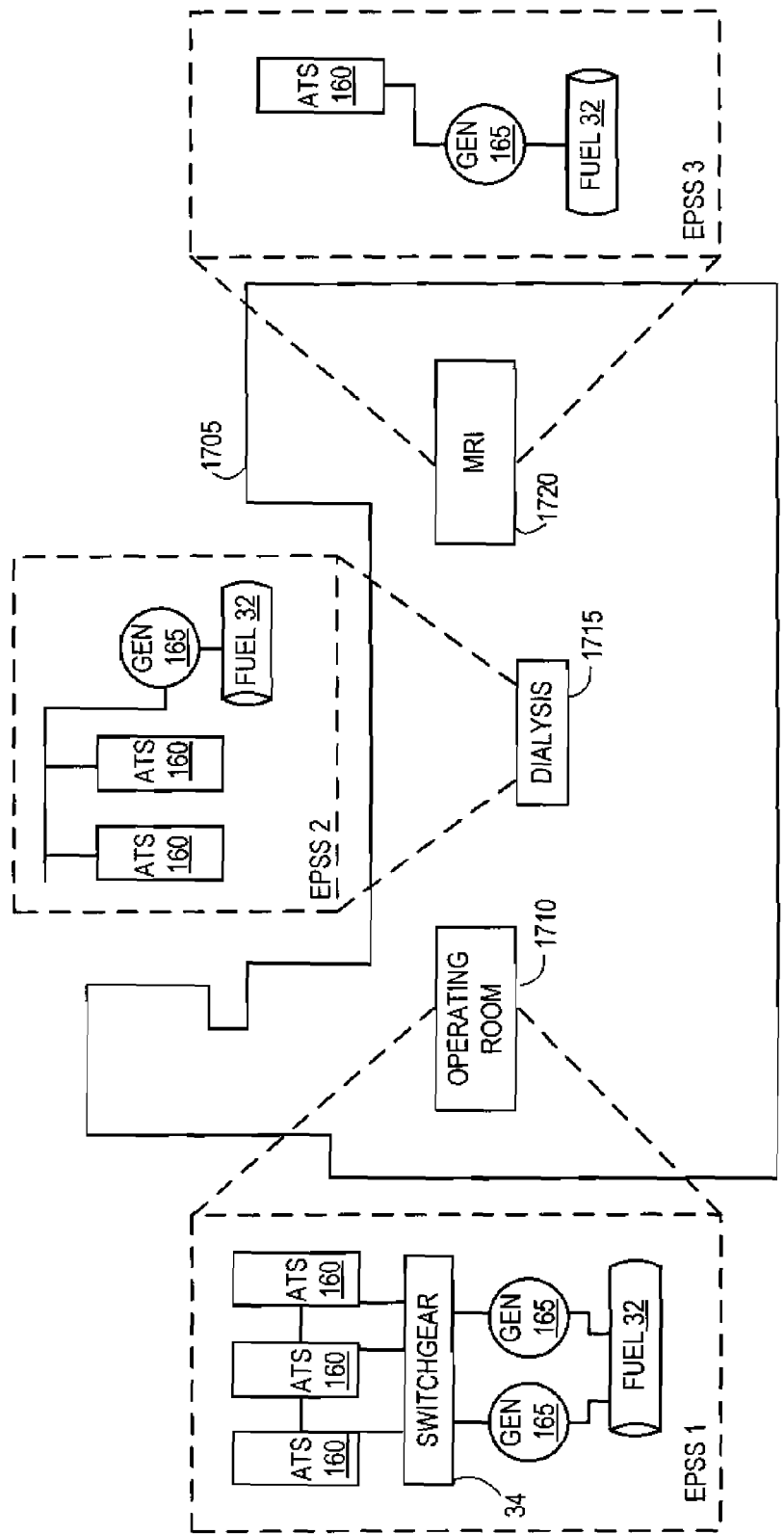
FIG. 17 is an overhead view of a sample facility including multiple EPSS's.

One aspect of the present system includes the efficient installation and configuration of an emergency power management system (EPMS) 10 at a facility. FIG. 17 shows an overhead view of an example facility including multiple emergency power supply systems (EPSS's). The facility shown in FIG. 17 is a hospital 1705. The hospital building 1705 includes three primary rooms—an operating room 1710, a dialysis center 1715, and an MRI room 1720. In the embodiment shown, each of the three rooms has a separate EPSS that supplies power to that room in the event of an emergency or loss of utility power. As shown, EPSS 1, which supplies power to the operating room 1710, includes three ATS's 160, switchgear 34, two generators 165, and a fuel supply 32. EPSS 2, which supplies power to the dialysis center 1715, includes two ATS's 160, one generator 165, and one fuel supply 32. EPSS 3, which supplies power to the MRI room 1720, includes only one ATS 160, one generator 165, and one fuel supply 32. As will be understood, these representations of various EPSS configurations are presented for illustrative purposes only, and various other configurations are possible. Additionally, although the hospital 1705 shown includes only one building with three separate EPSS's, it will be understood that many facilities will include several buildings with many EPSS's.

Figure 18:
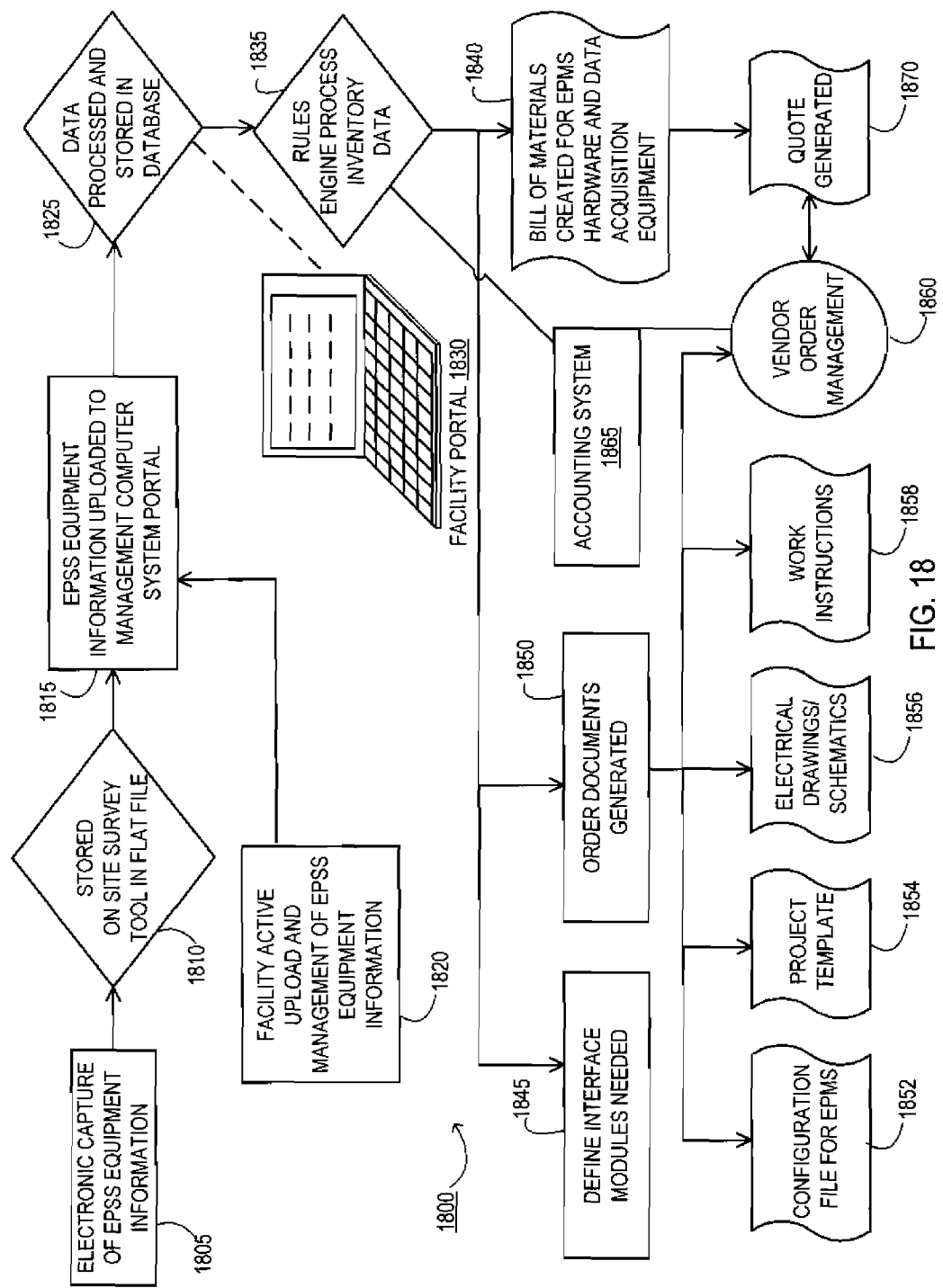
FIG. 18 illustrates a flow chart of one embodiment of the steps involved in system design automation for creating and installing an emergency power management system at a facility or site.

FIG. 18 illustrates one embodiment of the steps involved in the system design automation 1800 for creating and installing an EPMS 10 at a facility or site, such as the hospital 1705 shown in FIG. 17. Generally, system design automation 1800 involves collecting information related to EPSS equipment at a given facility, processing that information, and automatically generating via a management computer system 60 the required bill of materials, vendor orders, work orders, engineering schematics, and any other items needed to make operative an EPMS 10 at the facility. In the embodiment shown, at step 1805, a site survey is conducted to electronically capture information related to the items of EPSS equipment at the site. This information may be collected via a site survey tool, such as a laptop computer, personal digital assistant (PDA), tablet computer, or other similar capture mechanism. Additionally, as will be understood by one having ordinary skill in the art, the EPSS equipment information may also simply be written on paper, and subsequently entered into the management computer system 60 for further processing.

Figure 19A:
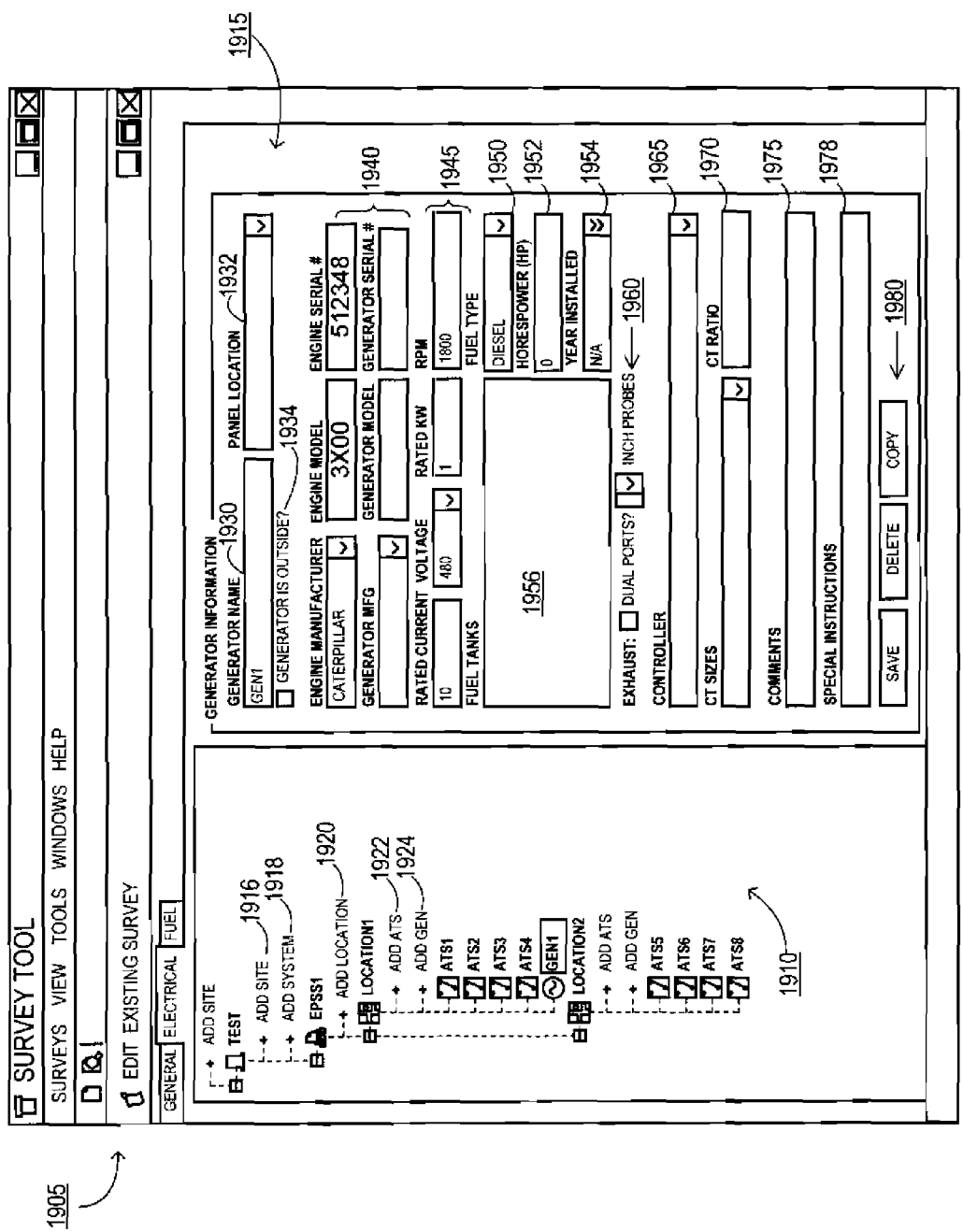
FIG. 19A shows a sample display of a site survey tool used for collecting generator information according to one embodiment of the present system.

FIG. 19A illustrates a sample display 1905 of a site survey tool used for collecting generator 165 information according to one embodiment of the present system. As shown, the site survey display 1905 includes three categorical tabs—a general tab 1910, an electrical tab 1912, and a fuel tab 1914. When the general tab 1910 is selected, general information relating to the specific site is entered, such as the name of the site, the site contact information, and other similar information. When the fuel tab 1914 is selected, information relating to a given fuel supply 32 or fuel supplies for the site's EPSS's is entered, such as a name for the fuel supply, which generators 165 are supplied by the fuel supply, and other similar information. In display 1905, the electrical tab 1912 is shown as selected, in which information relating to a site's generators 165 and ATS's 160 is entered.

Display 1905 shows a sample screen for entering generator 165 information for a given EPSS into a site survey tool. Located on the left side of the display 1905 is a hierarchy 1910 for listing and navigating through sites, locations, and specific items of EPSS equipment. As shown, a user may select to add a new site or system via the "Add Site" 1916 or "Add System" 1918 features, add a new location through the "Add Location" 1920 feature, or add new generators 165 and/or ATS's 160 via the "Add ATS" 1922 and "Add Gen" 1924 features. As shown in hierarchy 1910, "ATS1," "ATS2," "ATS3," and "ATS4" have already been entered into the system under "Location1," and "ATS5," "ATS6," "ATS7," and "ATS8" have been entered under "Location2." Currently, "Gen1" is highlighted in hierarchy 1910, which designates that the user has selected the "Add Gen" 1924 feature, and is adding a generator 165 entitled "Gen1" to the selected EPSS ("EPSS1").

Located on the right side of display 1905 is generator information entry region 1915. Within information entry region 1915 are several fields that may be either directly filled in by a user, or include drop-down menus from which specific items may be selected. As a user surveys the EPSS equipment at a given site, that information is entered into a site survey tool utilizing an interface such as display 1905, and that information is uploaded to the management computer system 60 for further processing. The embodiment of information entry region 1915 shown in FIG. 19A includes "Generator Name" region 1930, "Panel Location" region 1932, and "Generator Outside?" selection region 1934. As will be understood, a user may designate whatever name the user desires for each generator 165, ATS 160, etc. As shown, the generator name given to the particular generator at issue is "Gen1." Thus, all information entered into information entry region 1915 pertains to Gen1.

Further, the "Panel Location" region 1932 relates to the specific position where a control panel (if any) for the generator 165 will be mounted. For example, the generator 165 may be located outside of a building, but the user may wish to install the control panel inside of the building to protect it from inclement weather. Accordingly, the user would indicate this information in the "Panel Location" region 1932. Also, the "Generator Outside?" region 1934 is selected if the chosen generator 165 is physically located outside.

Generator information entry region 1915 further includes manufacturer information region 1940, in which the manufacturer, model, and serial number for the engine (mechanical power source) and electrical generator associated with a particular generator 165 are entered. This manufacturer, model, and serial number information is used later by the management computer system 60 to tailor the EPMS 10 for a facility to the specific equipment at the facility. In rated values region 1945, the rated current, voltage, kilowatts (power), and revolutions per minute (RPM) for the generator 165 are entered. As will be understood, the values entered into rated values region 1945 may be entered in any standard measurements, such as volts, amps, etc., depending on the desires of the user. The fuel type and horsepower for the particular generator 165 are also entered into "Fuel Type" region 1950 and "HorsePower (hp)" region 1952 respectively. "Year Installed" region 1954 denotes in what year the generator at issue was installed at the facility. The "Fuel Tanks" region 1956 generally includes a list of available fuel tanks or fuel supplies 32 capable of supplying fuel to the generator 165. In one embodiment, all fuel supplies 32 that are actually associated with the generator 165 are highlighted in the "Fuel Tanks" region 1956.

Further, "Exhaust" region 1960 enables a user to identify whether the particular generator 165 has dual ports, and if so, what size probes are required for measuring exhaust outputs from the generator. "Controller" region 1965 allows a user to designate a controller or control panel, if one exists (control panel discussed in greater detail below). As shown, CT region 1970 allows a user to input required sizes and ratios for current transformers (CTs) for the specific generator 165 that may be needed to operate the EPMS 10. Moreover, "Comments" region 1975 and "Special Instructions" region 1978 permit a user to enter any additional information pertaining to the item of EPSS equipment being surveyed that is not covered by the other fields in information entry region 1915. Also, buttons 1980 allow a user to save, delete, or copy the information recorded in information entry region 1915.

Figure 19B:
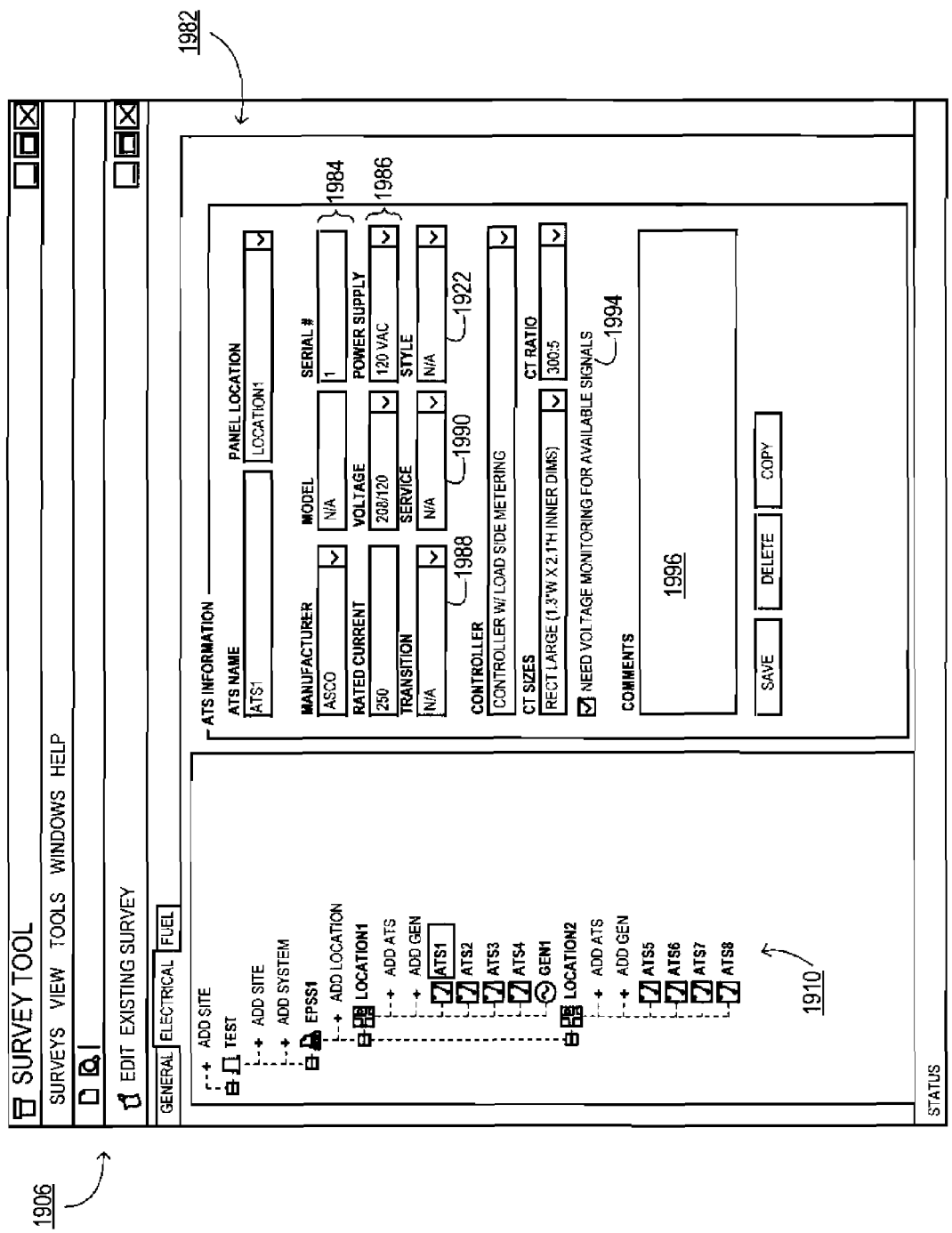
FIG. 19B illustrates a sample display of a site survey tool used for collecting ATS information according to one embodiment of the present system.

Turning to FIG. 19B, a display 1906 is shown of a sample site survey tool used for collecting ATS 160 information according to one embodiment of the present system. The display 1906 includes many of the same features and fields as are included in the generator display shown in FIG. 19A, although the fields are modified so as to capture ATS-related information. FIG. 19B includes the hierarchy 1910 and an ATS information entry region 1982. As shown, "ATS1" is highlighted in hierarchy 1910, and thus the information contained in information entry region 1982 pertains to "ATS1". As will be understood by one having ordinary skill in the art, within embodiments of the present disclosure, the information entered in the site survey tool may be edited and changed later if it is discovered that information was entered incorrectly, or if a particular piece of EPSS equipment is modified, or for any other reason.

Information entry region 1982 includes fields in which the name and panel location of an ATS 160 may be entered, similarly to a generator 165 as shown in FIG. 19A. Entry region 1982 also includes manufacturer information region 1984 for recording the manufacturer, model, and serial number of the ATS 160 at issue. The rated values (current, voltage, power supply, etc.) may also be entered into the information entry region 1982 via rated values region 1986. "Transition" region 1988, "Service" region 1990, and "Style" region 1992 are all fields in which specific attributes of the ATS 160 are entered for subsequent reporting purposes.

Additionally, ATS display 1906 includes entry fields for recording controller information and CT information as it relates to the particular ATS 160, similarly to the generator survey display 1905. Entry region 1982 further includes a check box 1994 for denoting whether voltage monitoring of the ATS is needed for available signals. Also, as is the case with generator entry region 1982, specific comments pertaining to the particular ATS 160 being surveyed may be entered into "Comments" region 1996.

As will be understood by one of ordinary skill in the art, the information collection fields and regions depicted in FIGS. 19A-B are presented for illustrative purposes only, and are not intended to limit the information collected pertaining to generators 165 and ATS's 160 for varying EPSS's. In some embodiments, more information may be required, whereas in other embodiments, less specific information will be needed to effectively configure an EPMS 10.

Referring again to FIG. 18, once all the EPSS equipment information has been entered into the site survey tool (step 1805), the information is stored on the site survey tool in a flat file or by other similar storage mechanism (step 1810), and then uploaded to the management computer system 60 via an interactive portal (step 1815). In some embodiments, rather than collecting EPSS information for a facility via a site survey tool, a facility employee may enter and upload EPSS equipment information for his or her facility directly to the management computer system portal (step 1820). Thus, a facility can actively manage and edit its EPSS equipment information without using a site surveyor and site survey tool. Regardless of how information is uploaded to the management computer system 60, the information is subsequently processed and stored in a database of facility information (step 1825). Depending on the embodiment, the database of facility information may include information pertaining only to a particular site or facility, or may include information relating to multiple sites and facilities.

In some embodiments of the present system, after the EPSS equipment information has been initially processed and stored in a database (step 1825), this information may be viewed by a user through a facility portal 1830. The user may be an employee or officer of the facility, and may wish simply to utilize the facility portal 1830 to keep track of EPSS equipment inventory and specifics related to the EPSS equipment at the facility. For example, a particular facility may have accumulated hundreds of items of EPSS equipment over a span of many years, and the employees of the facility in charge of maintaining the EPSS equipment may not have an accurate, comprehensive inventory list of all equipment at the facility. Or, a facility operator may simply wish to have an easily accessible electronic inventory of all EPSS equipment at the facility. In some cases, the facility operators may be totally unaware of certain items of EPSS equipment, and locations of that equipment, at the facility. Thus, a comprehensive inventory list of all EPSS equipment at a site or facility may be helpful.

Additionally, the ability to view all items of EPSS equipment at a facility via a facility portal 1830 enables the facility to perform "load control" during an emergency. For example, in a severe ice storm, hurricane, or other natural disaster, a facility may be operating on emergency power supplied by its EPSS's for an extended period of time. In these extreme circumstances, fuel consumption may need to be closely monitored and conserved, especially when new fuel shipments may be unavailable. Accordingly, by viewing all EPSS equipment through the facility portal 1830, and determining what facility rooms and equipment are powered by each item of EPSS equipment, the facility employees can make an informed decision to shut down certain, non-critical generators 165 to conserve fuel, and allow only the critical circuits to continue receiving emergency power. As will be understood, many other beneficial uses will follow from use of the facility portal 1830.

Figure 20:
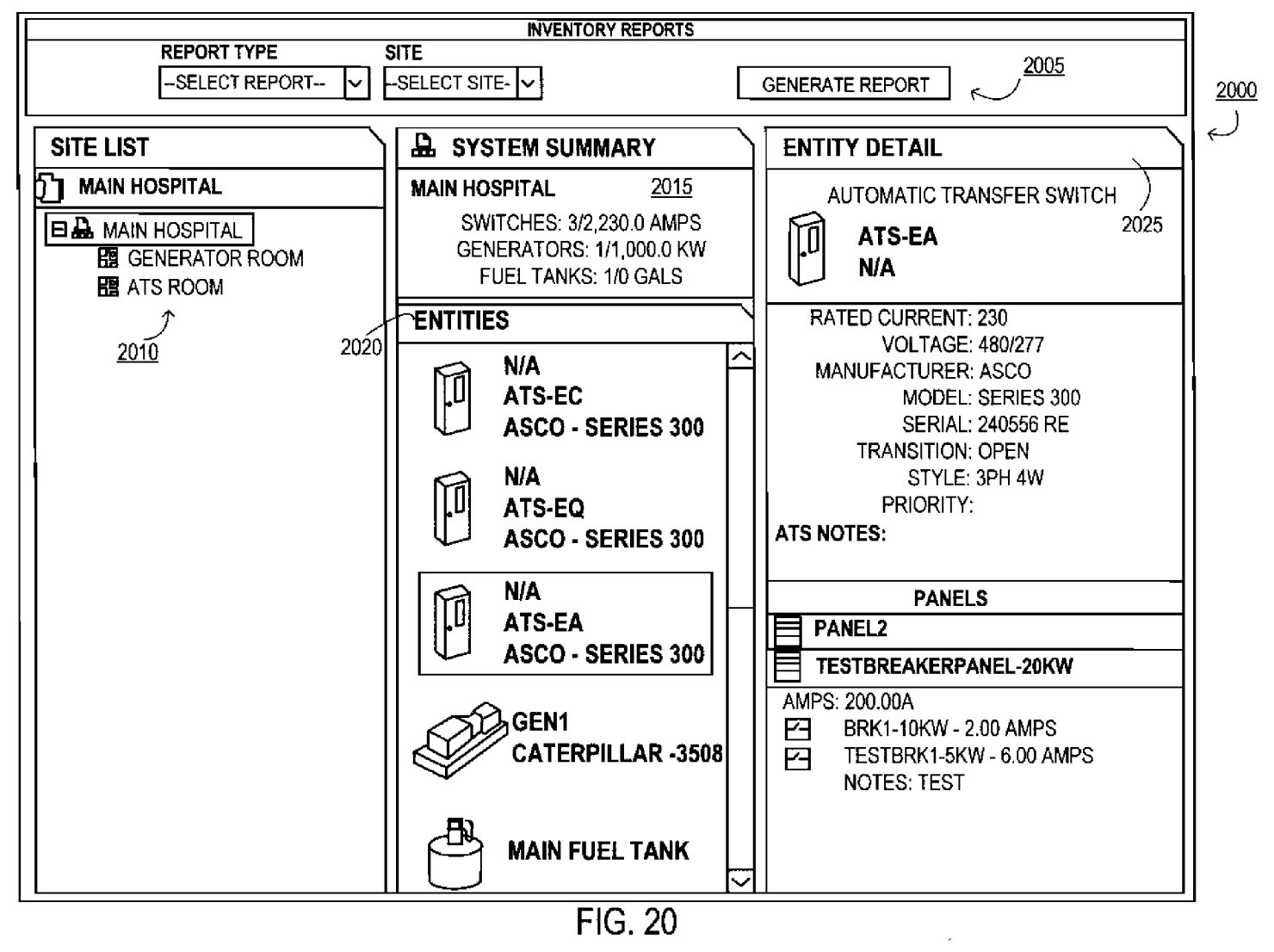

FIG. 20 shows a sample display 2000 for a facility portal 1830 according to one embodiment of the present system. The display 2000 includes an inventory report generation field 2005, in which a user can generate a printed report of particular EPSS equipment for a given site (discussed in greater detail below). As shown, the display 2000 also includes a "Site List" 2010 detailing all sites available for viewing by the particular user. Also shown is a "System Summary" field 2015 for the particular selected site. In the embodiment shown, the "System Summary" field 2015 provides a brief list of the EPSS equipment located at the site. For example, the system summary 2015 in FIG. 20 shows that the "Main Hospital" site has three switches (ATS's 160) rated at 2,230 Amps, one generator 165 rated at 1,000 kW, and one fuel tank (with currently zero gallons contained therein). Thus, the "System Summary" field 2015 allows a user to cohesively view, at a high level, the total amount of EPSS equipment, and corresponding potential power output, for a given facility.

Also shown in display 2000 is an "Entities" field 2020 that lists each individual item of EPSS equipment at the given facility. In FIG. 20, "ATS-EA" is shown as selected, and the corresponding details related to "ATS-EA" are displayed in the "Entity Detail" field 2025. In the embodiment shown, the "Entity Detail" field 2025 presents the information that was entered during the electronic capture of the EPSS equipment information (step 1805) for the particular item of equipment selected. Accordingly, the name, rated current, voltage, manufacturer, model, style, and other information relating to the selected ATS is shown. The display 2000 also includes a "Panels" section 2030 for listing the electrical breaker panel(s) associated with the item of EPSS equipment selected. The "Panels" section 2030 further includes circuit breaker information for circuit breakers contained within the given "Panel", including the name and current rating of the circuit breaker. By using the facility portal display 2000, a system user can quickly and easily access any information relating to EPSS equipment at a given site.

As mentioned, the embodiment of the display 2000 shown in FIG. 20 includes an inventory report generation field 2005. This field enables a user to generate reports for EPSS equipment contained at a site. These reports may be used by a facility as comprehensive analyses of the equipment contained at the facility. These reports may also be useful to vendors and manufacturers of EPSS equipment. The vendors and manufacturers may use this information to determine which facilities are using their equipment, how much of the equipment is being used, which facilities likely need new equipment, and various other uses as will be apparent to one of ordinary skill.

FIG. 21A shows a sample generator inventory report 2101 created by an embodiment of the inventory report generation field 2005 contained in display 2000. The generator inventory report 2101 includes a "Generator Name/Location" field 2105 that lists each generator 165 at the facility by its name (as entered into the site survey tool during step 1805), and the physical location of that generator. The generator inventory report 2101 also includes a "Generator Details" section 2110, as well as a "Fuel System Details" section 2115 corresponding to each listed generator 165. In the embodiment shown, the "Generator Details" section lists the information pertaining to each generator 165 that was collected during the site survey (step 1805), such as the generator manufacturer, model, horsepower, etc. The "Fuel System Details" section 2115 shows the fuel type and estimated consumption rate for each listed generator 165. As will be understood, the generator inventory report 2105 may show more or less information related to the selected generators 165 than what is shown in FIG. 21A. As will also be understood, although the sample generator inventory report 2101 includes five generators 165, many more than five or as few as one may be included in the report 2101.

FIG. 21B is a sample ATS inventory report 2102 created by an embodiment of the inventory report generation field 2005 contained in display 2000. Much like the generator inventory report 2101, the ATS inventory report 2102 lists specific ATS's 160 included within a facility, as well as details associated with those ATS's. The fuel tank inventory report 2103, shown in FIG. 21C, lists the fuel tanks for the given facility, the capacity of each tank, and comments related to the specific tank (such as the manufacturer, model, etc.). As shown, the fuel tank inventory report 2103 also includes a "Generators Serviced" field 2130, which shows the site, the system (EPSS), and the name of the generator 165 served by each respective fuel tank. As will be understood by one of skill in the art, varying amounts of information, as well as varying numbers of ATS's 160 and fuel tanks, may be included in embodiments of ATS inventory report 2102 and the fuel tank inventory report 2103.

Further, embodiments of the inventory report generation field 2005 may also generate manufacturer reports 2201, 2202 relating to the items of EPSS equipment at a given site. FIG. 22A illustrates a sample ATS manufacturer report 2201 for a particular facility or site. The ATS manufacturer report 2201 lists the ATS's 160 located within the site by manufacturer 2205. Also, within each manufacturer 2205 breakdown, the specific model 2210 of each ATS 160 is listed, as well as the number of occurrences of that particular model at the facility. The generator manufacturer report 2202 shown in FIG. 22B follows the same format as the ATS manufacturer report 2201, only for generators 165 instead of ATS's 160 at the facility. As will be understood, the reports 2201, 2202 may comprise any format and any level of information desired by the user, and are not limited to the specific formats and amounts of information shown in FIGS. 22A-B.

Referring again to the embodiment of the system design automation 1800 shown in FIG. 18, after the EPSS equipment information has been processed and stored in a database (step 1825), the information is further processed according to a proprietary rules engine to generate the bill of materials, engineering schematics, and other items necessary to install and operate an EPMS 10 for a given facility (step 1835). Generally, a rules engine is a software system that helps manage and automate certain predefined rules within a business or system. In one embodiment of the present system, the rules engine software is part of the management computer system 60, and includes predefined algorithms and commands that generate the bill of materials, work instructions, and other outputs that are specifically tailored to each site to create a customized EPMS 10 for the site.

In one embodiment, all of the major recognized manufacturers and models of EPSS equipment are stored in the management computer system 60, as well as the required data acquisition equipment and EPMS hardware needed to integrate each model of equipment into a functioning EPMS 10. Thus, when a specific manufacturer and model of a particular generator 165 or ATS 160 is captured via the site survey tool (step 1805), and subsequently uploaded and processed (steps 1810-1835), the management computer system 60 recognizes that particular model of equipment from its database and generates a list of the EPMS hardware and data acquisition equipment needed to incorporate that particular model of equipment into a functioning EPMS 10. Accordingly, for each different model of EPSS equipment, different data acquisition equipment, EPMS hardware, work instructions, and other elements may be required to integrate each item of EPSS equipment into an overall EPMS 10. Further, as will be understood by one of ordinary skill, if a particular model of EPSS equipment is not already stored in the management computer system 60 (for example, as new models of equipment are unveiled), a system operator can simply upload the parameters of the specific model of equipment such that the system 60 will recognize that model of equipment and will also store it for future configurations.

By way of example, assume a "Model Y" generator 165 made by "Company X" is one of many different generators 165 located at a facility. Also assume that, based on research and manufacturer specifications, a "Model Y" generator 165 made by "Company X" requires the installation of data acquisition equipment including one fuel gauge, one power meter, one vibration sensor, and two monitoring sensors on the generator in order to gather all necessary information needed for adequate monitoring and managing of the generator via an EPMS 10. Further assume that some additional EPMS hardware components are needed, such as fiber optic cables and wiring, to connect the data acquisition equipment to an interface module 40. Additionally, assume that a "Model Z" generator 165 made by "Corporation W" is another generator at the facility. However, for purposes of this example, assume the "Model Z" generator 165 made by "Corporation W" is an "intelligent" generator, and it is preconfigured by the manufacture to include all necessary sensors, gauges, and other data acquisition equipment needed to monitor its informational parameters. Thus, as the two models of generators 165 are processed by the system design automation 1800 component, the rules engine software will generate a list of required parts (i.e. one fuel gauge, one power meter, one vibration sensor, and two monitoring sensors, as well as a certain length of fiber optic cables and wiring) for the "Model Y" generator. However, the software will recognize that the "Model Z" generator does not require the retrofitting of any data acquisition equipment, and thus may only generate a list of minor EPMS hardware needed, such as connection wiring to connect the already-existing sensors on the generator control panel to an interface module 40.

As shown in FIG. 18, the rules engine software creates a bill of materials detailing the data acquisition equipment and EPMS hardware required to integrate all items of EPSS equipment at a facility into a functioning EPMS 10 (step 1840). A sample bill of materials is shown in Appendix I. In one embodiment, the bill of materials will include not only the necessary data acquisition equipment and EPMS hardware, but will include other items as well, such as site servers, interface modules 40, and other similar equipment. In another embodiment, the bill of materials includes software licenses and terms of use for the facility to use proprietary software associated with an EPMS 10. Further, the interface modules 40 needed for a given EPMS 10 are defined at step 1845 via the rules engine software based on the number and location of items of EPSS equipment at the facility.

As the bill of materials is generated (step 1840) and the interface modules 40 are defined (step 1845), order documents are also generated for installation of an EPMS 10 at the facility (step 1850). Generally, every facility or site will differ in terms of the equipment required to create an EPMS 10 at the site and to install and integrate that equipment. For instance, the types and numbers of EPSS equipment are generally different at every site, the location of that equipment varies greatly, and the way in which all of the EPSS equipment is connected together and integrated with the management computer system 60 changes as a function of the differences in equipment and location. Thus, one embodiment of the system design automation 1800 includes the generation of order documents, including a configuration file (step 1852), a project template or plan (step 1854), electrical drawings and schematics (step 1856), work instructions (step 1858), and vendor orders (step 1860). As will be understood, other order documents may be generated as needed based on the requirements or desires of a system operator or facility.

Additionally, as will be understood, all of the order documents (as well as the bill of materials) are automatically generated by the rules engine software based on the EPSS information collected during the site survey (step 1805). This autogeneration or autoconfiguration enables the quick and efficient definition of all data acquisition equipment, EPMS hardware, and other equipment needed to initiate an EPMS 10. The autoconfiguration also enables creation of engineering drawings, work instructions, and other items needed to initiate the EPMS 10.

Still referring to FIG. 18, the configuration file is generally an XML (extensible markup language) file or other similar file needed to integrate the installed data acquisition equipment and EPMS hardware with the management computer system 60 to make operative an EPMS 10. The configuration file minimizes the steps involved in setup and configuration of proprietary software onto a server at a facility. The project template is a plan that establishes suggested timelines, tasks, and other related items that will be necessary to complete the work instructions and install all necessary equipment at a site. Accordingly, the project template interacts directly with the work instructions to determine what tasks must be completed. Appendix II illustrates sample work instructions for installing the data acquisition equipment and EPMS hardware at a site. Also generated are engineering schematics and/or drawings detailing how various items of equipment should be connected together and installed (step 1856). A sample engineering drawing is shown in Appendix III. Vendor orders are also created for ordering each item of data acquisition equipment and EPMS hardware from varying manufacturers (step 1860). A sample vendor order is shown in Appendix IV. In some embodiments, a vendor order system interfaces directly with an accounting system 1865 to track the cost and expense of items ordered from vendors, check available funds, and complete other accounting-related tasks.

Additionally, in one embodiment, a quote is generated detailing the cost associated with the installation of all data acquisition equipment, EPMS hardware, and any other equipment (step 1870). Generally, the quote accounts for the cost of the equipment itself, as well as the labor associated with installing the equipment, and any other miscellaneous charges.

Once all of the order documents and the bill of materials have been generated (steps 1850 and 1840) and the interface modules 40 have been defined (step 1845), the data acquisition equipment, EPMS hardware, and other necessary equipment are installed on or at the EPSS equipment at the given facility, the configuration file is integrated into the management computer system, and an EPMS 10 for the facility is thus made operative.

Monitoring EPSS Equipment Via Configured EPMS

Figure 23:
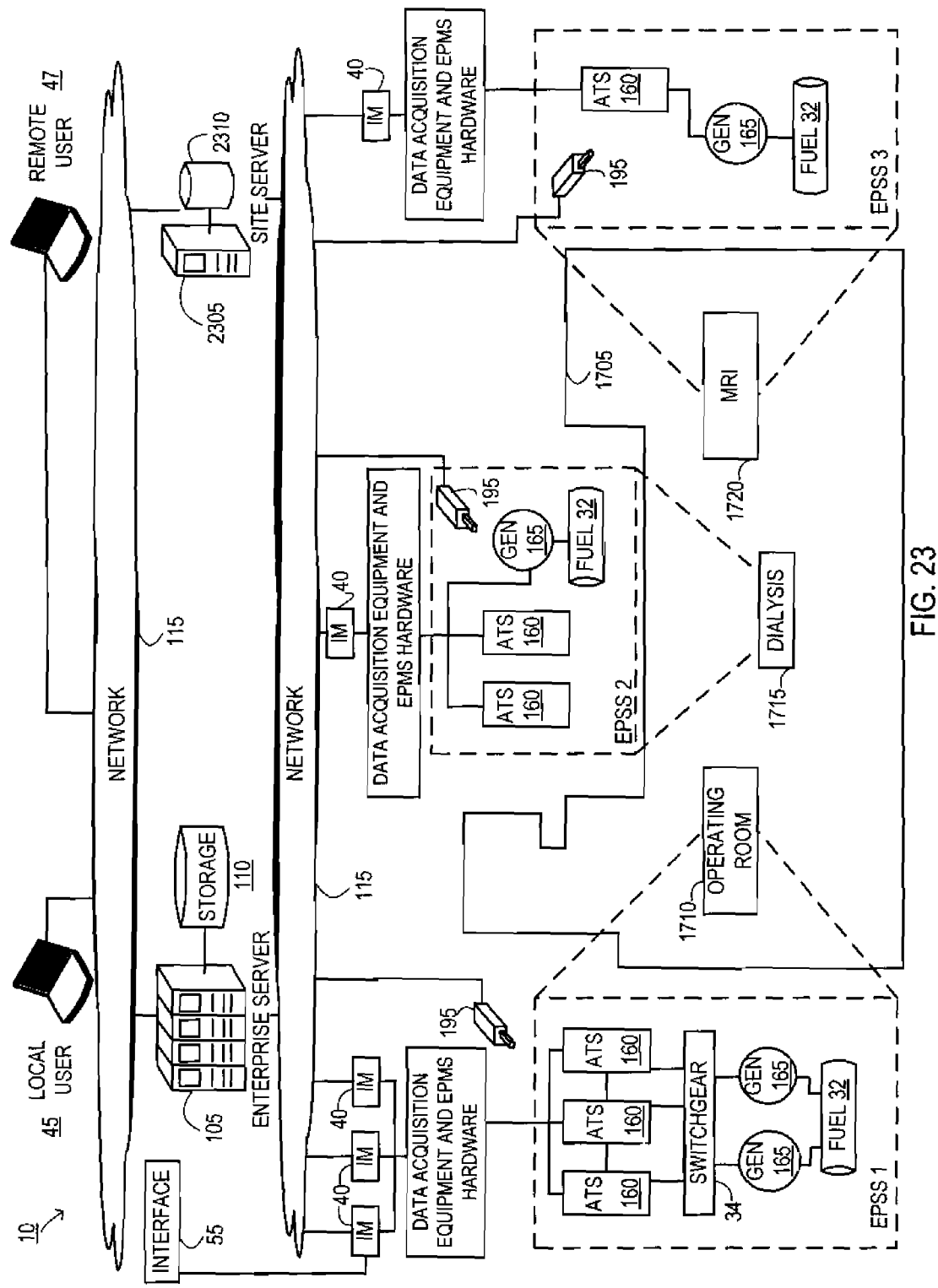
FIG. 23 is a diagram illustrating an embodiment of an installed and operative emergency power management system at a facility.

FIG. 23 is a diagram illustrating an embodiment of an installed and operative EPMS 10 at the hospital facility 1705 previously shown in FIG. 17. As shown, the data acquisition equipment and EPMS hardware have been installed at the EPSS equipment and operatively connected to the interface modules 40. As also shown, EPSS 1 includes three interface modules 40 for receiving EPSS operational information from the data acquisition equipment, processing and normalizing that operational information, and transmitting it to server(s) 105, 2305. Further, EPSS 2 and EPSS 3 each include only one interface module 40. As will be understood, each EPSS may utilize varying numbers of interface modules 40 depending on the number and location(s) of EPSS equipment included in the specific EPSS. Additionally, video cameras 195 are shown as installed at each EPSS. These video cameras 195 provide video and audio feeds of the EPSS equipment to the user terminals 45, 47. As will be understood by one of ordinary skill, while only one camera 195 is shown for each EPSS, many more cameras are possible within embodiments of the present system.

As shown in FIG. 23, the interface modules 40 are connected to a network 115 that provides communication between the modules and the server(s) 105, 2305. As mentioned previously, a network 115 may comprise an intranet, internet, data network, or other similar network. The network 115 enables the interface modules 40 to transmit EPSS operational information to the server(s) 105, 2305 for further processing. Although the embodiment of the EPMS 10 shown in FIG. 23 includes both an enterprise server 105 and a site server 2305, one of ordinary skill in the art will understand that a site server is not necessary in all embodiments. The use of a site server 2305, or many site servers, in combination with an enterprise server 105 comprises a form of distributed computing. Generally, the site server 2305 is responsible for interfacing with the interface modules 40 and managing inter-process communications between items of EPSS equipment for tests of the EPSS equipment, emergency management, and other similar processes. The site server 2305 also collects and logs data from the EPSS equipment, provides alarms when certain pre-defined criteria are met, manages testing of the EPSS equipment, provides local visualization of the EPSS equipment, and other related functions.

The enterprise server 105, according to one embodiment, delivers all of the functionality of the site server 2305, with the added functionality of rolling up all site servers to provide a global view of all EPSS's within a facility or many facilities. Use of an enterprise server 105 allows for geographical distribution of the EPMS 10, such that if a site server 2305 malfunctions or becomes unavailable, the EPMS can continue functioning until the site server is repaired or replaced. Further, according to some embodiments, the enterprise server 105 provides a hosting of a web-based graphical user interface (GUI) 55 for user interaction. The overall functions and processes of the site server(s) 2305 and enterprise server(s) 105 will be described in more detail below. Additionally, as shown, the server(s) 105, 2305 interact with databases 110, 2310 to provide storage for incoming and processed data.

Still referring to FIG. 23, users of the EPMS 10 can access processed EPSS operational data via either local user terminal 45, or remote user terminal 47. Processed data is made available at terminals 45, 47 via a network 115. The terminals 45, 47 provide system users with an interactive interface from which they can control, monitor, manage, view, and test the EPSS equipment at a given facility (as will be discussed below in association with several interactive user displays).

In one embodiment of the EPMS 10, an interface 55 is connected directly to an interface module 40 or modules, as shown in FIG. 23. In this embodiment, the interface module 40 connected to the interface 55 has a public IP address. The enterprise server 105 in this instance acts as a hosted site, and the public interface module 40 or modules tunnel directly to the server. Generally, there is access control to the section of the server 105 that is connected to the public interface module(s) 40 such that only an authorized user associated with the given facility can access the EPSS equipment information through the hosted site. This embodiment enables use of an EPMS 10 without installation and operation of a site server 2305. Additionally, this embodiment tends to reduce costs associated with software licenses because the enterprise server 105 acts as a hosted site and spreads software costs amongst many facilities.

In many embodiments of the EPMS 10, user security limits access to EPSS's across varying facilities. In nearly all EPMS 10 interactions, user security determines which EPSS's the particular user may view, monitor, and control, and to what extent he or she may view, monitor, and control them. This user security is generally accomplished via a username and password protocol, as will be understood in the art. In this way, an overall system operator may be able to manage many EPMS's across many facilities, for example, whereas an individual employee at a given facility may only be able to view a portion of the EPSS's at the employee's facility.

Figure 24A:
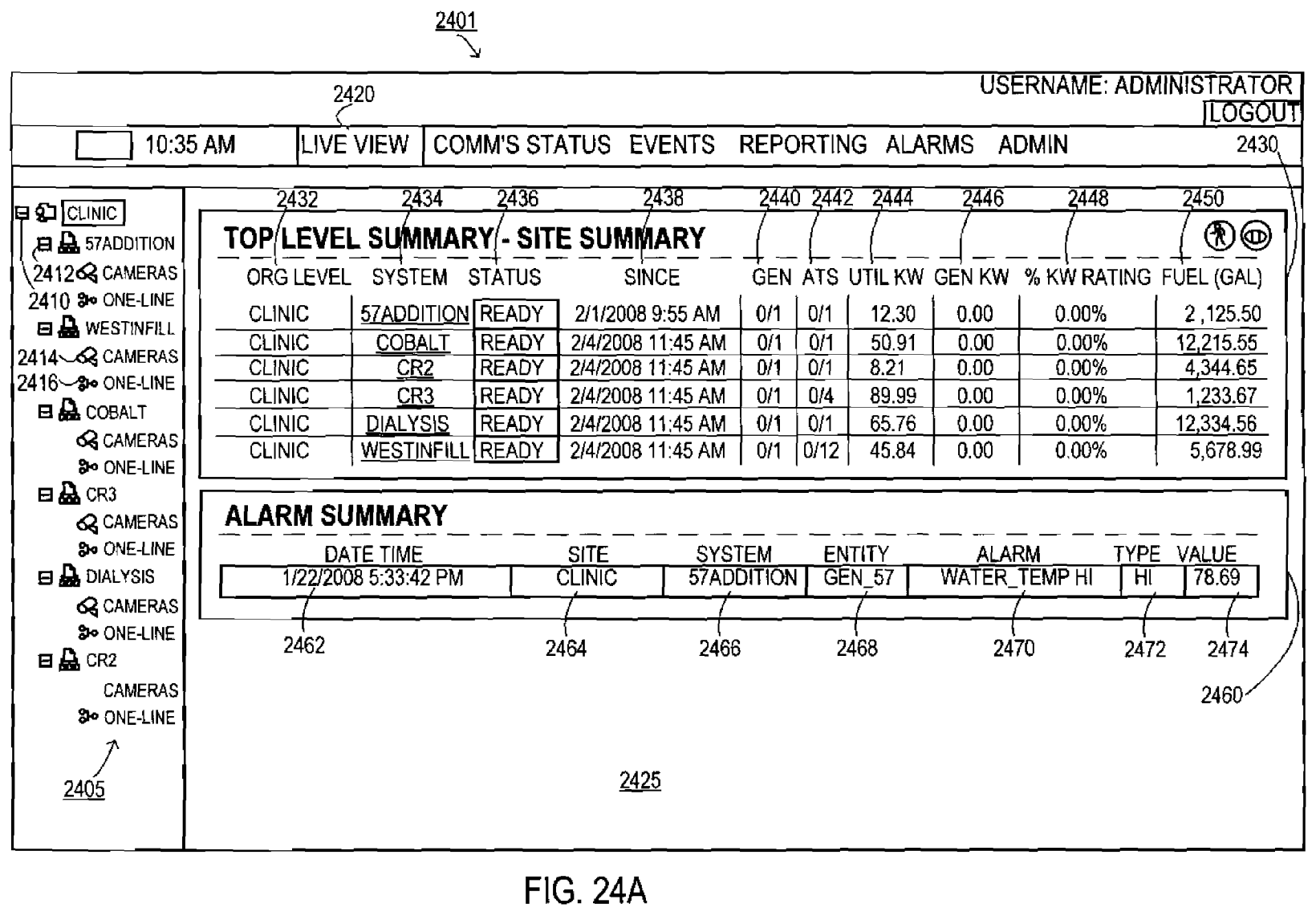

Referring now to FIG. 24A, a terminal display of a tabular site summary view 2401 is shown for a sample site according to an embodiment of the present system. The site summary view 2401 is depicted under the "Live View" tab 2420 of the terminal display, thus indicating a live, real time view of EPSS equipment for the given facility. The site summary view 2401 includes a hierarchy 2405 for listing and navigating through sites 2410, EPSS's 2412, camera views 2414, and one-line views 2416 of EPSS equipment. In other embodiments, as will be understood, the hierarchy 2405 may list other items as well, such as physical locations of EPSS equipment, specific items of EPSS equipment, and other similar elements.

The tabular site summary view 2401 shown in FIG. 24A also includes a site summary display region 2425 that lists each EPSS for the selected site. As shown, the site "Clinic" 2410 is selected in the hierarchy 2405, and thus the summary display region 2425 lists each EPSS associated with the "Clinic" site. Within the summary display region, a "Top Level Summary" field 2430 displays all EPSS's for the site, and an "Alarm Summary" field 2460 lists any recent alarms associated with the site. Turning first to the "Top Level Summary" field 2430, "Org Level" region 2432 simply lists the site associated with each EPSS shown in the field 2430. The "System" region 2434 lists the name of each EPSS associated with the selected site. In the embodiment shown, each EPSS name comprises a clickable link to a more detailed system view of that particular EPSS (discussed below).

The "Status" region 2436 in the "Top Level Summary" field 2430 indicates the overall status of each particular EPSS. As shown, all statuses are indicated as "READY", designating that each EPSS is ready to begin operating and supplying emergency power if needed. Other status indicators may be displayed in "Status" region 2436 as well depending on the actual status of the given EPSS, such as "RUNNING", "MAINTENANCE", and other similar statuses. For instance, a status of "RUNNING" may indicate that at least one item of EPSS equipment in that particular EPSS is currently operating. A status of "MAINTENANCE" may indicate that at least one item of equipment is currently undergoing maintenance work. As will be understood, other status indicators are possible within embodiments of the present system.

Still referring to FIG. 24A, the "Since" region 2438 indicates at what time and date each EPSS achieved its indicated status. The "Gen" region 2440 and "ATS" region 2442 indicate, respectively, how many of the total generators 165 and ATS's 160 in each EPSS are currently operating. The "Util kW" region 2444 shows the amount of utility power currently being supplied to certain loads that are also supplied by generator power. The "Gen kW" region 2446 indicates the amount of generator power being supplied to the same loads referred to in the "Util kW" region 2444. Further, the "% kW Rating" region 2448 shows what percentage of rated generator power is currently being supplied by the generator(s) 165 in each EPSS. Additionally, the "Fuel (Gal)" region 2450 indicates how much fuel is available for each EPSS. As will be understood by one of ordinary skill in the art, other embodiments of the present system will include additional regions in the "Top Level Summary" field 2430 indicating additional data related to the EPSS's listed in the field 2430.

Referring now to the "Alarm Summary" field 2460 for the selected site, alarms associated with EPSS equipment at the site are shown. The alarms are predefined by a system operator to notify a system user when a certain event occurs.

For instance, an alarm may be generated when the RPMs of a generator 165 exceed a certain value, or when the exhaust temperature of a generator reaches a set value, or when an ATS 160 malfunctions, or for any number of possible situations. In the embodiment of the "Alarm Summary" field 2460 shown in FIG. 24A, "DateTime" region 2462 indicates the date and time of the alarm, "Site" region 2464 indicates at which site the alarm occurred, and "System" region 2466 shows in which EPSS the alarm occurred. Further, "Entity" region 2468 specifies which item of EPSS equipment experienced the alarming condition. In "Alarm" region 2470, a brief narrative of the nature of the alarm is displayed. For example, the alarm shown in FIG. 24A states that the water temperature of the noted generator 165 is high.

Additionally, "Type" region 2472 indicates what type of alarm occurred. For example, a designation of "hi" may indicate a moderately serious alarming condition, whereas a designation of "hi hi" or "extremely hi" may indicate a very serious condition. Finally, under "Value" region 2474, the specific value of the data parameter associated with the alarm is listed. In the example shown, because water temperature was indicated in "Alarm" region 2470, the value of 78.69 shown in "Value" region 2474 likely refers to the water temperature of the noted generator. As will be understood, other indicators and data fields other than those shown in FIG. 24A may be employed to notify a system user that an alarm-triggering event has occurred.

Figure 24B:
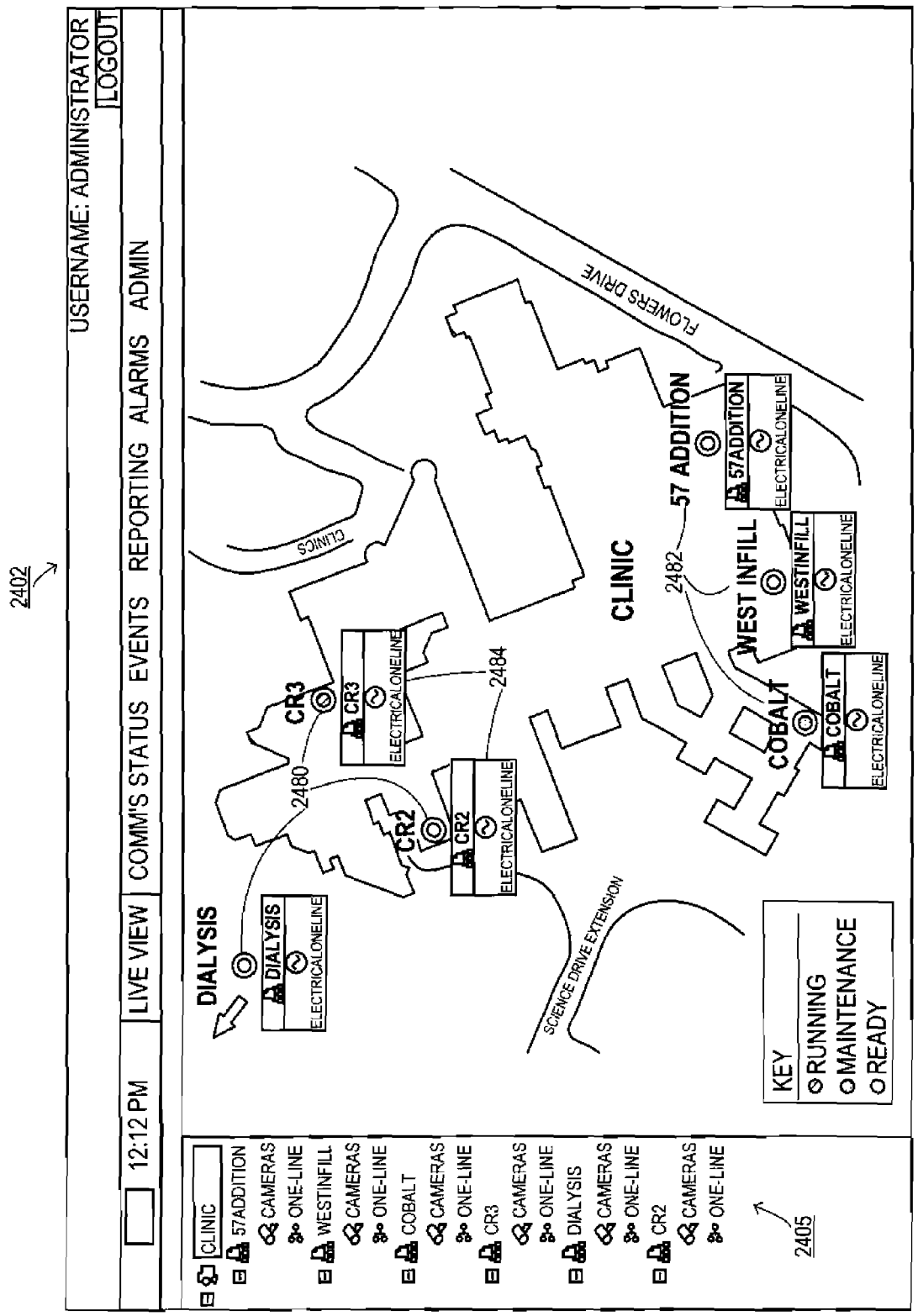
FIG. 24B shows a terminal display of a map site summary view for a sample site according to an embodiment of the present system.

Referring now to FIG. 24B, a terminal display of a map site summary view 2402 is shown for a sample site according to an embodiment of the present system. The site summary view 2402 shown in FIG. 24B corresponds to the same "Clinic" site shown in FIG. 24A, except that the map site summary view 2402 shown in FIG. 24B displays the EPSS's 2482 associated with the site in map form rather than tabular form. While the map site summary view 2402 shown in FIG. 24B provides less information about each EPSS 2482 as compared to the tabular site summary view 2401, the map view 2402 does provide a helpful geographical display of the locations of each EPSS throughout the site.

Further, each EPSS 2482 shown in map view 2402 includes a status display 2480 indicating the status of each EPSS, similarly to "Status" region 2436 in the tabular summary view 2401. For example, a red status display 2480 may indicate that at least one item of EPSS equipment in the given EPSS 2482 is running, a blue status display may indicate that at least one item of EPSS equipment is in maintenance mode, and a green status display may indicate that all items of EPSS equipment in the given EPSS are ready for operation. As will be understood, other status indicators are possible within embodiments of the present system.

Additionally, the embodiment of the map site summary view 2402 shown in FIG. 24B is interactive, such that a user may click (via a mouse or other selection tool) on each EPSS 2482 shown in the map view to drill down to a more detailed EPSS view (discussed in detail below). Also, a user may click on the "ElectricalOneLine" link 2484 for each EPSS 2482 to see a detailed one-line view of the particular EPSS (also discussed below).

Figure 25A:
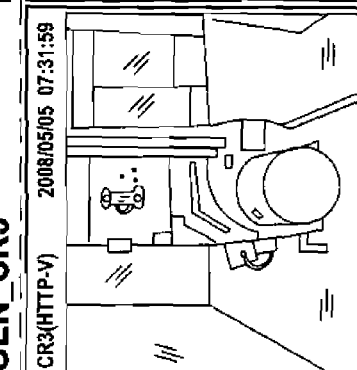
FIG. 25A is a terminal display of a tabular EPSS view for a sample EPSS according to an embodiment of the present system.

Whether a system user is viewing a tabular site summary view 2401 or a map site summary view 2402, the user may interact with the terminal display to view a more detailed view of a particular EPSS for the selected site. For example, if a user selects or clicks on EPSS "CR3" in the "System" region 2434 of tabular site summary view 2401, then the user will be directed to a tabular EPSS view 2501 of EPSS "CR3", as shown in FIG. 25A. From the map site summary view 2402, a user may select EPSS "CR3" 2482 to view the same tabular EPSS view 2501 for "CR3". Additionally, from either the tabular site summary view 2401 or the map site summary view 2402, a user may simply click on "CR3" in hierarchy 2405 to be directed to the tabular EPSS view 2501 for "CR3".

The embodiment of the tabular EPSS view 2501 shown in FIG. 25A includes both a hierarchy 2405 and an EPSS display region 2510, wherein the EPSS display region 2510 shows details and information related to the items of EPSS equipment contained in the selected EPSS. As shown, EPSS display region 2510 includes an EPSS status and testing field 2520, an "ATS Summary" field 2540, and a generator display field 2560. In one embodiment, the EPSS status and testing field 2520 includes an alarm section 2522 for indicating any alarms associated with the particular EPSS, and a system activity section 2524 noting any recent events associated with the EPSS equipment. Generally, the system activity section 2524 will display the date, time, and a brief description of the most recent event or events that have occurred in connection with equipment in the selected EPSS. An event may include a power disruption event, such as an emergency power loss or a test, or other events, such as equipment maintenance, equipment malfunctions, and other similar events.

The EPSS status and testing field 2520 further includes a status indicator 2526 for displaying the current status of the EPSS equipment. As shown, the status of the selected EPSS is "READY", indicating that the EPSS equipment is ready for operation. Also shown is a status clock 2528 for showing the length of time that a certain status has been ongoing. For example, if the generator 165 associated with EPSS "CR3" is currently showing a status of "RUNNING", then status clock 2528 would indicate the length of time the generator has been running. Additionally, status and testing field 2520 further includes test controls 2530, which are used to setup and initiate tests of the EPSS equipment contained in the selected EPSS. Testing of the EPSS equipment will be discussed in greater detail below.

Still referring to FIG. 25A, the "ATS Summary" field 2540 lists the ATS's 160 associated with the selected EPSS. As shown, EPSS "CR3" includes four ATS's, the names of which are listed in "ATS" region 2542. In one embodiment, the listed ATS names are live, clickable links that will provide further details regarding a specific ATS when selected (discussed in more detail below). "Status" region 2544 shows the current status of each ATS 160, and "Source" region 2546 indicates whether the ATS is currently connected to "NORMAL" power (i.e. utility power) or "EMERGENCY" power (i.e. generator power). Additionally, normal power region 2548 indicates the actual voltage and current readings from the normal power supply, whereas emergency power region 2550 indicates the actual voltage and current readings from the emergency power supply. As shown, because all the ATS's 160 are connected to normal power, the voltage and current readings shown in emergency power region 2550 are zero. Further, "% R Cap" region 2552 indicates the percentage of rated load capacity currently being used, "kW" region 2554 shows the current power output being channeled through each ATS 160, and "% Load" indicates the percentage of maximum load connected to each ATS that is currently being powered by each ATS. As will be understood, other data regions relating to ATS data may be included in "ATS Summary" field 2540.

Referring now to generator display field 2560, a detailed display of generator data for the generator 165 included in EPSS "CR3" is shown. As will be understood, if the selected EPSS includes more than one generator 165, then more than one generator display field 2560 would be shown in EPSS display region 2510. Alternatively, multiple generators 165 may be listed in selectable tabular form, similar to the ATS's 160 in "ATS Summary" field 2540. The generator display field 2560 includes a multimedia display 2562 for showing a live video and audio feed of the EPSS generator 165. The live video and audio feed shown in multimedia display 2562 is captured by camera 195 located at the physical location of the generator 165. The multimedia display 2562 enables a system user to hear or see if there are any noticeable problems with the EPSS equipment. Also, if a system user wishes to initiate a remote test of the generator 165, the multimedia display 2562 shows whether someone is near the EPSS equipment, such that the test can be aborted until the equipment is clear.

Also included in generator display field 2560 is electrical generator region 2564, which shows live data related to the electrical generator in the genset for the selected EPSS. As shown, electrical generator region 2564 displays the present power output and frequency of the electrical generator. Additionally, the electrical generator region 2564 includes a percentage of rated power meter 2566, as well as percentage of rated power readings region 2568. In some applications, generator testing must exceed 30% (or some other predefined value) of the rated power or load of the generator 165 to qualify as a valid test (discussed below). Thus, in some settings, it is advantageous to be able to view a live reading of the percentage of rated power being supplied by the generator 165.

Still referring to FIG. 25A, the generator display field 2560 further includes an engine region 2570 for detailing live data related to the engine in the genset for the selected EPSS. As shown, engine region 2570 displays the water temperature, oil pressure, and exhaust temperature of the engine. Engine region 2570 also shows the voltage and current of the battery charger used in conjunction with the engine. Also displayed in the embodiment of the engine region 2570 shown in FIG. 25A is an hours total 2572 showing the total hours that the particular engine has operated since it was manufactured. Further, "Main Fuel Tank" region 2574 displays the volume of fuel available in the fuel supply 32 for the given generator.

As mentioned previously, the data displayed in EPSS display region 2510 is collected from data acquisition equipment that was installed at or on the EPSS equipment (or was preinstalled by the manufacturer) during configuration of the EPMS 10. This data is normalized and transmitted (discussed below) through an interface module 40 or modules to the management computer system 60, and eventually displayed in virtually real time via terminal displays, such as the tabular EPSS view 2501. As will be understood, the data collected and displayed in embodiments of the terminal displays may include more or less data than what is displayed in the tabular EPSS view 2501 and other views discussed herein.

Figure 25B:
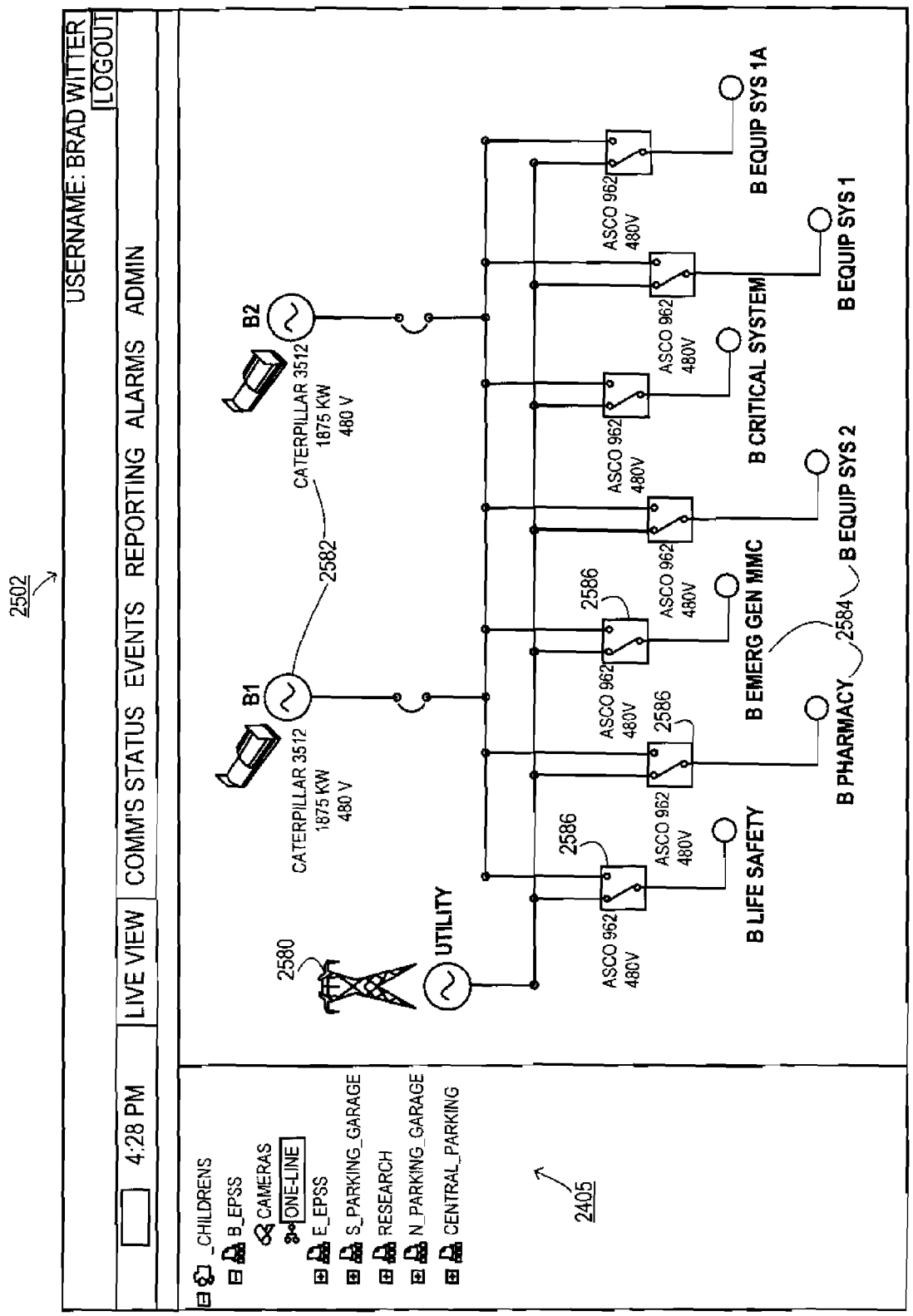
FIG. 25B illustrates a terminal display of a one-line view for a given EPSS according to an embodiment of the present system.

Turning now to FIG. 25B, an embodiment of a sample one-line view 2502 for a given EPSS is shown. The one-line view 2502 for a given EPSS may be viewed by selecting "One-Line" in hierarchy 2405, or by clicking on the "ElectricalOneLine" link 2484 in the map site summary view 2402. Generally, an embodiment of the one-line view 2502 displays live connections between utility power 2580 or emergency power 2582 for the loads 2584 supplied by an EPSS. Connection boxes 2586 represent ATS's 160 and the switch position within the ATS's. In the example shown in FIG. 25B, all loads 2584 are shown as currently being supplied by utility power 2580. However, if a power disruption event occurs, and any of the loads 2584 become supplied by emergency power 2582, the switch position within connection boxes 2586 corresponding to those loads will automatically switch and indicate that the load is being supplied by emergency power. Accordingly, the one-line view 2502 provides a viewing mechanism for monitoring the live connection status of various items of EPSS equipment at a facility.

Figure 26:
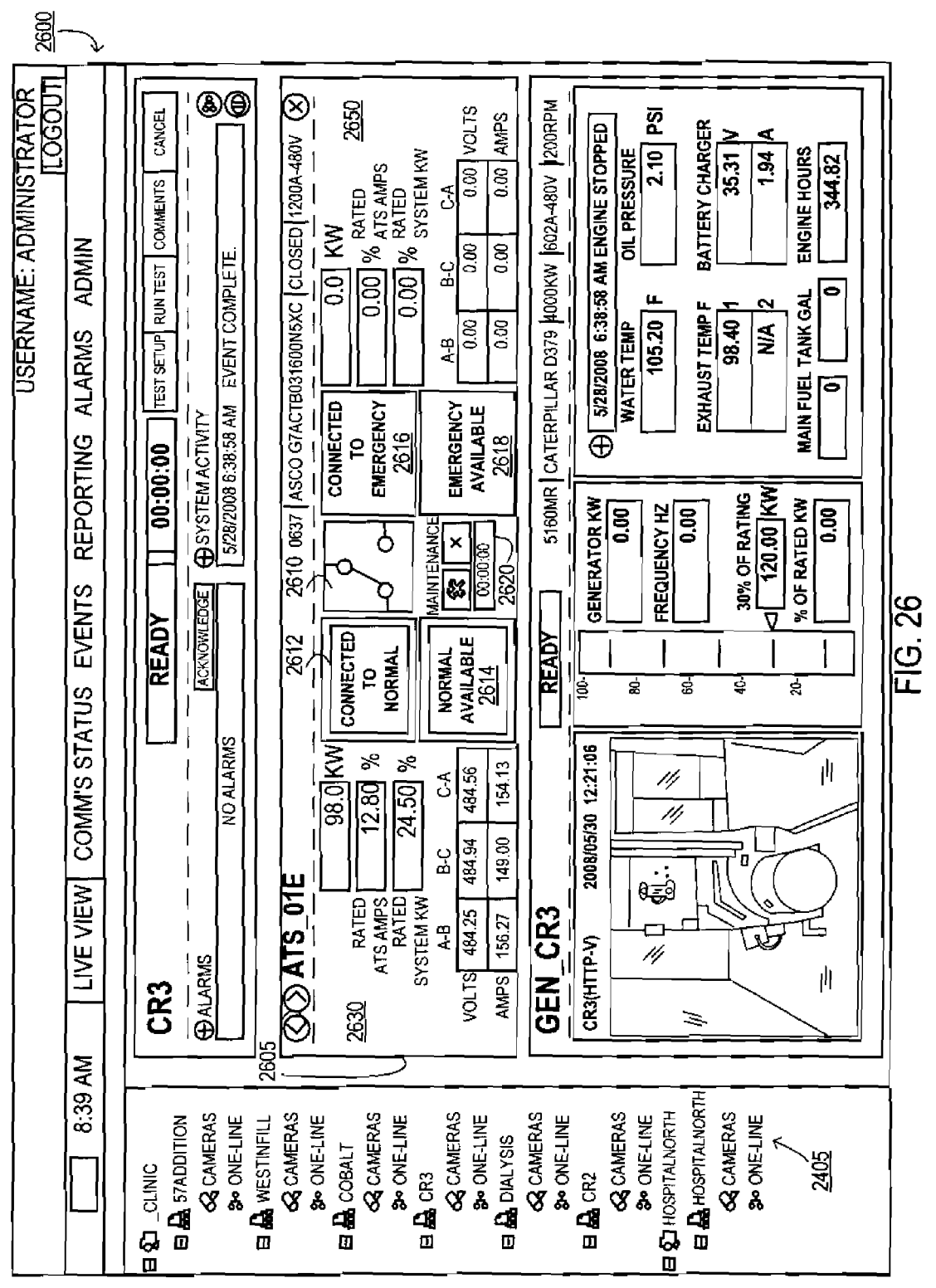

Referring again to FIG. 25A, if one of the ATS's 160 listed in "ATS" region 2542 is selected or clicked, a more detailed view of data related to that particular ATS will be displayed. FIG. 26 shows an entity detail view 2600 for a particular ATS 160 and particular generator 165 in a given EPSS. The embodiment of the entity detail view 2600 shown is similar to the tabular EPSS view 2501 shown in FIG. 25A, but with a more detailed display of one of the ATS's listed in "ATS Summary" field 2540. As shown, the ATS named "ATS_01E" has been selected, and live data corresponding to "ATS_01E" is shown in ATS detail region 2605.

According to one embodiment, the ATS detail region 2605 includes a graphical display 2610 indicating that the ATS 160 is connected to normal or utility power. Normal connection indicator 2612 is highlighted to further demonstrate that the ATS 160 is connected to normal power, and normal available indicator 2614 is highlighted to show that utility power is in fact available. In the event of an emergency or other power disruption event, when normal power becomes unavailable, the ATS 160 sends a signal to a generator 165 to begin running. Once the generator 165 reaches the power output necessary to power the connected load, the emergency available indicator 2618 will become highlighted, the ATS 160 will transfer the load to emergency power, and the graphical display 2610 will indicate the switch to emergency power. Additionally, emergency connection indicator 2616 will become highlighted once the load has been connected to emergency power. Also included in the embodiment of ATS detail region 2605 shown in FIG. 26 is a maintenance selector 2620 that enables a system user to place the selected ATS 160 in maintenance mode.

In the embodiment shown in FIG. 26, on each side of indicators 2612 and 2616 are ATS data regions 2630 and 2650 corresponding to normal power data and emergency power data, respectively. Each ATS data region 2630, 2650 displays the amount of power and percentage of rated ATS current channeled through the particular ATS 160, as well as the percentage of overall rated EPSS power. Data regions 2630, 2650 also include voltage and current readings for each phase of a three-phase electric power transmission through the ATS (i.e. A-B, B-C, C-A). As will be understood by one of ordinary skill in the art, other collected values from ATS's 160 within a site may be displayed in ATS detail region 2605 in addition to the values shown in FIG. 26.

Figure 27:
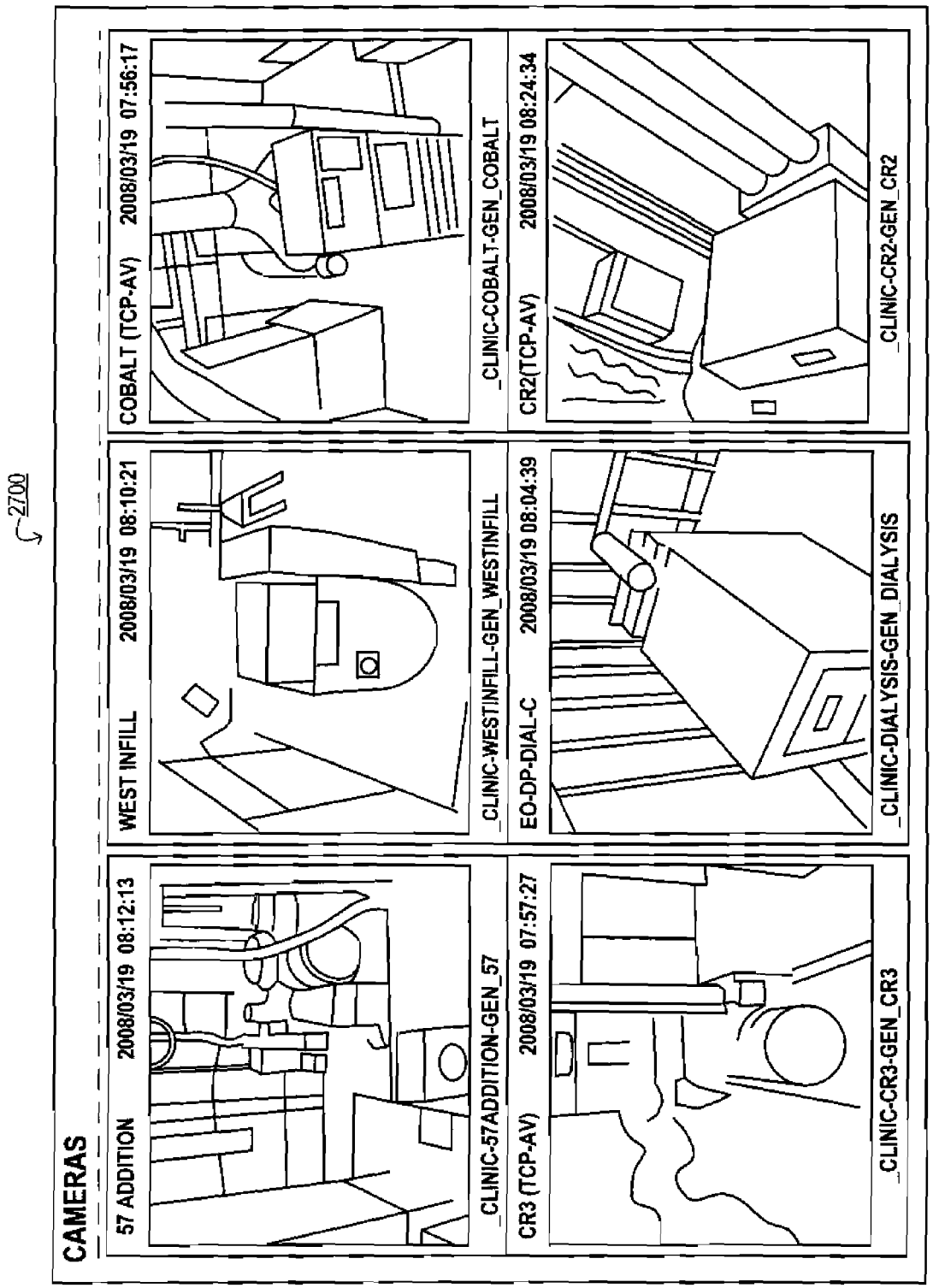
FIG. 27 illustrates an embodiment of a combined multimedia display for showing live audio and video feeds for a plurality of generators and other EPSS equipment over a plurality of EPSS's at a site or facility.

A further terminal display contemplated within embodiments of the present system is a combined multimedia display 2700, as shown in FIG. 27, for delivering live audio and video feeds for a plurality of generators 165 and other EPSS equipment over a plurality of EPSS's at a site or facility. Generally, the combined multimedia display 2700 includes a plurality of individual multimedia displays 2562 similar to the generator display shown in FIG. 25A. The combined multimedia display 2700 enables a system user to view many or all generators 165 or other items of EPSS equipment across a facility in one comprehensive view.

Still another terminal display contemplated within embodiments of the present system is an EPSS equipment roll-up view 2800, as shown in FIG. 28, for listing all items of EPSS equipment at a given site. As shown, the "Comm's Status" tab 2805 is selected in the terminal display, indicating a view of the communication status between items of EPSS equipment and the overall management computer system 60. Generally, the equipment roll-up view 2800 lists all items of EPSS equipment at a given facility. When one or more items of EPSS equipment lose connection with the management computer system 60, either due to a network outage, cut communication line, or for some other reason, the status indicator(s) 2815 associated with those items of equipment will indicate a loss in communication. In various embodiments, the indicators 2815 may indicate a connection loss via a flashing light, change in color, or some other alerting mechanism.

Figure 29:
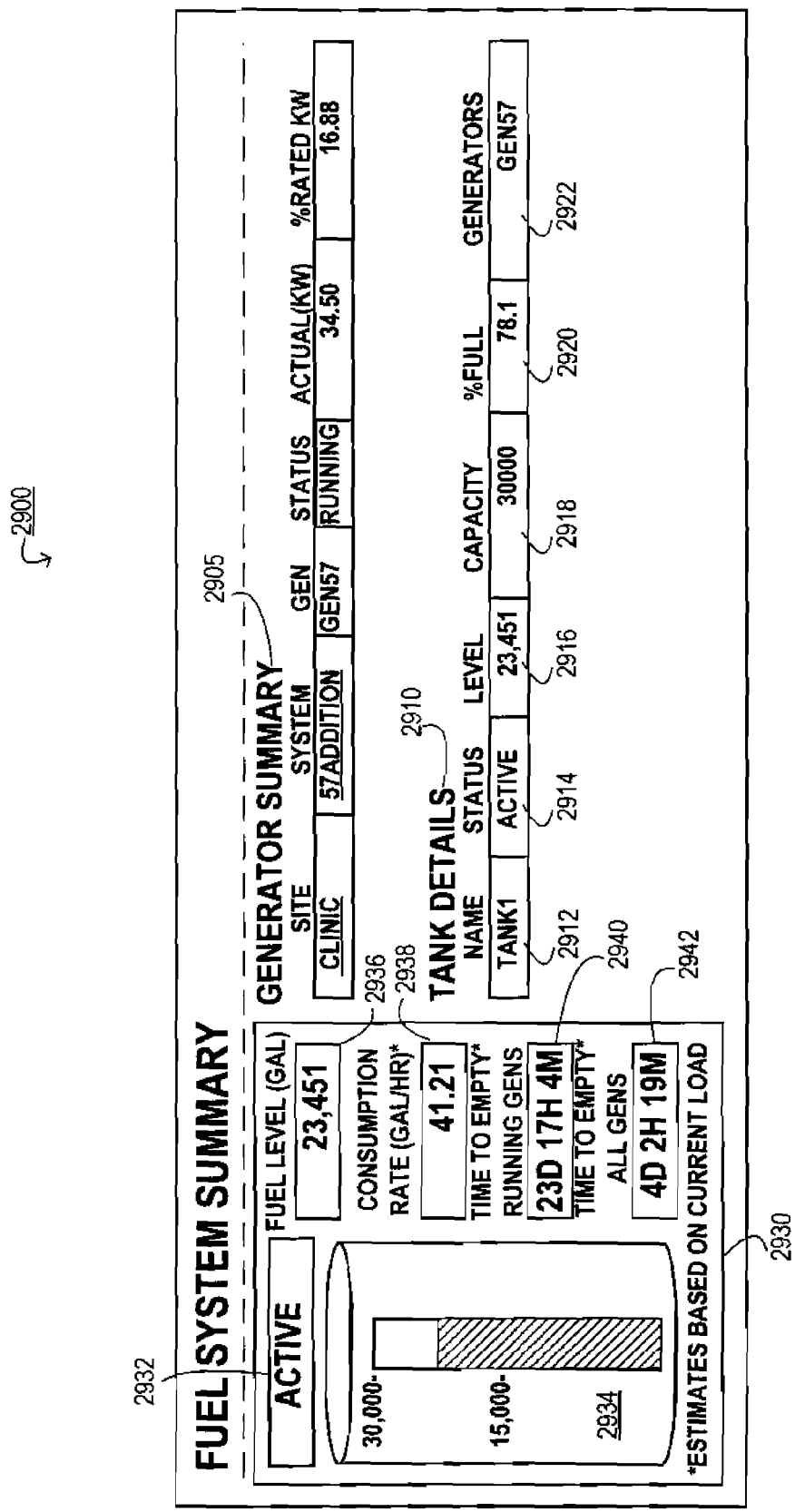
FIG. 29 is a terminal display of a fuel system summary for a fuel tank that supplies EPSS equipment at a site according to an embodiment of the present system.

In one aspect, the configured EPMS 10 provides predictive capabilities, such as predictive fuel consumption, performance of EPSS equipment over time, average durations of power outages, seasons of the year when power outages are more frequent, and other similar predictive measures. By way of example, FIG. 29 shows a terminal display of a fuel system summary 2900 for a fuel tank that supplies EPSS equipment at a site. As shown, "Generator Summary" field 2905 lists all generators 165 currently operating and drawing fuel from the noted fuel tank. As will be understood, while only one generator 165 is listed in the "Generator Summary" field 2905 in FIG. 29, many generators may be included if more than one generator is actively drawing fuel from the fuel tank. The information contained in "Generator Summary" field 2905 generally includes the specific generators 165 using fuel from the fuel tank, the site and EPSS corresponding to each generator, the power being produced by each generator, the percentage of rated power being output by the generator, and any other data that the user desires related to the generator(s).

Still referring to FIG. 29, the "Tank Details" field 2910 displays data associated with the selected fuel tank. The "Name" region 2912 indicates the name given to the selected fuel tank during the site survey (step 1805), and the "Status" region 1914 shows the status of the tank. As shown, the status of the fuel tank is "ACTIVE", indicating that fuel is currently being drawn from the tank. As will be understood, other status indicators may be used as well, such as "READY", "MAINTENANCE", "EMPTY", and other similar indicators. Generally, the "Tanks Details" field 2910 also includes a "Level" region 2916 that shows the fuel level in the fuel tank (in gallons or some other similar measure). Also included is a "Capacity" region 2918 that displays the capacity of the fuel tank, as well as a "% Full" region 2920 that shows what percentage of the fuel tank is full. Additionally, "Generators" region 2922 lists the generators 165 supplied by the given fuel tank.

On the left side of the embodiment of the fuel system summary 2900 is predictive fuel data field 2930. Generally, predictive fuel data field 2930 includes a status indicator 2932, and a graphical representation of the fuel tank 2934 showing the fuel level currently contained in the tank. The actual fuel level is displayed in numerical form in "Fuel Level" region 2936. The consumption rate of fuel currently being consumed from the fuel tank is also displayed in "Consumption Rate" region 2938. In one embodiment, the consumption rate is determined by fuel sensors (i.e. data acquisition equipment) installed in the fuel lines leading to the generators 165 at the facility that measure the consumption rate of fuel when the generator is running. In another embodiment, the consumption rate is calculated by the management computer system 60 based on the amount of fuel consumed by a generator 165 when it is operating to supply power to a given load over a certain time span. Thus, the management computer system 60 determines the average consumption rate for given loads for each generator 165 based on the actual consumption data collected over time.

Once the consumption rate is determined, the total volume of the fuel tank is divided by the consumption rate to determine the time left until the fuel tank will run out of fuel if all current generators 165 continued to operate. This value is displayed in predictive fuel data field 2930 in "Time To Empty*Running Gens" region 2940. The value shown in region 2940 is a prediction of how long the EPSS's connected to the particular fuel tank can produce power at the current load if all of the currently-running generators continue to run, and no other generators begin operating. As will be understood, this value 2940 will change in real time as new generators 165 begin to run or already-running generators stop running. In one embodiment, predictive fuel data field 2930 also includes a measure of the time remaining until the fuel tank becomes empty if all connected generators startup and begin operating to provide power to the facility. This value is displayed in "Time To Empty*All Gens" region 2942. To calculate the value shown in region 2942, the management computer system 60 calculates an average estimated consumption rate as if all generators were running based on logged historical data of consumption rates for given loads for all generators 165 at the facility. The total volume of the fuel tank is then divided by the average estimated consumption rate of all generators 165 to determine the time left until the fuel tank will run out of fuel if all facility generators begin operating.

Using the predictive fuel capabilities described above, a facility can accurately predict how long it can operate on emergency power, which may be particularly helpful during emergencies, natural disasters, and the like. Further, aspects of the present system provide other predictive capabilities as well. For other predictive aspects, data is collected and stored over time to provide information as to general trends and patterns that would not be otherwise be known. For example, data may be collected as to what times of year are more likely to experience power outages (e.g. winter-time experiences more outages), such that a facility can replenish fuel tanks, provide routine maintenance, and other complete other tasks before these more frequent outage times occur. Or, historical data may reveal that power outages occur far more frequently in the late afternoon, such that a facility can be more wary during those times. Additionally, historical data may reveal that a particular manufacturer or particular model of EPSS equipment is more likely to fail or malfunction over time, and thus future ordering of equipment can be tailored so as to avoid that equipment. As will be understood by one of ordinary skill, embodiments of the EPMS 10 may be used to collect and record a wide array of information from EPSS equipment that may be useful to a site or facility, and the information collected and predictive analyses performed are not limited to those described herein.

Interface Module

Generally, embodiments of the interface module 40 comprise intelligent devices capable of receiving EPSS operational data from data acquisition equipment or control panels at items of EPSS equipment, normalizing and organizing that data, and transmitting the data to the management computer system 60 for further processing and display. As described, embodiments of the EPMS 10 provide unified viewing, monitoring, testing, and other capabilities of a plurality of items of EPSS equipment of varying models manufactured by a plurality of manufacturers. Because of this variance in EPSS equipment, different signals and outputs are often received from the items of equipment. For example, some items of EPSS equipment may have been configured during the system design automation 1800 with data acquisition equipment, whereas other items of equipment may comprise "intelligent" EPSS equipment that is manufactured to include all necessary sensing equipment. Thus, the intelligent equipment may be preconfigured to include a control panel (or "controller") that collects EPSS operational information from the EPSS equipment and converts that information into a different format than that produced by the retrofit data acquisition equipment. Additionally, some equipment may provide data in different units (e.g. ° C. or ° F.) with different variances and tolerances. Accordingly, this varying EPSS information should be standardized and normalized by the interface module 40 or modules to enable efficient, real time processing and display of the information to system users.

In one embodiment, an interface module 40 is a remote terminal unit (RTU), programmable logic controller (PLC), or other similar intelligent device embedded with software capable of performing normalization and transmission functions of EPSS operational information. Generally, the interface module 40 includes a microprocessor, program memory, and data memory to carry out the processing functions of the embedded software. The interface module 40 also typically includes a communication bus (such as the ModBus® communications protocol) to provide communication between the interface module and the servers 105, 2305 within the management computer system 60. Additionally, some embodiments of the interface module 40 include a firewall for providing secured access to EPSS information as well as the EPSS equipment itself. Also physically included on the interface module 40 are sensor inputs and data outputs for, respectively, receiving EPSS operational data from the EPSS equipment and transferring the processed data to the management computer system 60. In additional embodiments, the interface module 40 may include other components not described herein as will become apparent to those of ordinary skill in the art.

Figure 30A:
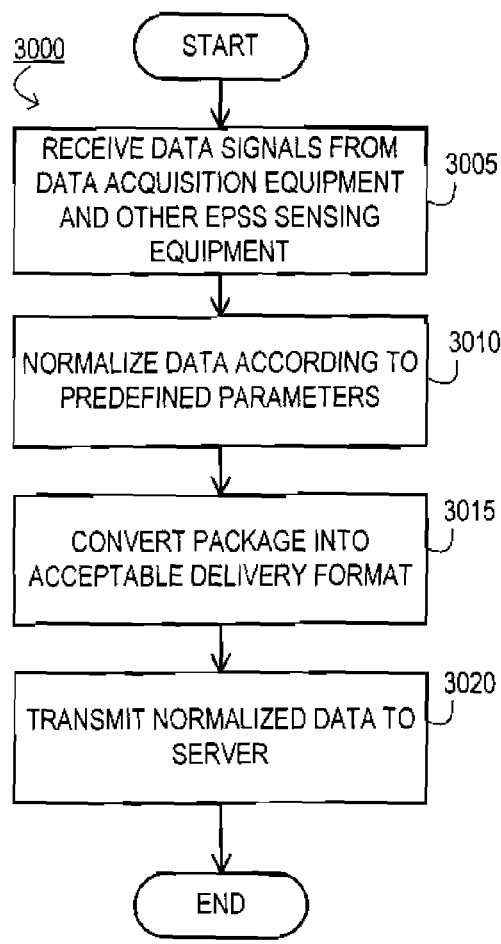
FIG. 30A is a flow chart showing the basic functional operations of one embodiment of the interface module to receive, normalize, and transmit EPSS operational data to the management computer system.

Referring now to the processes of the interface module 40, FIG. 30A is a flow chart 3000 showing the basic functional operations of one embodiment of the interface module for receiving, normalizing, and transmitting EPSS operational data to the management computer system 60. At step 3005, the interface module 40 receives signals and data from one or more items of EPSS equipment. As described, these signals may be in varying formats depending on the type of EPSS equipment from which the EPSS operational information is collected. The EPSS operational data may be received directly from data acquisition equipment installed on the EPSS equipment during system design automation 1800, or from control panels connected to intelligent EPSS equipment, or directly from data sensors manufactured into the equipment, or from some other informational delivery source. Thus, the interface modules 40 should include functionality capable of connecting to and recognizing all of these disparate data sources.

At step 3010, the received EPSS operational data is normalized according to predefined parameters. Essentially, if raw operational data is normalized to one standard format, set of units, etc., then subsequent processing and displaying of the data is made easier, faster, and more efficient. Accordingly, it is beneficial for the management computer system 60 to receive standardized generic generator data, or standardized generic ATS data, for example, as opposed to varying types of data from different makes and models of EPSS equipment. Thus, the interface module 40 includes proprietary embedded software that performs normalization functions. In one embodiment, configuration flags for each specific manufacturer and model of EPSS equipment are sent to the interface module(s) 40 from the servers 105, 2305 such that the interface module(s) can recognize the type of data they will receive from each piece of connected equipment. The configuration flags are predefined based on prior recognition and knowledge of different types and models of equipment used in the field, and what types and formats of data will be transmitted from those models of equipment. Therefore, the interface module 40 is essentially "told" by the servers 105, 2305 what types of signals and data to expect from each type of equipment, such that the interface module can intake and normalize the received information accordingly.

In one embodiment, rather than being told by the servers 105, 2305 what types of data to expect from each type of EPSS equipment, the interface module(s) 40 can auto-detect the type of equipment to which they are connected. Generally, in this embodiment, the interface module(s) 40 engage in an iterative process with the EPSS equipment to determine what type of equipment the module(s) are connected to and what kinds of signals to expect from the equipment.

Continuing with discussion of step 3010 in FIG. 30A, once the interface module(s) 40 understand what type of signals they will receive from each type of EPSS equipment, the modules can transform those signals into standard, unified outputs for each category (e.g. ATS, generator, fuel supply, etc.) of equipment. For example, received data may include varying communication formats, be in different units, or be in different registers. Additionally, the data may need to be scaled to a common value, or require some other type of transformation. Regardless, the software included in the interface module(s) 40 is programmed to include the intelligence to normalize the data into generic "ATS data" or "generator data" or some other standard type of data. Thus, all data being output by the interface module 40 fits in a common category that is easily recognizable by the management computer system 60.

Once the EPSS operational data has been normalized, the data is converted into an acceptable delivery format (such as a data packet) (step 3015) and transmitted to the management computer system 60 (step 3020). After it is received at the management computer system 60, the data is further processed, stored, and displayed to system users via terminals 45, 47, interface 55, reports, or some other presentation mechanism.

Figure 30B:
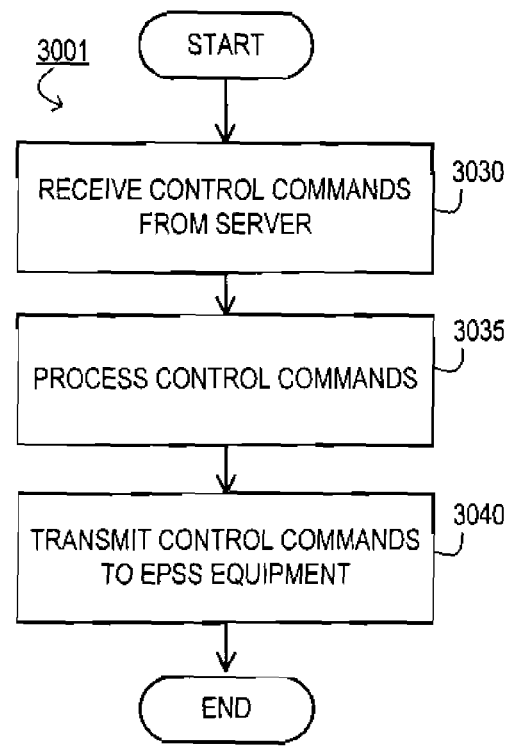
FIG. 30B is a flow chart showing the basic functional operations of one embodiment of the interface module to receive testing and control commands from the management computer system and transmit those commands to the EPSS equipment.

In addition to transmitting data from EPSS equipment to the management computer system 60, the interface module(s) 40 also receive commands from the servers 105, 2305 to carry out certain processes on the EPSS equipment. FIG. 30B is a flow chart showing the basic functional operations of one embodiment of the interface module 40 to receive testing and control commands from the management computer system and transmit those commands to the EPSS equipment. At step 3030, the interface module 40 receives one or more control commands from the servers 105, 2305 within the management computer system 60. The commands may be for one or more items of EPSS equipment to which the interface module 40 is connected to startup and begin operating for purposes of a test. Or, the commands may be to disable the EPSS equipment so that maintenance work may be performed on it. As will be understood, virtually any command relating to operation of the EPSS equipment is contemplated within embodiments of the present system.

Regardless of the command or commands received by the interface module 40, the module processes the commands into a format understandable by the EPSS equipment (step 3035), and transmits those processed commands to the EPSS equipment (step 3040) to carry out the desired function(s). In this way, a system user or operator may actively control specific items of EPSS equipment remotely via the operative EPMS 10.

Testing EPSS Equipment Via Configured EPMS

As mentioned previously, it may be beneficial to routinely test EPSS equipment to ensure it is functioning properly in the event of an emergency. For some facilities (e.g. hospitals), frequent and routine testing of EPSS equipment is required by federal agencies to receive federal funding or even to continue operating. For example, the Joint Commission (formerly JCAHO) requires each health care facility to implement an emergency power testing program that includes generator 165 load testing and overall EPSS maintenance. Along those lines, the National Fire Protection Association (NFPA) establishes codes and standards on the minimum testing requirements of EPSS equipment. Even if not required by a federal or state agency, many facilities actively wish to test their EPSS equipment so as to ensure that the equipment is operating appropriately should it be needed during a power outage, or simply to gather runtime performance data or reports.

Embodiments of an emergency power management system (EPMS) 10 as described herein enable remote testing of EPSS equipment, real time viewing of that equipment and associated testing data via a terminal display while testing occurs, and generation of test reports for compliance purposes or otherwise. Generally, there are four types of tests associated with embodiments of the present system automatic load tests, automatic no load tests, manual load tests, and manual no load tests. Additionally, in one embodiment, an emergency situation may be used as a test for compliance purposes. The details and processes associated with these tests will be described in greater detail below.

Automatic Load Test

Generally, an automatic load test (ALT) is a test of one or more items of EPSS equipment that is initiated via a terminal display or user interface in which the selected EPSS equipment is used to actually power a portion of a facility during the test. According to one embodiment, to begin an ALT a system user simply clicks on the "Test Setup" button in the test controls field 2530 of tabular EPSS view 2501 (shown in FIG. 25A). When the "Test Setup" button is selected, a test setup screen 3100 is displayed to a user via a terminal display, as shown in FIG. 31. The test setup screen 3100 includes selectable and finable parameter regions for setting the parameters that will be associated with a given test. As will be understood, the test setup screen 3100 may be accessed by navigating through other displays and screens, and does not necessarily have to be accessed through test controls field 2530.

As shown in FIG. 31, test setup screen 3100 includes "Test Type" region 3105 for selecting the type of test that will be initiated. Embodiments of "Test Type" region 3105 may include a variety of tests, including load and no load tests, recurring tests, one-time tests, and other similar types of tests. Test setup screen 3100 also includes "Test Group" region 3110 which enables a user to select the specific EPSS, group of EPSS's, or specific items of EPSS equipment to be tested. "Test Group" 3110 is beneficial because it provides a user the ability to test only certain items of equipment within an EPSS (such as only half of the ATS's 160, for example) rather than testing the entire EPSS.

Embodiments of the test setup screen 3100 also include an "Initiating ATS" region 3115 which allows a user to select a specific ATS 160 within a selected test group to initiate the test. For some compliance testing purposes, it must be shown that each ATS 160 within an EPSS can start the generator(s) 165 in the EPSS and switch the associated load to generator power. Accordingly, embodiments of the EPMS 10 will store and maintain a log of which ATS's 160 have been tested previously or most recently, and will "suggest" that an ATS that has not been used to initiate a generator 165 recently be used to do so. As will be understood, a system user can override this suggestion if desired.

Further, after the "Initiating ATS" region 3115 has been set, the user then fills in the "Load Test Transfer Time Offset" region 3120 and the "Transfer Block Size" region 3125. The "Load Test Transfer Time Offset" region 3120 corresponds to the time to delay (generally in seconds) the transfer of subsequent ATS's 160 in the test group after the initiating ATS has switched. The "Transfer Block Size" region 3125 indicates the number of ATS's 160 that will start simultaneously after waiting for the transfer time offset. As will be understood, these regions 3120, 3125 will be inapplicable during a no load test because an ATS 160 is not used to actually switch from utility to emergency power during the test. As will also be understood, these regions 3120, 3125 will not apply when only a single ATS 160 is being tested.

Test setup screen 3100, as shown in FIG. 31, also includes 30% load rule selectable region 3130, which enables a user to mandate whether the tested generator(s) 165 must reach 30% of their rated loads before the test may continue. For compliance purposes, some agencies (e.g. NFPA) require that the tested generators 165 reach this 30% rated load value before the test may be used as a valid test. When 30% load rule region 3130 is selected, the EPMS 10 will wait to start the test until the associated generator(s) 165 reach 30% of their rated load value. If, after a predetermined amount of time, the generator(s) 165 fail to reach the 30% value, the test will be aborted and a notification alarm will be sent to the system user. If the test does begin, but the load drops below 30% at any time during the test, then the test will continue, but a similar notification alarm will be sent. As will be understood by one of ordinary skill, while a 30% load value is discussed herein, other rated load percentages may be used as testing parameters within embodiments of the present system.

Once all testing parameters have been selected by the system user, the user clicks "Next" button 3135 and returns to a terminal display (such as tabular EPSS view 2501) that includes test controls field 2530. The user can then select the "Run Test" button within test controls field 2530 to begin the selected test. Additionally, the user can view the selected EPSS equipment to be tested via a multimedia display 2562 prior to testing to ensure it is safe to proceed with testing. Once the "Run Test" button is selected, the test begins according to the selected parameters in test setup screen 3100. While the test is occurring, live data relating to all tested EPSS equipment is collected, stored, and displayed to a user in virtually real time via a terminal display, such as any of the displays shown in FIGS. 24A-B, 25A-B, 26, and 27 discussed herein.

Figure 32:
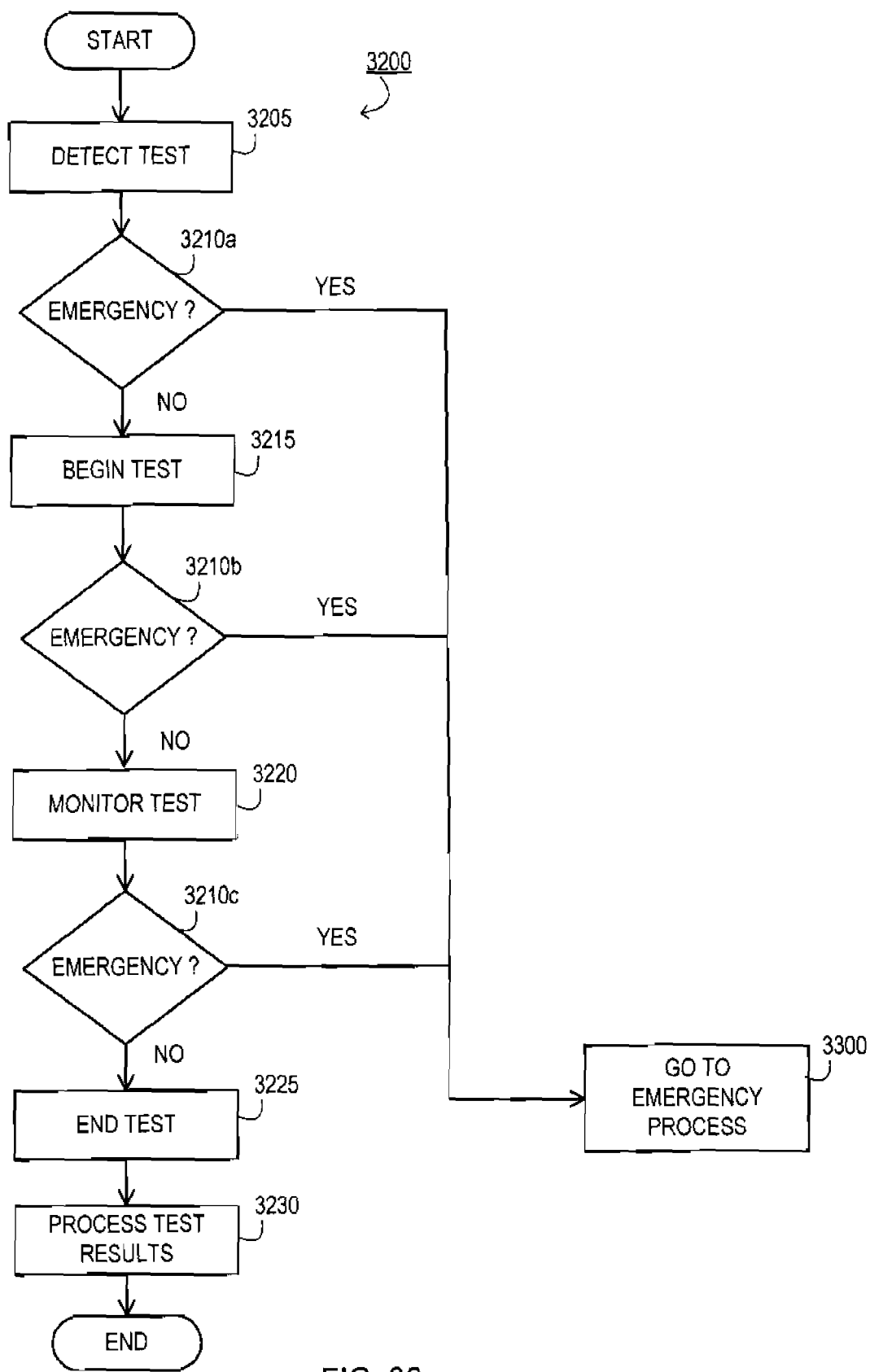
FIG. 32 illustrates a flow chart listing the steps involved in one embodiment of a testing process for testing EPSS equipment.

Referring now to FIG. 32, a flow chart is shown listing the steps involved in one embodiment of a testing process 3200 for testing EPSS equipment. These steps will first be described in accordance with an automatic load test. In one embodiment, once a test has been initiated by a user via the test setup screen 3100 and corresponding "Run Test" button (or other similar controls), the management computer system 60 detects that a pending test command has been generated (step 3205). The system 60 then inserts a test record into a test log indicating a test has been initiated. At step 3210a, the system 60 checks to ensure that an emergency situation is not occurring. If, at any point during a test, an emergency is detected, the system will abort the test and process the emergency event according to emergency process 3300 (described in greater detail below).

After the management computer system 60 has verified that no emergency currently exists, the system moves to begin test step 3215. At step 3215, the system 60 creates a database record including information related to the test, such as a test title, the system user, the specific EPSS (or EPSS's) tested, the test group, the initiating ATS, an email address of the user, and other similar information. The system 60 also creates a test record for each ATS 160 and each generator 165 being tested. The ATS test record generally includes a unique test identifier for the test, a definition of the server upon which the tested EPSS is defined, and the given name of the ATS. The generator test record generally includes similar information as the ATS test record, with additional information related to engine run time hours. After these records have been created and the test start criterium have been met, the system 60 retrieves starting live values for EPSS operational information and data, as well as other data, such as the start date and time of the test.

Still referring to an embodiment of step 3215, after the system 60 records the starting values for the EPSS equipment, the system then sends a start command through the interface module 40 to the initiating ATS to initiate the test. Once the system 60 detects a generator 165 is running, an entry is inserted into the test log indicating the start time of the generator. The system 60 also generally detects and records when all ATS's 160 have switched from utility to emergency power. All associated times (e.g. command received, test initiated, generator running, ATS's switched over, etc.) are stored in a database 110, 2310 for subsequent processing and reporting. In some embodiments, all generators 165 must have started and all ATS's 160 must have switched to generator power in order for the collected data to qualify for compliance testing purposes. Additionally, in some embodiments, if certain parameters are not met, then the test is aborted. For instance, if one or more of the generators fail to startup and begin running, or if one or more of the ATS's fail to switch over, then the test will be aborted and an alarm notification sent to the system user.

Still referring to FIG. 32, at step 3210b the system 60 again checks whether an emergency event is occurring. If so, then the test is aborted and emergency process 3300 is initiated. If not, then testing process 3200 continues to step 3220, monitoring the test. During step 3220, the system collects all active EPSS operational data and displays the data to the user. The EPSS operational data is also continually recorded on a database 110, 2310 for use in generating subsequent operational and compliance reports.

At step 3210c, the system 60 again determines whether an emergency is present, and if none is, end test step 3225 of testing process 3200 is activated. During end test step 3225, the system 60 logs a data record as the final or end data record for the EPSS equipment in the test, and then sends a stop command to the ATS's 160 to stop the test. The system 60 then waits for the normal power breaker to close, and for all ATS's 160 to retransfer back to utility power. The system 60 also waits for all generators 165 to stop running and cool down. Generally, the management computer system 60 will record the ATS retransfer time, generator stoppage time, generator cool down time, and any other similar times as will occur to one of ordinary skill. Once all generators 165 have cooled down, the system 60 processes the test data and generates one or more test reports (step 3230) (discussed in greater detail below).

In some embodiments, the tested EPSS's will include only ATS's 160, and no generators 165. In these cases, the ATS's 160 may switch power to emergency power, but receive that emergency power from either a generator or utility power feed from another EPSS. Thus, in some load test embodiments, only ATS's will be tested.

Automatic No Load Test

Generally, an automatic no load test (ANLT) is a test of one or more items of EPSS equipment that is initiated via a terminal display or user interface in which the selected EPSS equipment to be tested does not actually power any portion of a facility during the test. Typically, during an automatic no load test only generators 165 are tested (i.e. ATS's 160 are not tested). Thus, in one embodiment, an ANLT follows the same process and includes the same steps as the ALT described in conjunction with FIG. 32, except that power to the facility is never transferred from utility to generator power, and only data relating to generators 165 is collected and stored. Additionally, to startup the items of EPSS equipment that are part of the test, a signal is sent directly to the generator(s) 165 (via the interface module 40) rather than to the ATS's 160.

Manual Load Test

A manual load test (MLT) is similar to an automatic load test, except that a manual load test is initiated physically at the specific items of EPSS equipment to be tested rather than remotely through a terminal display or user interface. Thus, in one embodiment, a MLT follows the same process and includes the same steps as the ALT described in conjunction with FIG. 32, except that the EPSS equipment is physically activated at the equipment by turning the equipment on. Specifically, in one embodiment, the test is initiated from a dry contact point at an initiating ATS 160. Once the equipment has been activated, the test follows the same steps and processes for an ALT as described in testing process 3200.

Manual No Load Test

A manual no load test (MNLT) is similar to an automatic no load test, except that a manual no load test is initiated physically at the items of EPSS equipment rather than remotely through a terminal display or user interface. Just as with the MLT, the EPSS equipment in an MNLT is physically activated at the equipment rather than via a command signal from the management computer system 60. However, unlike a MLT, the ATS's 160 are not operated, and only the generator(s) 165 are turned on and tested. Once the generator(s) 165 have been activated, though, the MNLT follows the same process as described above for the ANLT.

Emergency Process

As mentioned previously, many facilities either desire or are required to complete a multiplicity of performance and compliance tests on their EPSS equipment every year. These tests can be a drain on time and resources due to the significant amount of fuel costs required to operate the generator(s) 165, personnel needed to run the tests, equipment wear and tear, and other similar resources required to complete these tests. Accordingly, one embodiment of the present system enables a facility to use an emergency or crisis event as one of its necessary or desired equipment tests. Traditionally, because emergencies are unplanned and unexpected, there is no capability to record data during an emergency. In a present embodiment, however, because EPSS data is continuously monitored and recorded, once an emergency event occurs, the management computer system 60 initiates a test log to record EPSS operational data during the emergency event. If the emergency event lasts for an acceptable duration of time, then once normal power is restored, the data collected during the even can be used as a load test.

Figure 33:
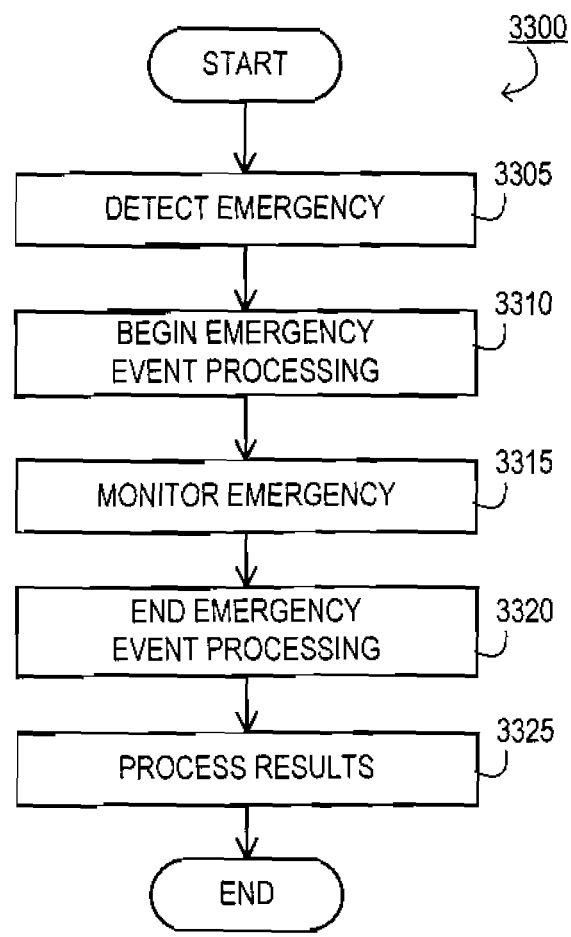
FIG. 33 is a flow chart listing the steps involved in one embodiment of a process for using an emergency event as a valid test of EPSS equipment.

Referring to FIG. 33, a flow chart listing the steps involved in an embodiment of an emergency process 3300 is shown. At step 3305, an emergency event is detected by the management computer system 60. After the event has been detected, emergency event processing is begun 3310. During step 3310, a database record is created for the specific emergency similar to the database record created during test step 3215. Emergency records are also created for the generator(s) 165 and ATS's 160 associated with the emergency event, similar to the test records created during step 3215. During step 3315, EPSS operational data is collected and stored in the emergency records for subsequent processing into a test/emergency report. Once the emergency event ends, the system 60 defines one of the final collected data points as the "final" data point for purposes of the test (step 3320). At step 3325, the EPSS operational data collected during the emergency is processed in a similar manner as the test data processed during step 3230, and the data is used to generate a test report for the given emergency.

Test Reporting

After the EPSS informational data has been collected during a test process 3200 or emergency process 3300, that data may be used to generate a test report, examples of which are shown in FIGS. 34A-D and 35A-D. Specifically, FIG. 34A is a sample generator operational report 3401 for a test of a given generator 165 within an EPSS at a facility. As shown, the report 3401 includes a general informational field 3410 with basic information regarding the reported test, such as the system operator, site, test ID, and other similar information. In the embodiment shown, the generator operational report 3401 further includes a "Pre-Test Checklist" field 3412 detailing that certain items were checked before the test, such as whether the EPSS main circuit breaker was closed, whether protective equipment was utilized, and other similar items. The report 3401 also includes a generator information field 3414 that lists the location, manufacturer, model, rated power, 30% rated power, and other information related to the specific generator 165. Additionally, in one embodiment, the generator information field 3414 shows various time measurements for the specific generator 165 during the given test, such as the engine crank time, engine cool down time, total run time, beginning engine hours, ending engine hours, and other similar measurements as will be apparent to one having ordinary skill.

Also included in the generator operational report 3401 shown in FIG. 34A are generator data field 3416 and engine data field 3418. The generator data field 3416 includes data related to the electrical generator for the particular genset, including voltage measures, current measures, three phase power, percent rated power capacity, and frequency for three discrete data points collected during the test. For compliance purposes, tests are generally required to include three data points—the beginning of the test, midpoint of the test, and end of the test. Thus, the three separate rows shown in generator data field 3416 correspond to these required data points. As will be understood, many more data points with many other generator values may be reported in generator operational report 3401 as desired by a system user.

Generator operational report 3401 also comprises an engine data field 3418 showing data related to the engine (mechanical power source) for three discrete data points collected during the test. The data shown in the engine data field 3418 in FIG. 34A includes battery charger voltage and current, oil pressure, coolant temperature, and exhaust temperature, but may include any other collected values the system user deems important.

FIG. 34B is a sample generator compliance report 3402 generated from the same data collected and used in the generator operational report 3401. The compliance report 3402 includes many of the same fields and values as the operational report 3401, except that because the compliance report is created for purposes of regulatory compliance, it must meet certain standards or guidelines. The generator operational report 3401, on the other hand, is a useful report for the facility's own benefit, and thus the information may be displayed in any form the user desires. In the embodiment of the compliance report 3402 shown in FIG. 34B, the "Pre-Test Checklist" field 3412 has been omitted, as well as some of the information from the generator information field 3414 that was included in generator operational report 3401. Also, the generator data and engine data fields 3416, 3418, have been combined to show one, cohesive report of required generator statistics. The generator data field 3420 shown in FIG. 34B includes the three phase voltage and current for the generator 165 during the test, as well as the frequency and exhaust temperatures. As will be understood, the generator data field 3420 may include any other measures that are required for compliance purposes with varying regulatory bodies.

FIG. 34C illustrates a sample ATS operational report 3403 for a test of several ATS's 160 within an EPSS according to an embodiment of the present system. As shown, the operational report 3403 includes a graphical timeline 3430 showing the time between certain events during the test. For example, graphical timeline 3430 indicates the time at which the test was detected, when the engines of the generator 165 began running, when emergency power reached a necessary voltage to supply the load, when the ATS's 160 switched to emergency power, and when the test ended. For many facilities, the transfer time between utility and emergency power, or the time the generators require until they are producing sufficient power, or many other time measures are important to the efficiency and viability of the EPSS's at a facility. As will be understood, other times and events other than those shown in FIG. 34C may be listed in graphical timeline 3430.

The ATS operational report 3403 also includes ATS data display regions 3435 for each tested ATS that detail information related to the tested ATS's 160, including the three phase voltage, current, and percentage of rated current achieved at three discrete times during the test. Again, just as with generator reports 3401, 3402, it may be important for some compliance requirements to have three discrete data points at the beginning, middle, and end of a test. In the embodiment shown, ATS data display regions 3435 also include transfer delay and retransfer delay times, as well as other information related to each ATS, such as the manufacturer, location of the ATS, etc.

Turning now to FIG. 34D, a sample ATS compliance report 3404 is shown for a test of several ATS's 160 within an EPSS according to an embodiment of the present system. As shown, the tested ATS's 160 are listed in "ATS Description" region 3442, the physical location of each tested ATS is shown in "Location" region 3444, and the specific load controlled by each ATS is described in "Service" region

3446. Also, switch time region 3448 lists the time at which each ATS 160 switched to emergency power and when each ATS switched back to normal power during the test. As will be understood, other measures may be included in compliance report 3404 for each tested ATS 160 depending on the regulatory compliance requirements of each separate facility.

FIGS. 35A-D illustrate examples of other testing reports that may be generated by embodiments of the present system. FIG. 35A is an emergency events report 3501 listing emergency events that have occurred for each generator 165 at a facility over a given time period. As shown, each generator 165 is listed, as well as a start date and end date for each emergency experienced by each generator over the selected time period. Additionally, the engine start hours and engine end hours for each generator 165 are shown (i.e. the total run time the generator has experienced over its lifetime), as well as any comments relating to the emergencies. As will be understood, an emergency events report 3501 may be generated for any desired period of time. As will also be understood, a report 3501 may include only one of a facility's generators, or a selected grouping of generators, or all of the generators at the facility.

FIG. 35B shows a sample generator loaded runs report 3502 listing all loaded uses of each generator 165 at a facility over a given time period. The loaded uses may include manual and automatic tests, as well as emergencies. The embodiment of the loaded runs report 3502 shown in FIG. 35B includes the run type (i.e. MLT, ALT, or emergency) for each loaded use, as well as the run date, prior run date, and days between these dates. The report also shows which (if any) of the loaded runs fall outside of a 20-40 day window between the prior loaded run for the given generator 165. For some compliance requirements (e.g. The Joint Commission), this 20-40 day loaded run window must be tracked and reported to retain federal compliance. As will be understood, the generator loaded runs report 3502 may include any other measures or values collected by the EPMS 10 for any generator loaded runs over the given time period.

FIG. 35C is a sample generator run times report 3503 showing all run times of each generator at a facility over a given time period. As shown, the generator run times report 3503 includes the total running hours for no load tests and load tests of each generator over the given time span. The report 3503 also includes emergency running hours and any other loaded run hours for the time period. The embodiment of the report 3503 further shows the total run time hours for each generator for the given time period.

FIG. 35D illustrates a sample switch operation report 3504 listing all transfers between normal and emergency power for one or more ATS's 160 at a facility over a given time period. As shown, listed under each ATS 160 is each transfer between emergency and normal power for that ATS over the predefined time period, whether that ATS was the ATS that initiated the transfer or test, the date and time of each transfer, and the type of power disruption event that was associated with each transfer. Further, comments may be inserted for each transfer at the system user's discretion. As will be understood, as few as one or as many as all the ATS's 160 at a given facility may be included in a switch operation report 3504.

As will be understood, all of the reports described in association with FIGS. 34A-D and 35A-D may be printed and viewed on paper, or viewed on a computer screen or terminal display, or used via some other similar mechanism.

Figure 36:
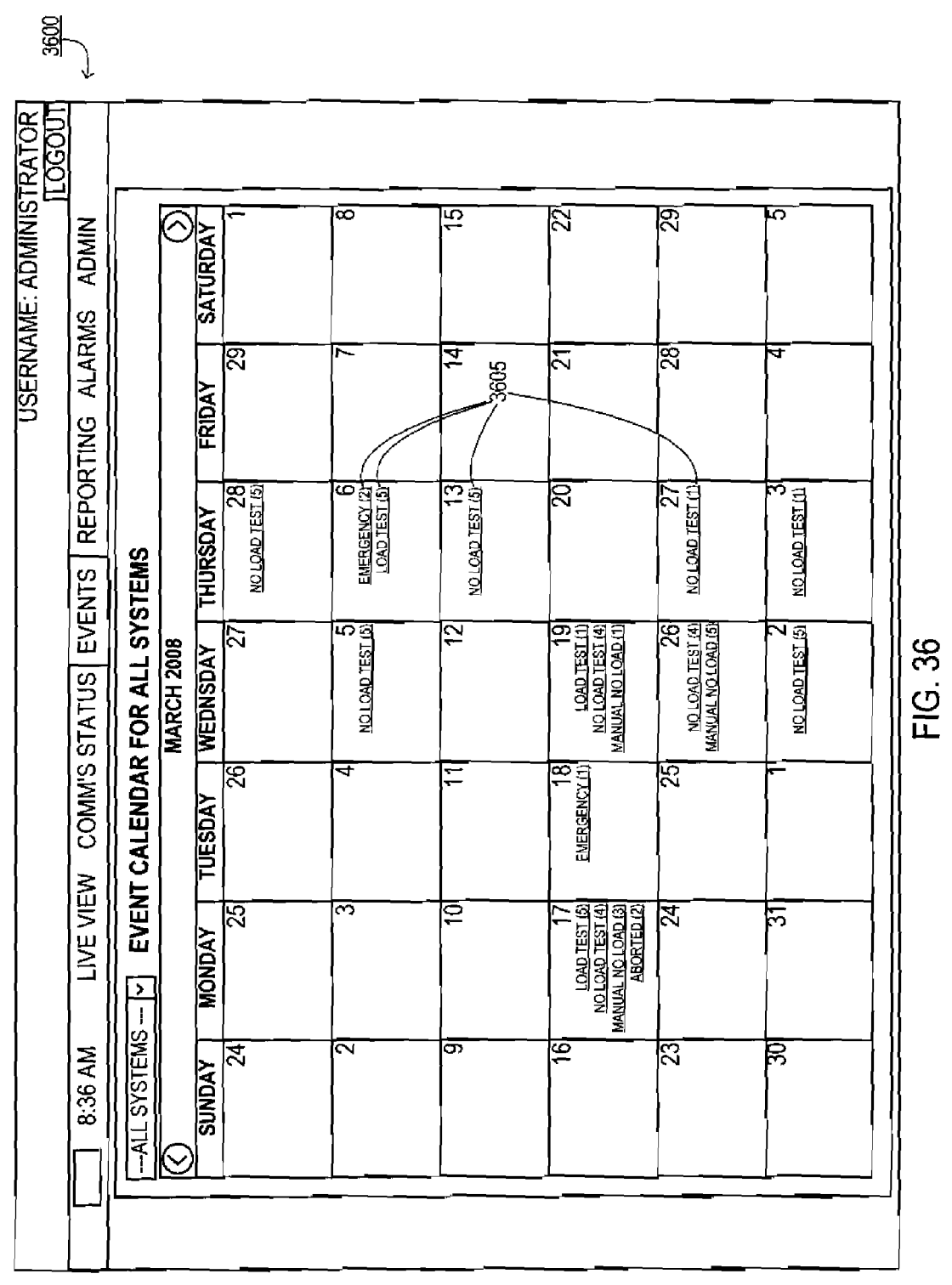

According to another aspect of the present system, an interactive calendar display 3600 is provided via a terminal 45, 47 or graphical user interface for displaying future scheduled tests and past power disruption events. An embodiment of the calendar display is shown in FIG. 36. As shown, the calendar display 3600 includes live links 3605 to past or future power disruption events. By clicking on a live link 3605, a user can view one or more test reports for that test (if it is a prior test or emergency), or view and edit the setup and parameters for a future scheduled test. As one having ordinary skill in the art will understand, the interactive calendar display 3600 may show events for a specific generator 165 or ATS 160, or a specific EPSS, or even an entire facility or facilities. Additionally, the calendar display 3600 may provide a weekly view, monthly view, yearly view, or any other time span the user desires.

The following appendices are intended to be included as part of the disclosure contained herein and are included for purposes of aiding in the understanding of the embodiments and aspects presented in this disclosure. These appendices are not intended to limit the disclosed embodiments and aspects in any way, and are included for illustrative purposes only.

APPENDIX I

BILL OF MATERIALS for Quote 368 - Initial Quote

Hardware

| Part Number | Description | Detail | Quantity |
|---|---|---|---|
| BPH-AIM-PAN-480 | ATS Panel w/ 480VAC | ATS panel w/ 10A 480 VAC power supply/battery backup | 1 |
| BPH-ATS-1 | ATS Metering | 2 Power Meters for ATS power monitoring and shorting blocks | 3 |
| BPH-ATS-2 | Power Monitoring Kit | Power Available sensor package for emergency and normal load and 3 Ph circuit breaker | 3 |
| BPH-CAM | Indoor Generator Camera and Enclosure | Camera for generator real-time video capture | 1 |
| BPH-CT-1200 | 1200A CT | Power Meter CT rated @ 1200 Amps | 6 |
| BPH-CT-300 | 300A CT | Power Meter CT rated @ 300 Amps | 6 |
| BPH-CT-800 | 800A CT | Power Meter CT rated @ 800 Amps | 6 |
| BPH-ENCL-1 | Enclosure - 1 Panel | Nema 12 Enclosure - 1 Panel | 2 |
| BPH-GEN-1 | Generator Sensor Package | Sensor package for retrieving water temp, oil pressure, and exhaust temp | 1 |
| BPH-GIM-PAN-24 | Generator Panel w/ 24VDC | Generator Panel w/ 4A 24 VDC power supply | 1 |
| BPH-SITESERVER-1 | Site Server | Mid-range server dedicated to data collection and management of a local site | 1 |

Software

| Part Number | Description | Detail | Quantity |
|---|---|---|---|
| BPS-ATS | ATS License | ATS software license | 3 |
| BPS-GEN | Generator License | Generator software license | 1 |
| BPS-STD | Standard Master Server License | Standard stand alone software license | 1 |

APPENDIX II

GENERAL INSTALLATION REQUIREMENTS FOR:
ORDER #102 - TEST

Conduit & Wire Requirements
1. All wires to be identified at both ends with numbered, heat shrinkable sleeves
2. #16 or #18 AWG SIS wires with minimum five spares for engine interconnect
3. Three (3) #22 AWG shielded twisted pair for the engine sensors ((1) oil pressure, (1) exhaust temp, (1) water temp)
4. One (1) #22 AWG 4-wires twisted pair for the engine battery CT
5. #16 or #18 AWG SIS wires with minimum five spares for ATS interconnect. Unique wire color per ATS per enclosure recommended
6. #12 AWG SIS (Black and Blue) for 24VDC Battery Voltage power wires
7. Belden 1120A or Similar for the Modbus RS-485 Communication cable (shielded twisted pair)
8. 480 VAC power wires must be separated from 24 VDC signal wires and therefore two conduits must be installed from ATSs requiring 480 VAC wires.
9. #10 AWG SIS (3 colors) for 480 VAC power supply wires connected to load side of ATS
10. ALL 480VAC power wires will include 300V GLQ5 fuses and inline Bussman fuse holders installed on the ATS side of the wires. Spare fuses to be left in each ATS.
11. Cat 5 (or better i.e. 5E, 6, 6E) Ethernet communications cable
12. Drawings show conduit and Ethernet communications cable from the enclosure to the Generator Camera. It is the customers option, alternatively, to run conduit and Ethernet communications cable from the communication closet to the Generator Camera.

Generator / Engine Installation Requirements
1. Engine sensors installed (oil pressure, exhaust temp, water temp, battery CT) and appropriate wires terminated to sensor transmitters
2. Generator signal wires for Engine Running, Engine Not In Auto, and any other digital signals available (Low Oil Pressure Alarm, Hi Water Temp Alarm, Overspeed, Overcrank, etc) to be terminated at the generator
3. Generator power meters installed (if specified)

Enclosure Notes
1. Enclosure are NEMA 12
2. Enclosures with cutout in door are to be mounted in rooms with generators. Enclosure with two cutouts to be mounted in room with two generators
3. Enclosure (1 panel size) require 23"x 20" of wall space for mounting
4. Enclosure (1 panel size) internal dimensions are 23"x 18"x 8"
5. Enclosure (2 panel size) require 23"x 40" of wall space for mounting
6. Enclosure (2 panel size) internal dimensions are 23"x 36"x 8"

APPENDIX II

GENERATOR SENSOR INSTALLATION REQUIREMENTS FOR: ORDER #102 - TEST

Responsible Party: 1

SYSTEM - 57 Addition

LOCATION - Rm 0136 MR

_____ 1. Install Gen_57 engine sensors/connections per connection drawing 'Clinic-57 Addition-Rm 0136 MR-Encl1-Panel1-Interconnect'.

a. Install water temperature RTD (Part#: PRTXA-3-*) per manufacturer specification for jacket water temperature and terminate interconnect wires per drawing.

b. Install oil pressure transmitter (Part#: PX219-300GI) per manufacturer specification for oil pressure and terminate interconnect wires per drawing.

c. Install battery charger CT (Part#: H970LCA) per manufacturer specification on positive charging wire to battery charger and terminate interconnect wires per drawing.

d. Install Exhaust Port Temperature Thermocouple (Part#: NB1-TX903-K-*") per manufacturer specification in desired engine exhaust port location and terminate interconnect wires per drawing.

e. Connect engine running signal(24VDC = on) wire per drawing.

f. Connect engine not in auto signal(24VDC = on) wire per drawing.

g. Connect engine overcrank alarm signal(24VDC = on) wire per drawing.

h. Connect engine overspeed alarm signal(24VDC = on) wire per drawing.

i. Connect engine low oil pressure alarm signal(24VDC = on) wire per drawing.

j. Connect engine high water temperature alarm signal(24VDC = on) wire per drawing.

k. Connect battery charger fault alarm signal(24VDC = on) wire per drawing.

l. Connect engine start signal/contact (optional) wire per drawing.

APPENDIX II

CONDUIT AND CABLING REQUIREMENTS FOR: ORDER #102 - TEST

Responsible Party: 2

SYSTEM - 57 Addition

Rm 0136 MR

\_\_\_\_ 1. Mount enclosure labeled Clinic-57 Addition-Rm 0136 MR-Encl1 per drawing 'Clinic-57 Addition-Rm 0136 MR-Encl1-Layout' and install:

a. Conduit and Cat 5E,6, or 6E cable from communcation closet to enclosure Clinic-57 Addition-Rm 0136 MR-Encl1.

b. Panel Clinic-57 Addition-Rm 0136 MR-Encl1-Panel1 inside enclosure Clinic-57 Addition-Rm 0136 MR-Encl1.

c. Conduit and pull wire from Gen_57 to enclosure per drawings 'Clinic-57 Addition-Rm 0136 MR-Encl1-Layout' and 'Clinic-57 Addition-Rm 0136 MR-Encl1-Panel1-Interconnect'.

d. Gen_57 camera.

e. Camera power to 120 VAC outlet on emergency power circuit.

f. Camera Cat 5E,6, or 6E network cable to an ethernet jack near camera or back to generator enclosure Clinic-57 Addition-Rm 0136 MR-Encl1.

g. Conduit and pull wire from ATS_57 to enclosure per drawings 'Clinic-57 Addition-Rm 0136 MR-Encl1-Layout' and 'Clinic-57 Addition-Rm 0136 MR-Encl1-Panel1-Interconnect'.

APPENDIX II

ATS WIRING AND POWER METERING REQUIREMENTS FOR: ORDER #102 - TEST

Responsible Party: 3

SYSTEM - 57 Addition

Rm 0136 MR

\_\_\_\_\_ 1. Gen_57/Blue Pillar Generator with Meter - Install metering equipment per wiring schematic 'Clinic-57 Addition-Rm 0136 MR-Encl1-Panel1-Gen_57 Meter Wiring'.

a. Mount Gen_57 power meter, CT shorting blocks, and 24VDC fuse per drawing.

b. Install CTs per drawing.

c. Wire CT shorting blocks, CTs, 24VDC fuse, and power meter per drawing.

\_\_\_\_\_ 2. ATS_57/Blue Pillar metering on load side - Install and wire equipment in ATS ATS_57 per 'Clinic-57 Addition-Rm 0136 MR-Encl1-Panel1-ATS_57 Wiring' and 'Clinic-57 Addition-Rm 0136 MR-Encl1-Panel1 Interconnect' drawings.

- Install and wire 24VDC fuse.

- Install and wire two voltage monitor relays and two 3 phase Circuit Breakers in ATS_57 as specified in the ATS wiring schematic 'Clinic-57 Addition-Rm 0136 MR-Encl1-Panel1-ATS_57 Wiring'.

- Terminate signal wires within ATS_57 for 24V Power, Emergency Position Closed, Normal Position Closed, Initiate Load Test Contact, Initiate No Load Test Contact (optional) as specified in the ATS wiring schematic 'Clinic-57 Addition-Rm 0136 MR-Encl1-Panel1-ATS_57 Wiring'.

- Mount ATS_57 power meter(1), CT shorting blocks, and 24VDC fuse as specified in the ATS wiring schematic 'Clinic-57 Addition-Rm 0136 MR-Encl1-Panel1-ATS_57 Wiring'.

- Install CTs per as specified in the ATS wiring schematic 'Clinic-57 Addition-Rm 0136 MR-Encl1-Panel1-ATS_57 Wiring'.

- Connect/terminate load side 3 phase voltage wires to load side meter and load side voltage connections. Terminate corresponding CT shorting blocks, CTs, and 24VDC meter power per drawing. Terminate as specified in the ATS wiring schematic 'Clinic-57 Addition-Rm 0136 MR-Encl1-Panel1-ATS_57 Wiring'

APPENDIX II

PANEL TERMINATION REQUIREMENTS FOR:
ORDER #102 - TEST

Responsible Party: 4

SYSTEM - 57 Addition

Rm 0136 MR

\_\_\_\_ 1. Terminate generator interconnect wires for Gen_57 in Clinic-57 Addition-Rm 0136 MR-Encl1-Panel1 per interconnect drawing 'Clinic-57 Addition-Rm 0136 MR-Encl1-Panel1-Interconnect'.

a. Terminate Gen_57 24 VDC battery wires.

b. Terminate Gen_57 analog sensor interconnect wires for oil pressure, water temperature, exhaust temperature(1), and battery charger CT per drawing.

c. Terminate Gen_57 digital signal interconnect wires for engine running status, engine not in auto status, overcrank alarm, overspeed alarm, low oil pressure alarm, high water temperature alarm, battery charger fault alarm per drawing, and engine start signal output(optional).

\_\_\_\_ 2. Terminate ATS interconnect wires for ATS_57 in Clinic-57 Addition-Rm 0136 MR-Encl1-Panel1 per interconnect drawing 'Clinic-57 Addition-Rm 0136 MR-Encl1-Panel1-Interconnect'.

a Terminate 24 VDC power source connection to 24VDC source which is either an external battery source or other panel within the same enclosure with 24VDC (indicated on drawings).

b Terminate signal wires from ATS_57 in Clinic-57 Addition-Rm 0136 MR-Encl1-Panel1 for 24V Power, Emergency Available, Emergency Position Closed, Normal Available, Normal Position Closed, Initiate Load Test Output, and Initiate No Load Test Output (optional) per drawing.

c Terminate RS-485 communication cable for ATS load side meter per drawing.

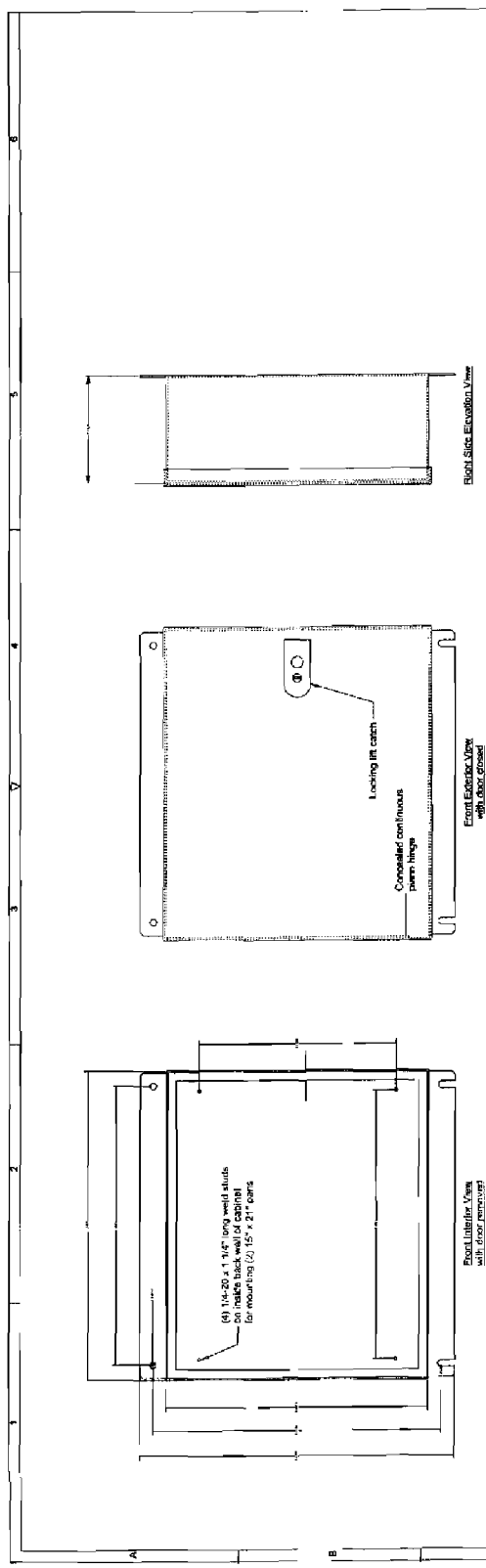
APPENDIX III

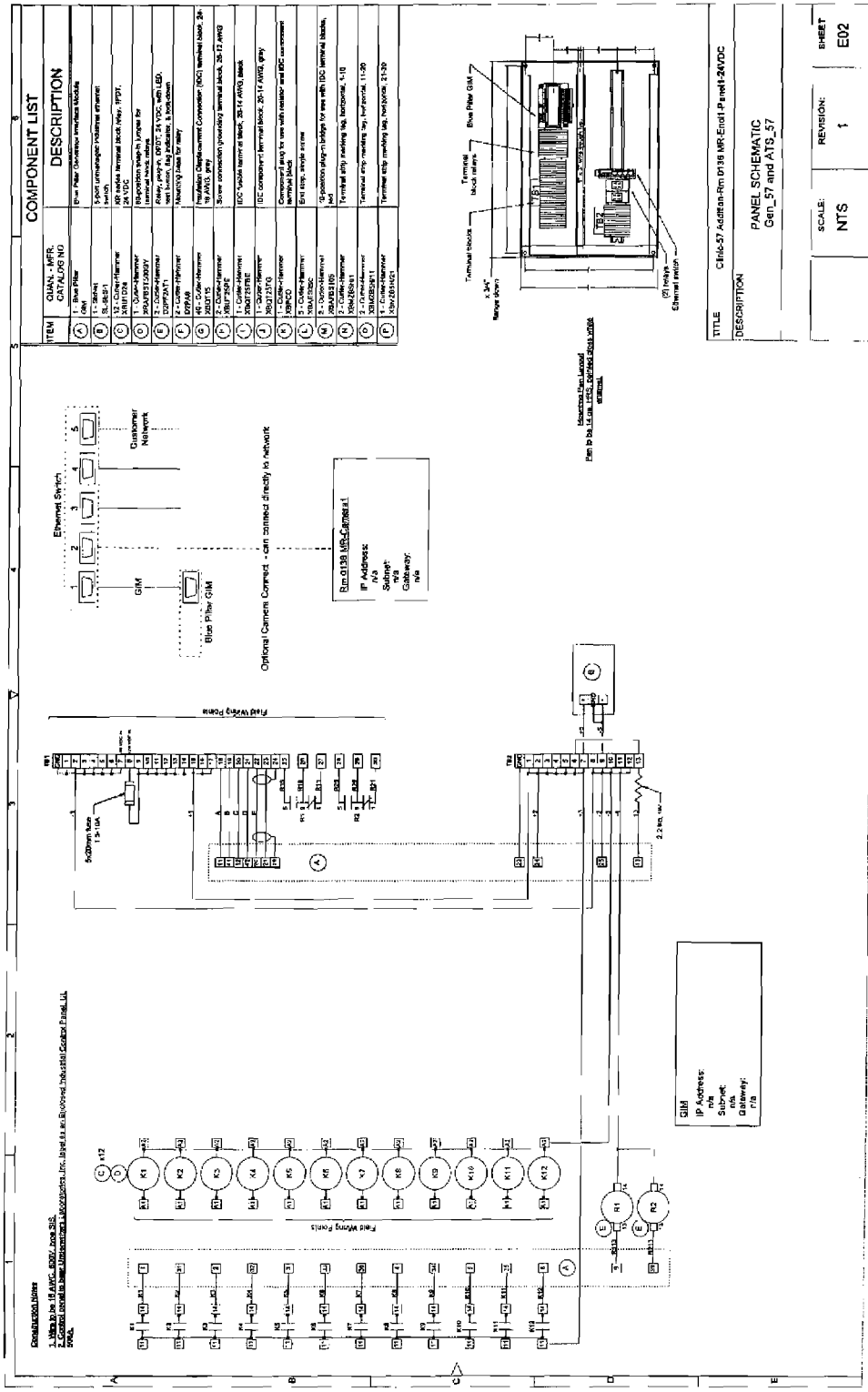
APPENDIX III

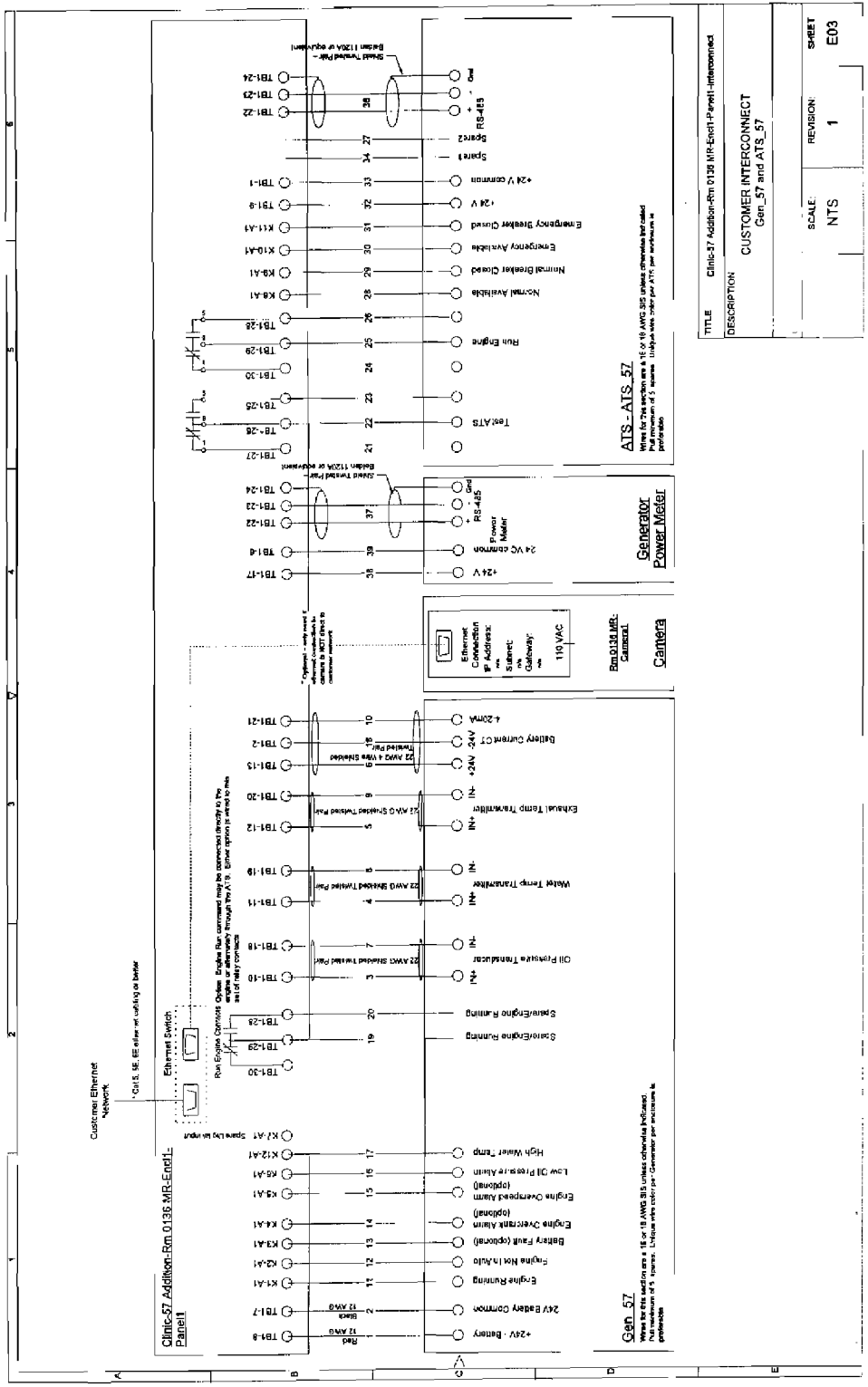

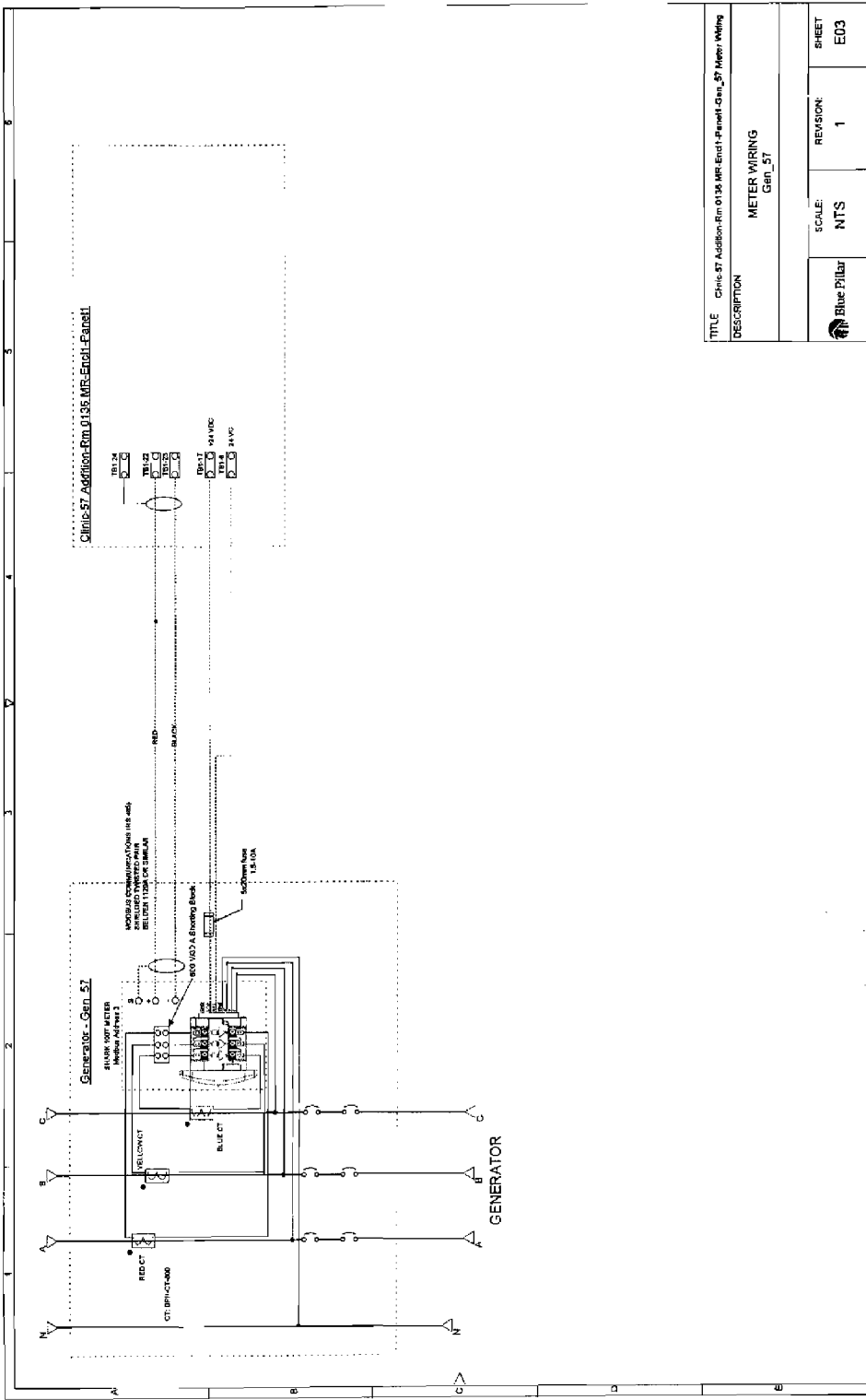
APPENDIX III

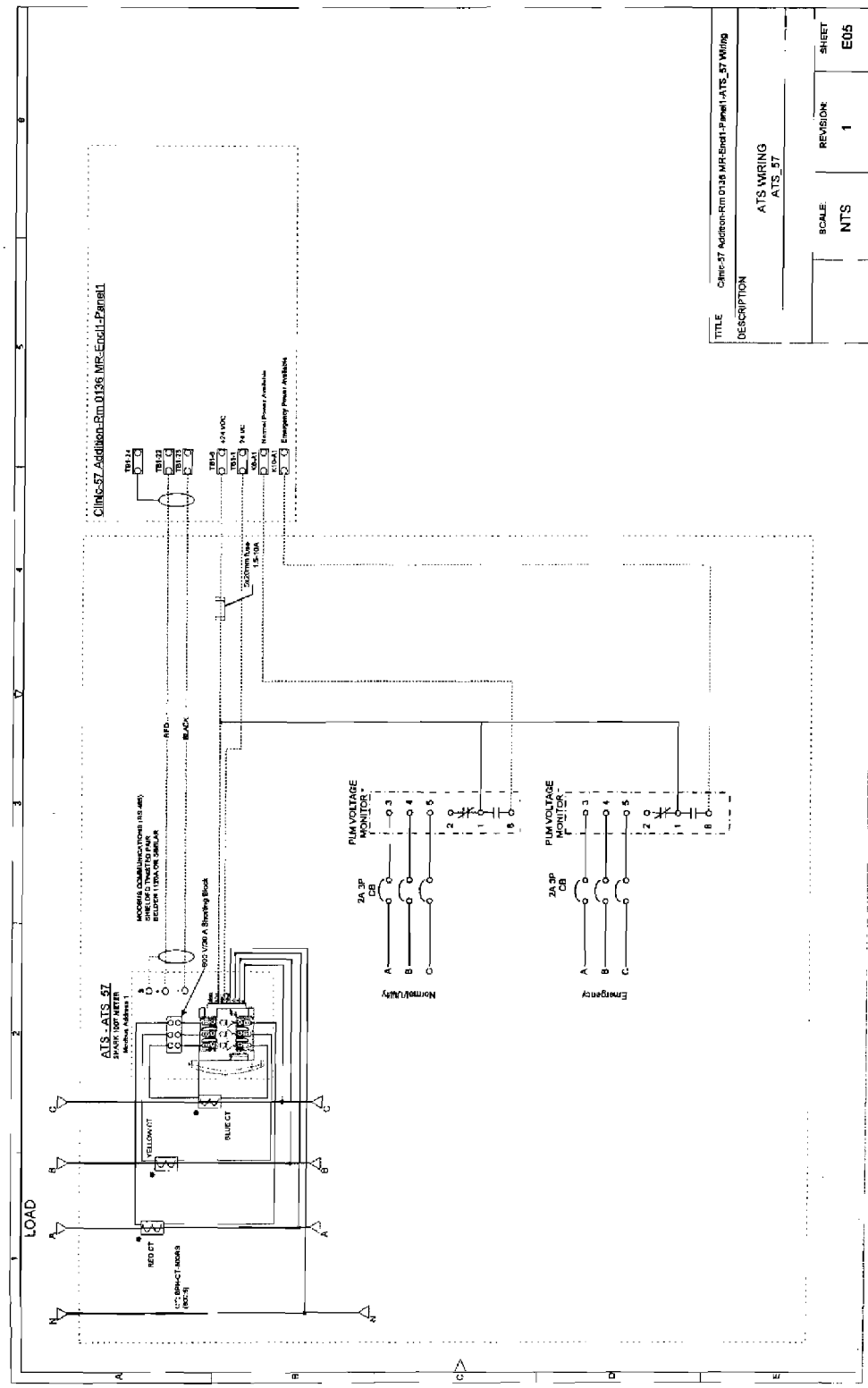
APPENDIX III

APPENDIX IV

Order Information

Clients | Quotes | Configurations | Delivered | Completed | Closed | Invoices | Admin
Initiated | All Mark Order as Delivered

General Information

PO Number
Status Initiated
Quote Id: 316

Title Hospital North – Quote 2
Amount $116,950.00

System Drawings and Work Instructions

Work Instructions: View/Download Current  Regenerate

Schematics: View/Download Selected  Generate New Revision  Refresh Drawing List

Rev1
- Hospital North-Hospital North-2nd FLR Interstitial Space-Encl1_Rev1.vsd
- Hospital North-Hospital North-RM0501 Main Plant-Encl1_Rev1.vsd
- Hospital North-Hospital North-RM0501 Main Plant-Encl2_Rev1.vsd

Vendor Order Information

Gus Berthold Electric Co.
| | | |
|---|---|---|
| S-4308 | 1-pan Enclosure | 2.00 |
| S-4309 | 2-pan Enclosure | 6.00 |
| S-4307 | ATM Panel, 120VAC | 5.00 |
| S-4305 | ATM Panel, 24VDC | 2.00 |
| GMA-10 | Bussman 10A | 12.00 |
| XBQT25F0E | Cutler Hammer 5x20 mm fuse holder | 12.00 |

Lintech Sales
| | | |
|---|---|---|
| EB278045 | 4 Pole Shorting Blocks | 24.00 |
| Shark100T-60-10-V2-D-485P-DIN | Shark 100T-Meter | 24.00 |

Automation Direct
| | | |
|---|---|---|
| WM53D02 | 3 Pole 480VAC Circuit Breaker | 24.00 |

Grainger
| | | |
|---|---|---|
| 5J49 | 3 Phase Voltage Monitor | 24.00 |

SixNet
| | | |
|---|---|---|
| ET-MIX24880-D | EtherTrak Discrete I/O Module | 2.00 |

Flex-Core Div. Morlan and Assoc., Inc.
| | | |
|---|---|---|
| 615-151 | 150A CT | 6.00 |
| FCL1600/5-R | 1600A CT | 30.00 |
| FCL2000/5-R | 2000A CT | 6.00 |
| FCL400/5-4 | 400A CT | 6.00 |
| FCL600/5-4 | 600A CT | 6.00 |
| FCL800/5-4 | 800A CT | 18.00 |

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described in order to explain the principles of the inventions and their practical application so as to enable others skilled in the art to utilize the inventions and various embodiments and with various modifications as are suited to the particular use contemplated. Alternative embodiments will become apparent to those skilled in the art to which the present inventions pertains without departing from its spirit and scope. Accordingly, the scope of the present inventions is defined by the appended claims rather than the foregoing description and the exemplary embodiments described therein.

What is claimed is:

1. An emergency power management system (EPMS) for managing one or more pre-existing emergency power supply systems (EPSS's) at a site, comprising:
    a plurality of items of data acquisition equipment operatively connected to one or more items of EPSS equipment at the site for collecting EPSS operational data from the one or more items of EPSS equipment at the site, wherein the one or more items of EPSS equipment are manufactured by one or more manufacturers;
    a database for storing EPSS inventory information resulting from input of information relating to the items of data acquisition equipment and the items of EPSS equipment at the site, at least some of the EPSS inventory information stored as a configuration file representing properties of the items of data acquisition equipment and properties of the items of EPSS equipment at the site;
    one or more interface modules operatively connected to the plurality of items of data acquisition equipment for receiving the collected EPSS operational data from the plurality of items of data acquisition equipment and operative for transmitting information between the EPPS's and the EPMS, wherein the one or more interface modules also normalize the EPSS operational data for subsequent processing;
    an interactive display of information derived from each of the items of EPSS equipment at the site;
    and an EPMS computer system coupled to the interactive display and operatively connected to the one or more interface modules for receiving the normalized EPSS operational information from the one or more interface modules and storing the normalized EPSS operational information in one or more databases, wherein the EPMS management computer system includes automatically configurable management software comprising a configuration loader/sequencer responsive to access the configuration file stored in the database for determining appropriate handling and display of EPSS operational data from each of the items of EPSS equipment at the site and for processing the normalized EPSS operational data into a predetermined format for display to a user on the interactive display and presenting the interactive display to the user via a user interface;
    the EPSS management computer system further operative, based on information in the configuration file, to configure the one or more interface modules to operatively connect each specific item of EPSS equipment to the EPMS computer system, wherein the one or more interface modules are thereby configured to receive EPSS operational data from the one or more items of EPSS equipment, normalize the EPSS operational data into the predetermined format, and communicate the normalized EPSS operational data to the EPMS computer system, whereby the user utilizes the interactive display of the normalized EPSS operational data to manage the one or more items of EPSS equipment at the site,
    the EPSS management computer system further operative, after collecting EPSS operational data as informational data during a test process, to generate a test report, the test report including a general informational field with basic information regarding the test process, the system operator, site, and test ID, and wherein for a test process conducted for a power generator, the test report further comprises:
    a Pre-Test Checklist field detailing that certain items were checked before the test, the certain items including at least one of whether an EPSS main circuit breaker was closed and whether protective equipment was utilized;
    a generator information field that lists at least one of a location of the generator, manufacturer, model, rated power, and a percentage rated power corresponding to a predetermined load rule;
    and the generator field further including various time measurements for the generator during the given test, including at least one of engine crank time, engine cool down time, total run time, beginning engine hours, ending engine hours.

2. The system of claim 1, wherein the one or more items of EPSS equipment comprise a plurality of predefined EPSS's at a facility.

3. The system of claim 1, wherein the plurality of items of data acquisition equipment are selected from the group comprising: monitoring sensors, connectors required by particular types of monitoring sensors, power supplies, fuel gauges, power meters, gauges, status indicators, viewing cameras, microphones, vibration sensors, inertial sensors, motion sensors, actuation components, solenoids, and relays.

4. The system of claim 3, wherein the monitoring sensors are selected from the group comprising: thermocouples, resistive temperature detectors (RTDs), pressure sensors, current transformers (CTs), and limit switches.

5. The system of claim 1, wherein the plurality of items of data acquisition equipment are physically installed on the one or more items of EPSS equipment.

6. The system of claim 1, wherein the one or more items of EPSS equipment are preconfigured to include one or more of the plurality of items of data acquisition equipment.

7. The system of claim 1, wherein the one or more items of EPSS equipment are selected from the group comprising: generators, automatic transfer switches (ATS's), switchgear, fuel supplies, and fuel management systems.

8. The system of claim 7, wherein the EPSS operational data for each generator within the one or more pre-existing EPSS's is selected from the group comprising: jacket water temperature, exhaust temperature, oil pressure, oil temperature, coolant temperature, battery charging voltage, battery charging current, engine running status, engine "not in auto" status, engine runtime, engine speed, generator power, rated load, generator power factor, percent generator capacity, three-phase voltage, three-phase current, generator frequency, and applied torque.

9. The system of claim 7, wherein the EPSS operational data for each ATS within the one or more pre-existing EPSS's is selected from the group comprising: emergency power, emergency power factor, emergency frequency, emergency three-phase voltage, emergency three-phase current, emergency average current, emergency power hours, normal power, normal power factor, normal frequency, normal three-phase voltage, normal three-phase current, normal average current, normal power hours, emergency power status, normal power status, emergency breaker status, and normal breaker status.

10. The system of claim 7, wherein the EPSS operational data for each fuel supply within the one or more pre-existing EPSS's is selected from the group comprising: fuel level, fuel supply status, and exit fuel flow rate.

11. The system of claim 1, wherein each of the one or more interface modules includes a microprocessor, memory, communication bus, one or more data inputs, one or more data outputs, and interface module software for carrying out the functions of receiving, normalizing, and transmitting EPSS operational data from the plurality of items of data acquisition equipment to the management computer system.

12. The system of claim 1, wherein at least one of the one or more interface modules comprises a remote terminal unit (RTU).

13. The system of claim 1, wherein at least one of the one or more interface modules comprises a programmable logic controller (PLC).

14. The system of claim 1, wherein each of the one or more interface modules includes a firewall for preventing unauthorized access to the one or more items of EPSS equipment, the management computer system, and the EPSS operational information.

15. The system of claim 1, wherein the management computer system further includes one or more servers for operating the automatically configurable management software.

16. The system of claim 1, wherein the management computer system logs historical EPSS operational data in the one or more databases for providing operational trends of the one or more items of EPSS equipment over time.

17. The system of claim 1, wherein the automatically configurable management software comprises supervisory control and data acquisition (SCADA) software.

18. The system of claim 1, wherein the user interface is displayed on a computer screen.

19. The system of claim 1, wherein the interactive display that is displayed to the user via the user interface comprises a chart or graph of one or more items of EPSS operational data over a predefined time period.

20. The system of claim 1, wherein the interactive display that is displayed to the user via the user interface comprises one or more visual pictures of the one or more items of EPSS equipment for visually monitoring the EPSS equipment at the site.

21. The system of claim 1, wherein the interactive display that is displayed to the user via the user interface comprises an interactive map view of the one or more items of EPSS equipment for enabling a site-wide view of the pre-existing EPSS's at the site.

22. The system of claim 1, wherein the interactive display that is displayed to the user via the user interface comprises a report detailing specific normalized EPSS operational data for one or more selected items of EPSS equipment for a predetermined time period.

23. The system of claim 1, wherein the interactive display that is displayed to the user via the user interface comprises an electrical one-line view of power connections of the one or more items of EPSS equipment at the site to utility power or emergency power.

24. The system of claim 1, wherein the user interface displays an alarm to the user when one or more predefined conditions related to the EPSS operational data are satisfied.

25. The method of claim 24, wherein the one or more predefined conditions are selected from the group comprising: one or more values of EPSS operational data exceeds one or more predetermined values, one or more values of EPSS operational data falls below one or more predetermined values, and one or more items of EPSS equipment malfunctions.

26. The system of claim 1, wherein the user interface displays normalized EPSS operational data related to a power disruption event as the event is occurring.

27. The system of claim 26, wherein the power disruption event comprises a planned or unplanned loss of utility power.

28. The system of claim 1, wherein the management computer system provides user security to prevent unauthorized access to the EPMS.

29. A method for an emergency power management system (EPMS) for managing operational information relating to one or more items of emergency power supply system (EPSS) equipment at a site, wherein the one or more items of EPSS equipment are operatively connected to one or more interface modules, the one or more interface modules being operative to process and transmit operational information between the one or more items of EPSS equipment and a management computer-system associated with the EPMS, comprising the steps of:

storing, in a database associated with the management computer system, EPSS inventory information resulting from input of information relating to the items of EPSS equipment at the site, at least some of the EPSS inventory information stored as a configuration file representing properties of the items of EPSS equipment at the site;

accessing the configuration file stored in the database for determining appropriate handling and display of EPSS operational data from each of the items of EPSS equipment at the site and processing the normalized EPSS operational data into a predetermined format for display to a user on an interactive display;

configuring the one or more interface modules to operatively connect each specific item of EPSS equipment to the management computer system, wherein the one or more interface modules are thereby configured to receive EPSS operational data from the one or more items of EPSS equipment, normalize the EPSS operational data into the predetermined format, and communicate the normalized EPSS operational data to the management computer system, receiving operational data relating to a particular item of EPSS equipment at a particular interface module, the operational data provided in a format defined by the particular item of EPSS equipment;

retrieving a configuration flag from the configuration file relating to the particular item of EPSS equipment, wherein the configuration flag comprises instructions for modifying operational data for the particular item of EPSS equipment to conform to a predetermined standardized format;

at the particular interface module, generating standardized operational data by modifying the received operational data to conform to the predetermined standardized format according to the instructions in the configuration flag;

and transmitting the standardized operational data information to the management computer system for subsequent processing;

collecting EPSS operational data as informational data during a test process, to generate a test report, the test report including a general informational field with basic information regarding the test process, the system operator, site, and test ID, and wherein for a test process conducted for a power generator, generating the test report further comprises:

defining a Pre-Test Checklist field detailing that certain items were checked before the test, the certain items including at least one of whether an EPSS main circuit breaker was closed and whether protective equipment was utilized;

defining a generator information field that lists at least one of a location of the generator, manufacturer, model, rated power, and a percentage rated power corresponding to a predetermined load rule;

and the generator field further including various time measurements for the generator during the given test, including at least one of engine crank time, engine cool down time, total run time, beginning engine hours, ending engine hours;

and displaying information derived from each of the items of EPSS equipment at the site or from the generated test report on an interactive display to a user.

30. The method claim of 29, wherein the one or more items of EPSS equipment comprise a plurality of predefined EPSS's at a facility.

31. The method of claim 29, wherein the one or more items of EPSS equipment are manufactured by one or more manufacturers.

32. The method of claim 29, wherein the operational data relating to a particular item of EPSS equipment is received from a particular item of data acquisition equipment.

33. The method of claim 32, wherein the particular item of data acquisition equipment is selected from the group comprising: monitoring sensors, connectors required by particular types of monitoring sensors, power supplies, fuel gauges, power meters, gauges, status indicators, viewing cameras, microphones, vibration sensors, inertial sensors, motion sensors, actuation components, solenoids, and relays.

34. The method of claim 33, wherein the monitoring sensors are selected from the group comprising: thermocouples, resistive temperature detectors (RTDs), pressure sensors, current transformers (CTs), and limit switches.

35. The method of claim 32, wherein the particular item of data acquisition equipment is physically installed on the particular item of EPSS equipment.

36. The method of claim 32, wherein the one or more items of EPSS equipment are preconfigured to include one or more items of data acquisition equipment.

37. The method of claim 29, wherein the one or more items of EPSS equipment are selected from the group comprising: generators, automatic transfer switches (ATS's), switchgear, fuel supplies, and fuel management systems.

38. The method of claim 37, wherein the operational data for each generator is selected from the group comprising: jacket water temperature, exhaust temperature, oil pressure, oil temperature, coolant temperature, battery charging voltage, battery charging current, engine running status, engine "not in auto" status, engine runtime, engine speed, generator power, rated load, generator power factor, percent generator capacity, three-phase voltage, three-phase current, generator frequency, and applied torque.

39. The method of claim 37, wherein the operational data for each ATS is selected from the group comprising: emergency power, emergency power factor, emergency frequency, emergency three-phase voltage, emergency three-phase current, emergency average current, emergency power hours, normal power, normal power factor, normal frequency, normal three-phase voltage, normal three-phase current, normal average current, normal power hours, emergency power status, normal power status, emergency breaker status, and normal breaker status.

40. The method of claim 37, wherein the operational data for each fuel supply is selected from the group comprising: fuel level, fuel supply status, and exit fuel flow rate.

41. The method of claim 29, wherein each of the one or more interface modules includes a microprocessor, memory, communication bus, one or more data inputs, one or more data outputs, and interface module software for carrying out the steps of receiving, normalizing, and transmitting EPSS operational information from the plurality of items of data acquisition equipment to the management computer system.

42. The method of claim 29, wherein at least one of the one or more interface modules comprises a remote terminal unit (RTU).

43. The method of claim 29, wherein at least one of the one or more interface modules comprises a programmable logic controller (PLC).

44. The method of claim 29, wherein each of the one or more interface modules comprises a firewall for preventing unauthorized access to the one or more items of EPSS equipment, the management computer system, and the EPSS operational information.

45. The method of claim 29, wherein the management computer system further comprises automatically configurable management software for processing the standardized EPSS operational data into an interactive display and presenting the interactive display to a user via a user interface.

46. The method of claim 45, wherein the management computer system further comprises one or more servers for operating the automatically configurable management software.

47. The method of claim 45, wherein the automatically configurable management software comprises supervisory control and data acquisition (SCADA) software.

48. The method of claim 45, wherein the user interface is displayed on a computer screen.

49. The method of claim 45, wherein the interactive display that is displayed to the user via the user interface comprises a chart or graph of one or more items of EPSS operational data over a predefined time period.

50. The method of claim 45, wherein the interactive display that is displayed to the user via the user interface comprises one or more visual pictures of the one or more items of EPSS equipment for visually monitoring the EPSS equipment at the site.

51. The method of claim 45, wherein the interactive display that is displayed to the user via the user interface comprises an interactive map view of the one or more items of EPSS equipment for enabling a site-wide view of the pre-existing EPSS's at the site.

52. The method of claim 45, wherein the interactive display that is displayed to the user via the user interface comprises a report detailing specific standardized EPSS operational information for one or more selected items of EPSS equipment for a predetermined time period.

53. The method of claim 45, wherein the interactive display that is displayed to the user via the user interface comprises an electrical one-line view of power connections of the one or more items of EPSS equipment at the site to utility power or emergency power.

54. The method of claim 45, wherein the user interface displays an alarm to the user when one or more predefined conditions related to the EPSS operational information are satisfied.

55. The method of claim 54, wherein the one or more predefined conditions are selected from the group comprising: one or more values of EPSS operational data exceeds one or more predetermined values, one or more values of EPSS operational data falls below one or more predetermined values, and one or more items of EPSS equipment malfunctions.

56. The method of claim 45, wherein the user interface displays standardized EPSS operational data related to a power disruption event as the event is occurring.

57. The method of claim 56, wherein the power disruption event comprises a planned or unplanned loss of utility power.

58. The method of claim 29, where in the management computer system provides user security to prevent unauthorized access to the EPMS.

59. The method of claim 29, wherein the management computer system logs historical EPSS operational data in the one or more databases for providing operational trends of the one or more items of EPSS equipment over time.

60. The method of claim 29, wherein the configuration flag comprises an electronic data file.

61. The method of claim 29, wherein the instructions for modifying operational data for the particular item of EPSS equipment are dependent on a specific manufacturer and model of the particular item of EPSS equipment.

62. The method of claim 29, wherein the retrieving step further comprises the steps of:
    identifying the specific manufacturer and model of the particular item of EPSS equipment from the received operational information;
    transmitting a request for the configuration flag relating to the particular item of EPSS equipment to a management computer system database; and
    receiving the configuration flag at the particular interface module from the management computer system database.

63. For use in an emergency power management system (EPMS) including a management computer system, the EPMS configured for managing one or more items of emergency power supply system (EPSS) equipment at a site, a method for managing operational data relating to the one or more items of EPSS equipment, wherein the one or more items of EPSS equipment are operatively connected to one or more interface modules, the one or more interface modules being operative to process and transmit operational data between the one or more items of EPSS equipment and the management computer system, comprising the steps of:
    storing, in a database associated with the management computer system, EPSS inventory information resulting from input of information relating to the items of EPSS equipment at the site, at least some of the EPSS inventory information stored as a configuration file representing properties of the items of EPSS equipment at the site, the configuration file including one or more configuration flags relating to one or more items of EPSS equipment at the one or more interface modules, wherein each configuration flag relates to a corresponding item of EPSS equipment and comprises instructions for modifying operational data relating to the corresponding item of EPSS equipment to conform the operational data to a predetermined standardized format;
    receiving operational data from a specific item of EPSS equipment at particular interface module, the operational data provided in a format defined by the specific item of EPSS equipment;
    retrieving from the database a specific configuration flag relating to the specific item of EPSS equipment;
    at the particular interface module, generating standardized operational data by modifying the received operational data to conform to the predetermined standardized format according to the instructions in the specific configuration flag; and transmitting the standardized operational data information to the management computer system for subsequent processing;
    collecting operational data as informational data during a test process, to generate a test report, the test report including a general informational field with basic information regarding the test process, the system operator, site, and test ID, and wherein for a test process conducted for a power generator, generating the test report further comprises:
    defining a Pre-Test Checklist field detailing that certain items were checked before the test, the certain items including at least one of whether an EPSS main circuit breaker was closed and whether protective equipment was utilized;
    defining a generator information field that lists at least one of a location of the generator, manufacturer, model, rated power, and a percentage rated power corresponding to a predetermined load rule;
    and the generator field further including various time measurements for the generator during the given test, including at least one of engine crank time, engine cool down time, total run time, beginning engine hours, ending engine hours.

\* \* \* \* \*